(12) United States Patent
Minwalla et al.

(10) Patent No.: US 11,093,666 B2
(45) Date of Patent: Aug. 17, 2021

(54) AUTOMATED NETWORK DEVICE MODEL CREATION USING RANDOMIZED TEST BEDS

(71) Applicant: Juniper Networks, Inc., Sunnyvale, CA (US)

(72) Inventors: Nosherwan Minwalla, Redwood City, CA (US); Guangyu Zhu, Milpitas, CA (US); David Tung, Sunnyvale, CA (US); Ai He, San Jose, CA (US); Jayabharat Boddu, Los Altos, CA (US); Matthew Jeremy Mellin, San Jose, CA (US); Javier Antich, Valencia (ES)

(73) Assignee: Juniper Networks, Inc., Sunnyvale, CA (US)

( * ) Notice: Subject to any disclaimer, the term of this patent is extended or adjusted under 35 U.S.C. 154(b) by 553 days.

(21) Appl. No.: 15/928,932

(22) Filed: Mar. 22, 2018

(65) Prior Publication Data
US 2019/0258753 A1 Aug. 22, 2019

(30) Foreign Application Priority Data
Feb. 16, 2018 (EP) .................................. 18382090

(51) Int. Cl.
*G06N 20/20* (2019.01)
*G06F 9/445* (2018.01)
(Continued)

(52) U.S. Cl.
CPC .......... *G06F 30/20* (2020.01); *G06F 9/44505* (2013.01); *G06N 5/003* (2013.01);
(Continued)

(58) Field of Classification Search
CPC .................................................. G06F 9/44505
(Continued)

(56) References Cited

U.S. PATENT DOCUMENTS 5,479,576 A 12/1995 Watanabe et al.
5,907,696 A 5/1999 Stilwell et al.
(Continued)

OTHER PUBLICATIONS

Stuckey et al., "Estimating Queue Size in a Computer Network Using an Extended Kalman Filter," IEEE Aerospace Conference, Mar. 3-10, 2007, 12 pp.
(Continued)

*Primary Examiner* — Thai Q Phan
(74) *Attorney, Agent, or Firm* — Shumaker & Sieffert, P.A.

(57) ABSTRACT

In general, techniques are described for automated network device model creation using randomized test beds. A device comprising a processor may be configured to perform the techniques. The processor may generate, based on simulation configuration files, configuration objects for performing a plurality of simulation iterations with respect to the network device operating within a test environment. Each of the simulation iterations may be configured to randomly assign parameters within the test environment. The driver may conduct, based on the configuration objects, each of the simulation iterations within the test environment to collect simulation datasets representative of operating states of the network device. The analytics module may perform machine learning with respect to each of the simulation datasets to generate a model that predicts, responsive to configuration parameters, an operating state of the network device when configured with the configuration parameters for the network device.

21 Claims, 13 Drawing Sheets

(51) Int. Cl.
| | |
|---|---|
| *G06F 30/20* | (2020.01) |
| *G06N 20/00* | (2019.01) |
| *H04L 12/24* | (2006.01) |
| *G06N 5/00* | (2006.01) |
| *H04L 12/26* | (2006.01) |
| *G06N 7/00* | (2006.01) |

(52) U.S. Cl.
CPC ............ *G06N 7/005* (2013.01); *G06N 20/00* (2019.01); *G06N 20/20* (2019.01); *H04L 41/142* (2013.01); *H04L 41/145* (2013.01); *H04L 41/147* (2013.01); *H04L 43/50* (2013.01); *H04L 41/16* (2013.01)

(58) Field of Classification Search
USPC ..................................................... 703/22, 24
See application file for complete search history.

(56) References Cited

U.S. PATENT DOCUMENTS

| | | | |
|---|---|---|---|
| 7,792,770 B1* | 9/2010 | Phoha | G06N 20/00 706/45 |
| 7,975,190 B2 | 7/2011 | Smith et al. | |
| 8,689,071 B2 | 4/2014 | Valakh et al. | |
| 8,971,874 B2 | 3/2015 | Han et al. | |
| 10,103,967 B2 | 10/2018 | Huh et al. | |
| 10,268,232 B2* | 4/2019 | Harris | G06E 3/005 |
| 10,360,214 B2* | 7/2019 | Gold | G06T 1/60 |
| 10,380,184 B1 | 8/2019 | Krishnamurthy | |
| 10,560,481 B2* | 2/2020 | Ouyang | H04L 63/102 |
| 10,599,957 B2* | 3/2020 | Walters | G06K 9/6231 |
| 10,649,988 B1* | 5/2020 | Gold | G06F 3/0649 |
| 2002/0152305 A1 | 10/2002 | Jackson et al. | |
| 2004/0143428 A1 | 7/2004 | Rappaport et al. | |
| 2009/0089005 A1 | 4/2009 | Hopcraft et al. | |
| 2009/0204692 A1* | 8/2009 | Smith | H04L 41/5009 709/221 |
| 2010/0262559 A1 | 10/2010 | Wilcock et al. | |
| 2015/0063350 A1* | 3/2015 | Sundaram | G06F 11/3636 370/389 |
| 2015/0288465 A1 | 10/2015 | Ouyang et al. | |
| 2017/0046254 A1 | 2/2017 | Buege | |
| 2017/0103103 A1* | 4/2017 | Nixon | G06F 16/2452 |
| 2017/0111233 A1 | 4/2017 | Kokkula et al. | |
| 2017/0207986 A1* | 7/2017 | Sundaram | H04L 43/062 |
| 2017/0308535 A1 | 10/2017 | Agarwal et al. | |
| 2018/0018590 A1* | 1/2018 | Szeto | G06F 21/6254 |
| 2018/0074786 A1 | 3/2018 | Oberbreckling et al. | |
| 2018/0248905 A1* | 8/2018 | Cote | G06N 20/10 |
| 2019/0132280 A1 | 5/2019 | Meuninck et al. | |
| 2019/0163720 A1 | 5/2019 | Jha et al. | |
| 2019/0260663 A1 | 8/2019 | Pueblas | |

OTHER PUBLICATIONS

Extended Search Report from counterpart European Application No. 18382090.1, dated Jun. 20, 2018, 12 pp.
Apache Software Foundation "Kafka 1.0 Documentation" Apache Kafka—A distributed streaming platform, available at https://kafka.apache.org/documentation/, 2016 (accessed Mar. 21, 2018) (Applicant points out, in accordance with MPEP 609.04(a), that the year of publication, 2016, is sufficiently earlier than the effective U.S. filing date Mar. 22, 2018, so that the particular month of publication is not in issue.), 120 pp.
Ben-Kiki et al. "YAML Aint' Markup Language (YAMLTM)" Version 1.2, 3rd Edition, Patched at Oct. 1, 2009, 84 pp.
Response to Extended Search Report dated Jun. 20, 2018, from counterpart European Application No. 18382090.1, filed Feb. 20, 2020, 13 pp.
Final Office Action from U.S. Appl. No. 15/928,982, dated Dec. 14, 2020, 36 pp.
Office Action from U.S. Appl. No. 15/933,033, dated Dec. 16, 2020, 37 pp.
Response to Office Action dated Jun. 10, 2020, from U.S. Appl. No. 15/928,982, filed Sep. 10, 2020, 13 pp.
Response to Office Action dated Jun. 23, 2020 from U.S. Appl. No. 15/933,033, filed Sep. 23, 2020, 17 pp.
Office Action from U.S. Appl. No. 15/928,963, dated Nov. 3, 2020, 14 pp.
Notice of Intent to Grant and Text Intended to Grant from counterpart European Application No. 18382090.1, dated Oct. 21, 2020, 83 pp.
Office Action from U.S. Appl. No. 15/928,982, dated Jun. 10, 2020, 36 pp.
Faraoun et al., "Neural networks learning improvement using the K-means clustering algorithm to detect network intrusions." INFOCOMP Journal of Computer Science 5(3), Apr. 17, 2006, 9 pp.
Office Action from U.S. Appl. No. 15/933,033, dated Jun. 23, 2020, 36 pp.
Response to the Office Action dated Nov. 3, 2020, from U.S. Appl. No. 15/928,963, filed Feb. 3, 2021, 12 pp.
Response to the Final Office Action dated Dec. 14, 2020, from U.S. Appl. No. 15/928,982, filed Feb. 16, 2021, 13 pp.
Final Office Action from U.S. Appl. No. 15/928,963, dated Feb. 19, 2021, 12 pp.
Notice of Allowance from U.S. Appl. No. 15/928,982, dated Mar. 10, 2021, 16 pp.
Response to the Office Action dated Dec. 16, 2020 from U.S. Appl. No. 15/933,033, filed Mar. 16, 2021, 12 pp.

* cited by examiner

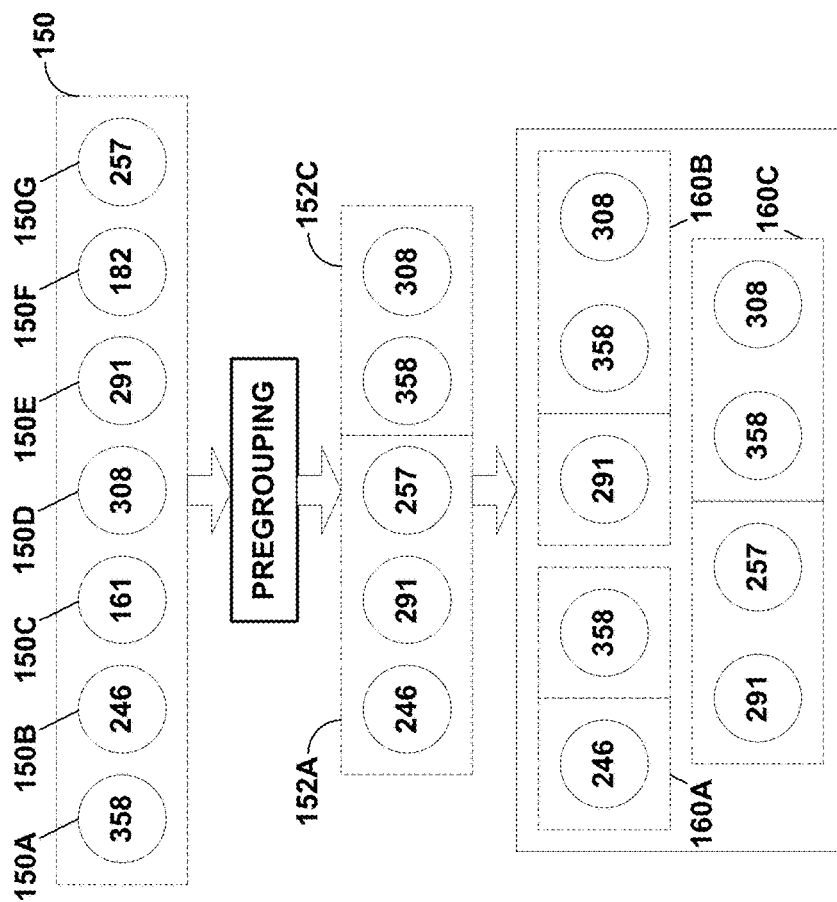

AUTOMATED NETWORK DEVICE MODEL CREATION USING RANDOMIZED TEST BEDS

This application claims the benefit of European Patent Application No. 18382090, filed Feb. 16, 2018, the entire contents of which are hereby incorporated by reference.

TECHNICAL FIELD

The invention relates to computing devices and, more particularly, to modeling of computing devices.

BACKGROUND

Test beds attempt to replicate environments in which a device may be deployed. For example, a test bed may attempt to replicate a network in which a network device, such as a router, may be deployed. In the networking context, the test bed may include, to provide a few examples, a number of different routers, switches, and end-user equipment, such as cable modems, digital subscriber line (DSL) modems, personal computers, smart phones or other cellular handset devices, wireless access points, and the like.

Network administrators may configure the test bed to implement various services, provisioning a device under test (i.e., the above noted router in this example) to support the various services. During the test, the network administrators may collect information regarding how the device under test performed in an attempt to understand how the device under test should be configured and how many of the devices under test should be deployed within the network to successfully implement the services.

Although test beds may facilitate a better understanding of devices under test, configuring the test bed is often time consuming, requiring manual entry of all the configuration data to successfully implement the services. Because the entry is manual, the resulting configuration often diverges from that which is found in real-world networks. As a result of the configuration divergence from real-world networks, it is often difficult to use test beds to create a realistic model of the device under test, especially considering the potentially extensive variability in configuration supported by routers and other devices.

SUMMARY

Techniques are described for enabling automated modeling of devices under test (DUT) using test environments (or, in other words, test beds). Rather than rely on manual configuration, the techniques may provide a driver that automates configuration of both the DUT and the test bed. The driver may attempt to randomize the configuration to better reflect real-world networks so as to obtain more accurate models, rather than using logically configured test beds that adhere to strict testing configuration (e.g., where IP addresses are ordered and assigned using a rule). The driver may automatically iteratively configure the test bed and DUT, and conduct simulations according to the iterated configurations.

During simulation, various aspects of the techniques may allow for automated operational data collection using various mechanisms to serialize and format (or, in other words, condition) the operational data. Examples of operational data for a network device may include feature usage data and resource utilization data. Feature usage data may, to provide a few examples, include one or more of the number of peers, the number of groups, the number of route instances, the number of customer edge (CE) devices, the number of CE interfaces, the number of routes, and the type for each of the routes. Resource utilization data may, to provide a few examples, include routing engine resource utilization and/or packet forwarding engine resource utilization. A data collection tool may be configured to implement the operational data collection aspects of the techniques. The data collection tool may query or otherwise issue commands to collect the operational data indicative of an operating state of the DUT. The data collection tool may provide the conditioned operational data to an analytics module.

Furthermore, various aspects of the techniques may allow the analytics module to synchronize the operational data to each of the simulations. To allow the analytics module to identify associations between the feature usage data and the resource utilization data, the data collection tool conditions the operational data, setting the operational data in a defined format that facilitates identification of the associations between the feature usage data and the resource utilization data. The analytics module may then generate a model of the DUT using machine learning algorithms (and/or possibly other algorithms) based on the associations. The model may predict, responsive to configuration parameters, the operating state of the DUT.

Some aspects of the techniques may allow for model generation in preconfigured environments where wholesale configuration randomization is not possible. In the preconfigured environments, the driver may iteratively adapt (which may refer to activating and/or deactivating) one or more pre-defined configuration objects and conduct, for each iteration of the adaptation, a simulation to collect the operational data. The driver may in this way automate model creation in more static environments, such as those owned and operated by customers, and thereby create accurate models for customer deployed devices.

In generating a model that predicts the operating state of the DUT, the techniques may allow customers of the device to better understand the actual capabilities of the device in terms of resource consumption, thereby allowing customers to better understand existing device deployment. Furthermore, the customers may utilize the model to better understand how many of the corresponding devices having a particular configuration are required to meet expected demand for the configured services. Such modeling may allow customers to better understand device deployment, service deployment per device, and plan device purchases to meet the expected demand. The techniques may, in this way, allow for better visibility into both existing and future device deployment with actual environments.

In one example, the techniques are directed to a method of automating model creation, the method comprising: generating, by one or more processors and based on simulation configuration files, configuration objects for performing a plurality of simulation iterations with respect to a network device operating within a test environment, each of the simulation iterations configured to randomly assign parameters within the test environment to reflect actual network environments; conducting, by the one or more processors and based on the configuration objects, each of the plurality of simulation iterations within the test environment to collect a corresponding plurality of simulation datasets representative of operating states of the network device; and performing, by the one or more processors, machine learning with respect to each of the plurality of simulation datasets to generate a model representative of the network device that predicts, responsive to configuration parameters for the network device, an operating state of the network device when configured with the configuration parameters for the network device.

In another example, the techniques are directed to a device configured to automate model creation, the device comprising: one or more processors configured to: generate, based on simulation configuration files, configuration objects for performing a plurality of simulation iterations with respect to a network device operating within a test environment, each of the simulation iterations configured to randomly assign parameters within the test environment to reflect actual network environments; conduct, based on the configuration objects, each of the plurality of simulation iterations within the test environment to collect a corresponding plurality of simulation datasets representative of operating states of the network device; and perform machine learning with respect to each of the plurality of simulation datasets to generate a model representative of the network device that predicts, responsive to configuration parameters for the network device, an operating state of the network device when configured with the configuration parameters for the network device; and a memory configured to store the model.

In another example, the techniques are directed to a non-transitory computer-readable storage medium having stored thereon instructions that, when executed, cause a first processor to: generate, based on simulation configuration files, configuration objects for performing a plurality of simulation iterations with respect to a network device operating within a test environment, each of the simulation iterations configured to randomly assign parameters within the test environment to reflect actual network environments; conduct, based on the configuration objects, each of the plurality of simulation iterations within the test environment to collect a corresponding plurality of simulation datasets representative of operating states of the network device; and perform machine learning with respect to each of the plurality of simulation datasets to generate a model representative of the network device that predicts, responsive to configuration parameters for the network device, an operating state of the network device when configured with the configuration parameters for the network device.

In another example, the techniques are directed to a method of automating model creation, the method comprising: generating, by one or more processors and based on simulation configuration files, different iterations of configuration objects for configuring a network device to participate in a plurality of simulations within a test environment for the network device; iteratively interfacing, by the one or more processors and based on the different iterations of the configuration objects, with the network device to configure the network device to participate in the simulations; interfacing, by one or more processors and concurrent to iteratively conducting the plurality of simulations within the test environment, with the network device to collect a plurality of simulation datasets representative of an operating state of the device during each of the plurality of simulations; and generating, by the one or more processors and based on the simulation datasets, a model representative of the network device that predicts, responsive to configuration parameters for the network device, an operating state of the network device when configured with the configuration parameters for the network device.

In another example, the techniques are directed to a device configured to automate model creation, the device comprising: a memory configured to store simulation configuration files; and one or more processors configured to: generate, based on the simulation configuration files, different iterations of configuration objects for configuring a network device to participate in a plurality of simulations within a test environment for the network device; iteratively interface, based on the different iterations of the configuration objects, with the network device to configure the network device to participate in the simulations; interface, concurrent to iteratively conducting the plurality of simulations within the test environment, with the network device to collect a plurality of simulation datasets representative of an operating state of the device during each of the plurality of simulations; and generate, based on the simulation datasets, a model representative of the network device that predicts, responsive to configuration parameters for the network device, an operating state of the network device when configured with the configuration parameters for the network device.

In another example, the techniques are directed to a non-transitory computer-readable storage medium having stored thereon instructions that, when executed, cause one or more processors to: generate, based on simulation configuration files, different iterations of configuration objects for configuring a network device to participate in a plurality of simulations within a test environment for the network device; iteratively interface, based on the different iterations of the configuration objects, with the network device to configure the network device to participate in the simulations; interface, concurrent to iteratively conducting the plurality of simulations within the test environment, with the network device to collect a plurality of simulation datasets representative of an operating state of the device during each of the plurality of simulations; and generate, based on the simulation datasets, a model representative of the network device that predicts, responsive to configuration parameters for the network device, an operating state of the network device when configured with the configuration parameters for the network device.

In another example, the techniques are directed to a method of generating a model of a device, comprising: obtaining, by one or more processors, a plurality of simulation configuration files for conducting a plurality of simulations of a network device within a test environment; conducting, by the one or more processors and based on the plurality of simulation configuration files, each of the plurality of simulations with respect to the network device within the test environment to collect a corresponding plurality of simulation datasets indicative of an operating state of the network device relative to each of the plurality of simulations; determining, by the one or more processors, a level of similarity between one or more non-redundant pairs of the plurality of simulation datasets; selecting, by the one or more processors and responsive to a comparison of the level of similarity to a diversity threshold, a subset of the plurality of simulation datasets; and generating, by the one or more processors and based on the selected subset of the plurality of simulation datasets, a model representative of the network device that predicts, responsive to configuration parameters for the network device, an operating state of the network device when configured with the configuration parameters for the network device.

In another example, the techniques are directed to a device configured to generate a model of a network device, comprising: a memory configured to store a plurality of simulation configuration files for conducting a plurality of simulations of the network device within a test environment; and one or more processors configured to: conduct, based on the plurality of simulation configuration files, each of the plurality of simulations with respect to the network device within the test environment to collect a corresponding plurality of simulation datasets indicative of an operating state of the network device relative to each of the plurality of simulations; determine a level of similarity between one or more non-redundant pairs of the plurality of simulation datasets; select, responsive to a comparison of the level of similarity to a diversity threshold, a subset of the plurality of simulation datasets; and generate, based on the selected subset of the plurality of simulation datasets, a model representative of the network device that predicts, responsive to configuration parameters for the network device, an operating state of the network device when configured with the configuration parameters for the network device.

In another example, the techniques are directed to a non-transitory computer-readable storage medium having stored thereon instructions that, when executed, cause one or more processors to: obtain a plurality of simulation configuration files for conducting a plurality of simulations of the network device within a test environment; conduct, based on the plurality of simulation configuration files, each of the plurality of simulations with respect to the network device within the test environment to collect a corresponding plurality of simulation datasets indicative of an operating state of the network device relative to each of the plurality of simulations; determine a level of similarity between one or more non-redundant pairs of the plurality of simulation datasets; select, responsive to a comparison of the level of similarity to a diversity threshold, a subset of the plurality of simulation datasets; and generate, based on the selected subset of the plurality of simulation datasets, a model representative of the network device that predicts, responsive to configuration parameters for the network device, an operating state of the network device when configured with the configuration parameters for the network device.

In another example, the techniques are directed to a method of automating model creation in a preconfigured network environment, the method comprising: interfacing, by one or more processors, with a network device within the preconfigured network environment to iteratively adapt one or more pre-defined configuration objects of a network device within the preconfigured network environment; conducting, by the one or more processors and for each iteration of the adaptation of the one or more pre-defined configuration objects of the network device, a simulation to collect a simulation dataset representative of an operating state of the network device within the preconfigured network environment; and generating, by the one or more processors and based on the operational data, a model representative of the network device that predicts, responsive to configuration parameters for the network device, an operating state of the network device when configured with the configuration parameters for the network device.

In another example, the techniques are directed to a device configured to automate model creation in a preconfigured network environment, the device comprising: one or more processors configured to: interface with a network device within the preconfigured network environment to iteratively adapt one or more pre-defined configuration objects of a network device within the preconfigured network environment; conduct, for each iteration of the adaptation of the one or more pre-defined configuration objects of the network device, a simulation to collect a simulation dataset representative of an operating state of the network device within the preconfigured network environment; and generate, based on the operational data, a model representative of the network device that predicts, responsive to configuration parameters for the network device, an operating state of the network device when configured with the configuration parameters for the network device; and a memory configured to store the model.

In another example, the techniques are directed to a non-transitory computer-readable storage medium having stored thereon instructions that, when executed, cause one or more processors to: interface with a network device within the preconfigured network environment to iteratively adapt one or more pre-defined configuration objects of a network device within the preconfigured network environment; conduct, for each iteration of the adaptation of the one or more pre-defined configuration objects of the network device, a simulation to collect a simulation dataset representative of an operating state of the network device within the preconfigured network environment; and generate, based on the operational data, a model representative of the network device that predicts, responsive to configuration parameters for the network device, an operating state of the network device when configured with the configuration parameters for the network device.

The details of one or more aspects of the techniques are set forth in the accompanying drawings and the description below. Other features, objects, and advantages of the techniques will be apparent from the description and drawings, and from the claims.

BRIEF DESCRIPTION OF DRAWINGS

FIGS. 7A and 7B are diagrams illustrating configuration object generation for preconfigured modeling environments according to various aspects of the techniques described in this disclosure.

DETAILED DESCRIPTION

Figure 1:
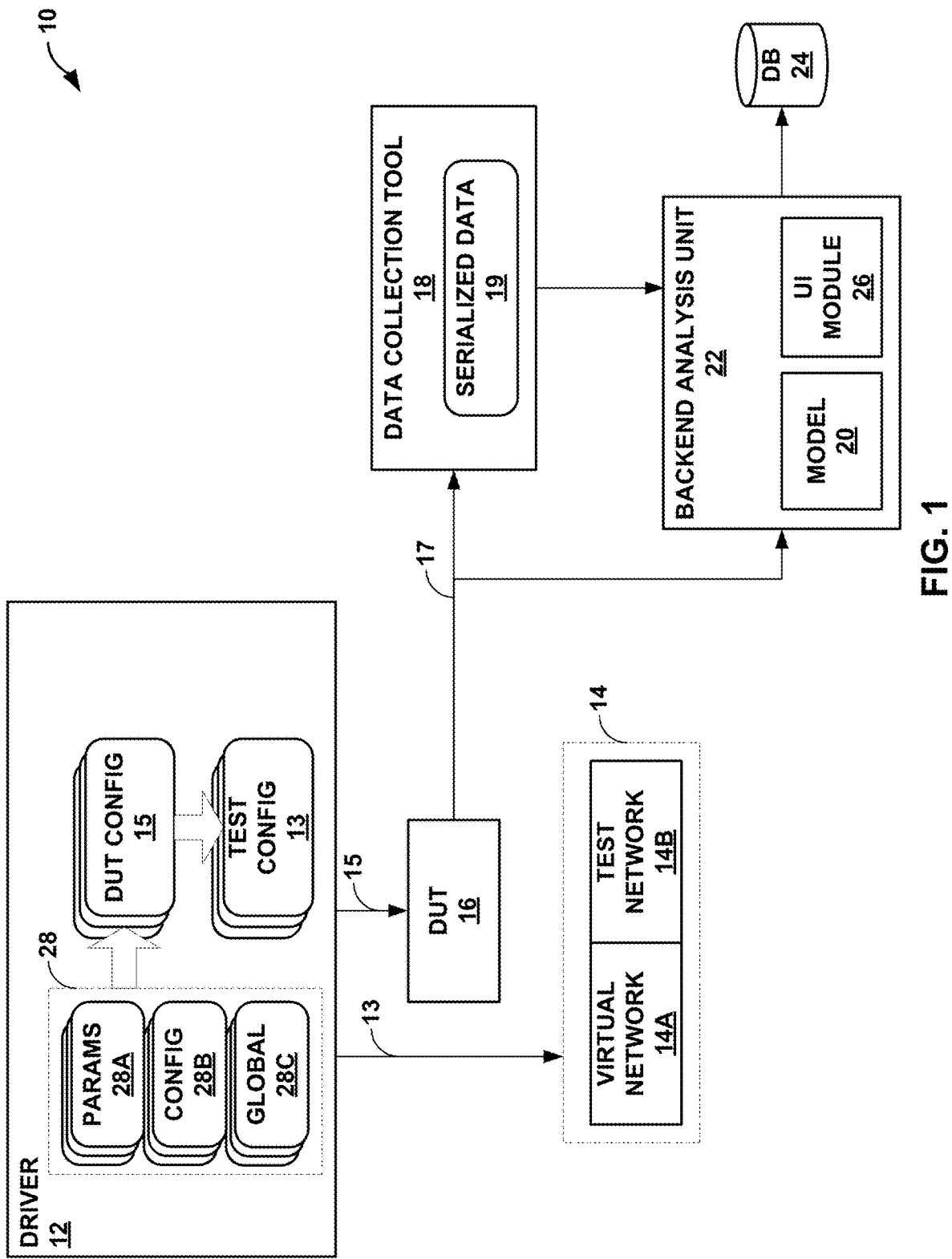
FIG. 1 is block diagram of an example network modeling environment configured to perform various aspects of the modeling techniques described in this disclosure.

FIG. 1 is a block diagram illustrating a modeling environment 10 configured to perform various aspects of the modeling techniques described in this disclosure. As shown in the example of FIG. 1, modeling environment 10 includes a driver 12, a test environment 14 (which may also be referred to as a "test bed 14"), a device under test (DUT) 16, a data collection tool 18, a model 20, a backend analysis unit 22, and a database (DB) 24.

Driver 12 may represent a unit configured to automate testing of DUT 16 within test bed 14. Driver 12 may automate configuration of test bed 14 and DUT 16 such that DUT 16 operates in coordination with test bed 14 to implement one or more services or perform one or more operations. For example, in the context of computer networks, DUT 16 may represent a router or other network device (e.g., an L2, L3, or L2/L3 switch; route reflector; gateway; or service gateway). As shown in the example of FIG. 1, test bed 14 includes a combination of a virtual network 14A and a hardware-based test network 14B. Driver 12 may configure test bed 14 to implement one or more routing services, such as layer three virtual private network (L3VPN) services, layer 2 virtual private network services such as Ethernet VPN (EVPN) and Virtual Private WAN/LAN Service, multicast, and other routing services. Driver 12 may further configure test bed 14 to communicate with DUT 16 for routing protocol sessions, management protocol sessions, other communication sessions. Driver 12 may also configure DUT 16 to support the implementation of the routing services and communication sessions, such as those listed above.

Test bed 14 may represent any type of test environment. Although described with respect to virtual network 14A and test network 14B, test bed 14 may include only virtual network 14A or only test network 14B, or additional networks 14A-14B, and should not be limited to the combination shown in the example of FIG. 1. Furthermore, although shown as providing various forms of networks for testing network devices, test bed 14 may represent any platform suitable for testing any types of devices, including personal computers, laptop computers, cellular phones (including so-called "smart phones"), digital watches (including so-called "smart watches"), speakers (including so-called "smart speakers"), tablet computers, processors, or any other type of electronic device.

DUT 16 may represent a hardware-based device, a virtual device (which may refer to a device implemented as a model executed by a general-purpose computing device), or a combination of the hardware-based device and the virtual device. For purposes of illustration, DUT 16 is assumed to represent a network device, such as a router, and as such may be referred to herein as "router 16." Other types of DUT 16 may include the foregoing example devices, including personal computers, laptop computers, cellular phones (including so-called "smart phones"), digital watches (including so-called "smart watches"), speakers (including so-called "smart speakers"), tablet computers, processors, or any other type of electronic device.

Data collection tool 18 may represent a unit configured to retrieve metrics and other data representative of an operating state of DUT 16. Examples of the data representative of the operating state, when DUT 16 represents a router, include feature usage data and resource utilization data. Feature usage data may include, to provide a few examples, one or more of a number of peers (e.g., border gateway protocol (BGP) peers), a number of groups (e.g., BGP groups), a number of route instances (also referred to as "routing instances"), a number of customer edge (CE) devices, a number of CE interfaces, a number of routes, a type for each of the routes. Resource utilization data may include, to provide a few examples, one or more of central processing unit (CPU) utilization per routing daemon (in a routing engine of the router), memory usage per routing daemon, CPU utilization in a packet forwarding engine (PFE) of the router, and memory usage in the PFE.

Data collection tool 18 may poll DUT 16 during the modeling process to retrieve the operational data, which may also be referred to as "simulation datasets" or "operating state data." Data collection tool 18 may invoke a number of different processes by which to coordinate data collection, including open source processes, such as YAML Ain't Markup Language (YAML™), Spark processes, Spark Kafka processes, and Influx processes to provide a few examples that are discussed in more detail below.

Model 20 represent a unit configured to model the operating state of DUT 16 relative to a configuration. Model 20 may, in this respect, present an interface for receiving parameters (e.g., in the networking context, the parameters may include a number of peers, a number of groups, a number of routes, etc., which may be a subset or derived measurements of the feature usage data) and generate predictive data indicative of the operating state of DUT 16. Modeling environment 10 may associate configuration changes with the corresponding collected data representative of the operating states of DUT 16 (which may be referred to as "operational data") in different configurations of the DUT 16 and test bed 14, and perform machine learning or execute other artificial intelligence algorithms to obtain model 20, as outlined in more detail below.

Backend analysis unit 22 may represent a unit configured to perform analysis with respect to predictive data generated by model 20 and operational data collected by data collection tool 18. Backend analysis unit 22 may include user interface (UI) module 26 that presents the predictive data and the operational data in various formats to facilitate review of DUT 16 and model 20. Backend analysis unit 22 may store the results of the analysis to database 24.

As noted above, backend analysis unit 22 may employ machine learning to create model 20. Machine learning may refer to a set of mathematical modeling processes that allow a computer to learn without being explicitly programmed. For example, machine learning may include Monte Carlo simulation style experimentation. Machine learning for purposes of device modeling may require large amounts of operational data with a high amount of entropy (or, in other words, randomness) relative to other types of modeling algorithms. For accurate model creation, machine learning may employ real world data, but such real-world data is often difficult to collect due to privacy and other concerns. Furthermore, machine learning may require data from most if not all available parameter configurations, which may become increasingly difficult in multi-dimensional configuration in which there are multiple parameters with multiple different settings to successfully configure a single service, such as in network devices like routers.

Given the foregoing, most attempts to model multi-dimensional devices have attempted to use different modeling algorithms that do not require extensive real-world data, and/or high levels of randomness in operational data. These models however fail to accurately predict real-world device operation beyond providing rudimentary estimates of operating states relative to feature usage data. The accuracy of the estimates is mostly insufficient, and do not facilitate extensive network planning, or more generally, capacity planning. Furthermore, model development in this way is not automated, nor can such modeling create a model quickly enough to facilitate quality assurance or other aspects of device development or troubleshooting.

In accordance with various aspects of the techniques described in this disclosure, modeling environment 10 may automate configuration of DUT 16 in a highly random manner. Modeling environment 10 may next automate configuration of test environment 14 in a manner that supports the existing services configured to be provided by DUT 16. Moreover, modeling environment 10 may also automate configuration of test environment 14 in a highly random manner using parameters that reflect real world values to facilitate Monte Carlo simulation style experimentation. Modeling environment 10 may then conduct a simulation of DUT 16 within testing environment 14, and automate operational data collection. Model environment 10 may iteratively conduct a number of different simulations and collect operational data in a manner that results in large amounts of operational data being collected, which may form the basis upon which to build an accurate model 20 (in comparison to the models created using the above noted different modeling algorithms).

In operation, driver 12 may initially obtain parameters 28A ("params 28B"), configuration objects 28B ("config 28B") and global files 28C ("global files 28C"), which collectively may also be referred to as "simulation configuration files 28." In some instances, the simulation configuration files 28 may be defined using YAML™. YAML™ is a cross-language, Unicode based data serialization language designed around common native data types of programming languages. YAML™ defines three basic primitive data structures, which include mappings (e.g., hashes and/or dictionaries), sequences (e.g., arrays and/or lists), and scalars (e.g., strings and/or numbers). From these three primitive data structures, all other data structures in YAML™ may be constructed. YAML™ leverages the primitive data structures, and adds a typing system and aliasing mechanism to form a language for serializing any native data structure. Many agile programming languages, such as Perl, Python, PHP, Ruby, and Javascript, may employ YAML™ to store and transfer data. More information regarding YAML™ can be found in a document by Ben-Kiki, O. et al., entitled "YAML Ain't Markup Language (YAML™)," version 1.2, $3^{rd}$ edition, patched at 2009 Oct. 1, the entire contents of which are incorporated by reference as if set forth in its entirety.

In any event, driver 12 may generate, based on the YAML™ files, different instances of DUT configuration objects 15 ("DUT config 15") for each simulation. To generate the different instances of DUT configuration objects 15, driver 12 may first parse configuration file 28B for a given set of simulation configuration files 28. That is, each set of simulation configuration files 28 may include a parameter file 28A, a configuration file 28A, and a global file 28C. Each set of simulation configuration files 28 may define a different category of simulation of DUT 16 within test environment 14. For example, one set of simulation configuration files may define a L3VPN simulation. Another set of simulation configuration files may define a label switched path (LSP) auto bandwidth simulation, while another simulation configuration file defines a simulation of internal border gateway protocol (iBGP), Intermediate System to Intermediate System (IS-IS) routing protocol, and/or resource reservation routing protocol (RSVP) within an L3VPN service.

In any event, configuration file 28B defines a template by which the different instances of DUT configuration objects 15 are created. The template generally defines the category (or, in other words, type) of simulation, providing the general syntax for enabling creation of DUT configuration objects 15 required to configure DUT 16 to operate according to the particular service, function, or operation being simulated. Configuration file 28B may reference parameter file 28A using a specified syntax.

That is, configuration file 28B may include placeholders in the form of variables (or, in other words, parameters) defined using the specified syntax, which signals to driver 12 that the value specified for the referenced parameter should be pulled from parameter file 28A. Driver 12 may parse parameter file 28A to identify the parameter referenced in configuration file 28B. Driver 12, responsive to identifying the parameter, may process parameter file 28A to determine a value for the corresponding parameter. Parameter file 28A may define the value as one or more ranges, or as a static value. Parameter file 28A may also define the value in terms of a maximum value and minimum value. Driver 12 may randomly select a value from the defined range, and set the value within the DUT configuration objects 15. Using the randomly assigned values for the parameters, driver 12 may create different instances (or, in other words, iterations) of DUT configuration objects 15 that vary in terms of parameter values, thereby injecting high amounts of entropy into the simulations and allowing for accurate model building using Monte Carlo style experimentation.

Configuration file 28B may also hold placeholders in the form of variables that are defined using in a different syntax that signals to the driver 12 that the value specified for the referenced parameter should be pulled from global file 28C. Global file 28C defines parameter values that should be the same between different instances of DUT configuration objects 15 within the same simulation. Global file 28C may also define maximum and minimum parameter values or other global constraints on parameter value selection (so as to avoid issues with certain devices—such as exceeding a maximum number of routes for certain routers, and the like).

After generating an instance of DUT configuration objects 15, driver 12 may generate tester configuration objects 13 in a manner that ensures sufficient randomization between different instances of DUT configuration objects 15 as described in more detail below. Driver 12 may next generate instances of tester configuration objects 13 for test environment 14 to accommodate the operation of DUT 16 when configured according to DUT configuration objects 15.

To illustrate, DUT configuration objects 15 for DUT 16 may configure a particular L3VPN between one client edge (CE) device and another CE device. Driver 12 may specify tester configuration objects 13 for test environment 14 such that the expected two CE devices will execute the routing protocols in a manner that establishes and simulates use of the expected L3VPN provided by the DUT 16. In this respect, driver 12 may define tester configuration objects 13 and DUT configuration objections 15 for coherently configuring test environment 14 and DUT 16 (respectively) such that DUT 16 operates consistent with test environment 14 to support one or more services, i.e., L3VPN service in the above example, operations, or functions.

Similar to generation of DUT configuration objects 15, driver 12 may randomly specify parameter values within tester configuration objects 13 in a manner that reflects actual, or in other words, real-world network environments. To illustrate, rather than assign IP addresses to interfaces within test environment 14 via a logical, ordered manner (e.g., 1.1.1.1 assigned to interface 1, 1.1.1.2 assigned to interface 2, 1.1.1.3 assigned to interface 3, etc.), driver 12 may introduce randomization to IP addresses (e.g., 1.1.1.1 assigned to interface 1, 10.1.0.90 assigned to interface 2, etc.). Driver 12 may, in this way, generate tester configuration objects 13 that include parameters having values randomly assigned to reflect actual environments. As noted above, these input parameters need to vary extensively to reflect real-world environments. In addition to the layer three (L3) addresses, other input parameters that may benefit from high variability may include layer two (L2) media access control (MAC) addresses, route instances, route quantities, number of routing peers, autonomous system numbers, different combinations and numbers of network services, etc. Allocation of parameter values in this manner may promote a more realistic modeling that better reflects the operational state of DUTs 16 compared to models created in artificial ordered test environments.

Driver 12 may, after selecting the subset of different instances of DUT configuration objects 15, interface with DUT 16 to configure DUT 16 according to a first one of the instances of DUT configuration objects 15. Configuration of DUT 16 using an instance of DUT configuration objects 15 is multi-dimensional in the sense that more than one parameter of the instances of DUT configuration objects 15 is different from another instance of DUT configuration objects 15. In other words, DUT configuration objects 15 are not iteratively testing a different value for the same parameter, but instead represent a random selection of parameters having high entropy, which may provide more meaningful results than unidimensional (referring to iteratively changing values of a single parameters) testing.

Driver 12 may next, or concurrent to configuring DUT 16, interface with test environment 14 to configure test environment 14 according to the corresponding one of tester configuration objects 13. Driver 12 may, as one example, simulate and vary via tester configuration objects 13 a number of customer edge (CE) devices and multi-protocol label switching (MPLS) remote provider edge (PE) devices. Additionally, driver 12 may simulate and vary via tester configuration objects 13 a variation in CE protocols, a quantity of routes per CE device and/or remote PE devices, a number of routing instances, Internet protocol (IP) addresses, autonomous system (AS) numbering, subnetting, mask lengths, etc.

Driver 12 may, after configuring DUT 16 and test environment 14, conduct the simulation, whereby driver 12 may interface with test environment 14 to initiate routing protocol operation (e.g., BGP, IS-IS, OSPF, etc.), service execution (e.g., L3VPN), and other network operations so as to test various services, functions, and operations supported by DUT 16. During or current to the simulation, data collection tool 18 may interface with DUT 16 to collect operational data 17 representative of the operating state of DUT 16.

Data collection tool 18 may issue commands and/or other queries to DUT 16 to collect operational data 17. Data collection tool 18 may, for example, issue commands such as "UNIX-TOP" which may result in a per daemon utilization and total memory, a "show bgp summary" command which may result in a summary of BGP peers, a "show bgp groups summary" which may result in a summary of BGP groups, a "show route summary" which may result in a summary of route numbers, a "show route instance" which may result in a number of route instances and types. Data collection tool 18 may, as another example, issues commands such as "show task memory" which may result in data plane memory utilization, a "show chassis fpc" which may result in processor and memory utilization on a flexible PIC (physical interface card) concentrator (FPC) in a data plane. Data collection tool 18 may also, as yet another example, issue a "show jnh <#> pool" command to collect memory utilization for a packet forwarding engine (PFE). Data collection tool 18 may also retrieve or otherwise request from DUT 16 system logs indicative of the operational data 17.

Data collection tool 18 may collect the feature usage data of operational data 17, which may be indicative of the operating state of DUT 16 relative to test environment 14 and include, for example, one or more of a number of peers (e.g., border gateway protocol (BGP) peers), a number of groups (e.g., BGP groups), a number of route instances, a number of customer edge (CE) devices, a number of CE interfaces, a number of routes, a type for each of the routes. Data collection tool 18 may also collect the resource utilization data of operational data 17 indicative of the operating state of DUT 16, which may include central processing unit (CPU) utilization per routing daemon (in a routing engine of the router), memory usage per routing daemon, CPU utilization in a packet forwarding engine (PFE) of the router, and memory usage in the PFE.

Data collection tool 18 may condition operational data 17 to form serialized data 19. That is, data collection tool 18 may process each of the forms of operational data 17 (e.g., the polled data and the system logs) to systematically arrange the data temporally, and thereby generate serialized data 19. Driver 12 and data collection tool 18 may coordinate to collect serialized data 19 iteratively for each of simulation configuration files 28, repeating the foregoing process to collect serialized data 19 for each of simulation configuration files 28. Data collection tool 18 may output serialized data 19 to backend analysis unit 22.

Backend analysis unit 22 may generate, based on serialized data 19, model 20. In some examples, backend analysis unit 22 may identify serialized data 19, which is another way of referring to conditioned operational data 17, associated with each of DUT configuration objects 15 for conducting the simulations. DUT configuration objects 15 may represent discrete configuration data associated with a particular type, such as an interface, radius server, routing instance, forwarding information base (FIB), etc. in the context of a router or other network device. Backend analysis unit 22 may determine the associations between DUT configuration objects 15 and different portions of serialized data 19. Based on the associations between DUT configuration objects 15 and different portions of serialized data 19, backend analysis module 22 may generate model 20 representative of DUT 16 that predicts, responsive to configuration parameters, the operating state of DUT 16.

For example, serialized data 19 may include, assuming for purposes of illustration that DUT 16 is a router, the above noted resource utilization data, which again may include one or more of processing utilization per routing daemon executed by the router, memory usage per routing daemon executed by the router, processor utilization in a packet forwarding engine (PFE) of the router, and memory usage in the PFE of the router. In this example, the feature usage data of serialized data 19 may define different numbers of peers, groups, route instances, customer edge (CE) devices, CE interfaces, and routes, as well as define a type for each of the routes. Backend analysis unit 22 may identifying associations between one or more of the number of peers, the number of groups, the number of route instances, the number of customer edge (CE) devices, the number of CE interfaces, the number of routes, and the type for each of the routes, and one or more of the processing utilization per routing daemon executed by the router, the memory usage per routing daemon executed by the router, the processor utilization in a packet forwarding engine (PFE) of the router, and memory usage in the PFE of the router.

Because model generation requires a certain degree of variability between simulations to ensure a full representation of DUT 16, backend analysis unit 22 may determine a level of similarity between each non-redundant pair of serialized data 19. Although random sampling from the range of each parameter may provide one solution to diversify the operational data collected during each simulation, total randomization is not possible because of the domain logic pre-defined in parameters 28A. That is, certain parameters are biased in terms of their distribution or in other words not statistically random in an equal amount per value.

As such, backend analysis unit 22 may determine the level of similarity between each non-redundant pair of serialized data 19 (where each of the serialized data 19 corresponding to a different iteration of the same simulation), taking into consideration the biased sampling distributions of certain parameter values. Backend analysis unit 22 may select, responsive to a comparison of the level of similarity to a diversity threshold, a subset of serialized data 19. Reference to a "subset" in this disclosure is intended to refer to a "non-zero subset" having less data than the total number of elements in the larger set unless explicitly noted otherwise, and not the strict mathematical definition of a subset that would include zero or more elements of the larger set up to total elements of the larger set. Driver 12 may select the subset of instances of serialized data 19 in order to reduce the bias, and thereby produce a more complete model 20 that better predicts, responsive to configuration parameters, the operating state of DUT 16.

In some instances, backend analysis module 22 may perform machine learning with respect to serialized data 19 (e.g., the above identified associations between the feature usage data—which are indicative of DUT configuration objects—of serialized data 19 and the resource utilization data of serialized data 19) to generate model 20 representative of DUT 16. Backend analysis module 22 may first perform data cleaning during which backend analysis module 22 may complete missing values and filter outlying values for serialized data 19. Backend analysis module 22 may also aggregate some data (e.g., to determine a total number of routes across different routing protocols). Backend analysis module 22 may next perform feature engineering during which backend analysis module 22 may separate serialized data 19 into different categories and normalize each category of serialized data 19. Backend analysis module 22 may perform model calibration with respect to each category of serialized data 19 for different sub-models, including linear and nonlinear sub-models. Backend analysis module 22 may, after calibrating each sub-model, perform model validation, including k-folder cross validation and forward chaining validation.

The sub-models may each predict a specific one of the above noted categories of the operating state of DUT 16. That is, a first sub-model may predict a processing utilization per routing daemon executed by the router, a second sub-model may predict memory usage per routing daemon executed by the router, a third sub-model may predict processor utilization in a packet forwarding engine (PFE) of the router, and a fourth sub-model may predict memory usage in the PFE of the router. In some instances, a given sub-model may predict two or more of the foregoing operational states of DUT 16, such as described in more detail below. In any event, the collection of sub-models may form model 20.

During model validation, backend analysis unit 20 may input an instance of DUT configuration objects 15 and/or other configuration data for DUT 16—which may be referred to generally as configuration parameters—into model 20 to generate predictive operational data, and compare the predictive operational data to corresponding operational data 17 collected for the same instance of DUT configuration objects 15. When model 20 generates predictive operational data within a threshold level of similarity to actual operational data 17, backend analysis unit 20 may validate model 20 as being sufficiently similar to DUT 16 such that it may be deployed for predictive analysis. Backend analysis unit 22 may then iteratively input configuration objects into model 20 to collect predictive operational data reflective of the predicted operating state of DUT 16, storing the predictive operational data to database 24. Backend analysis unit 22 may include user interface (UI) models 26 by which to interface with database 24 and other visualization tools to interact with the predictive operational data.

In generating model 20 that predicts the operating state of DUT 16, modeling environment 10 may allow customers of DUT 16 to better understand the actual capabilities of DUT 16 in terms of resource consumption, thereby allowing customers to better understand existing device deployment. Furthermore, the customers may utilize the model to better understand how many of the corresponding devices having a particular configuration are required to meet expected demand for the configured services. Such modeling may allow customers to better understand device deployment, service deployment per device, and plan device purchases to meet the expected demand. The modeling techniques may, in this way, allow for better visibility into both existing and future device deployment with actual environments.

That is, model 20 allows customers to understand how services impact DUT 16 and other services executed within DUT 16 from a resource consumption perspective. Moreover, model 20 allows customers to better understand which services most affect performance and/or scale. Model 20 may furthermore reveal defects of DUT 16, such as memory leaks, in an automated way, and thereby may facilitate quality assurance, while also verifying performance and providing a detailed understanding of updates to the operating system of DUT 16. Model 20 may also predict convergence given a particular configuration state. Additionally, model 20 may provide guidance regarding placement of customer drops onto edge networks.

Figure 2:
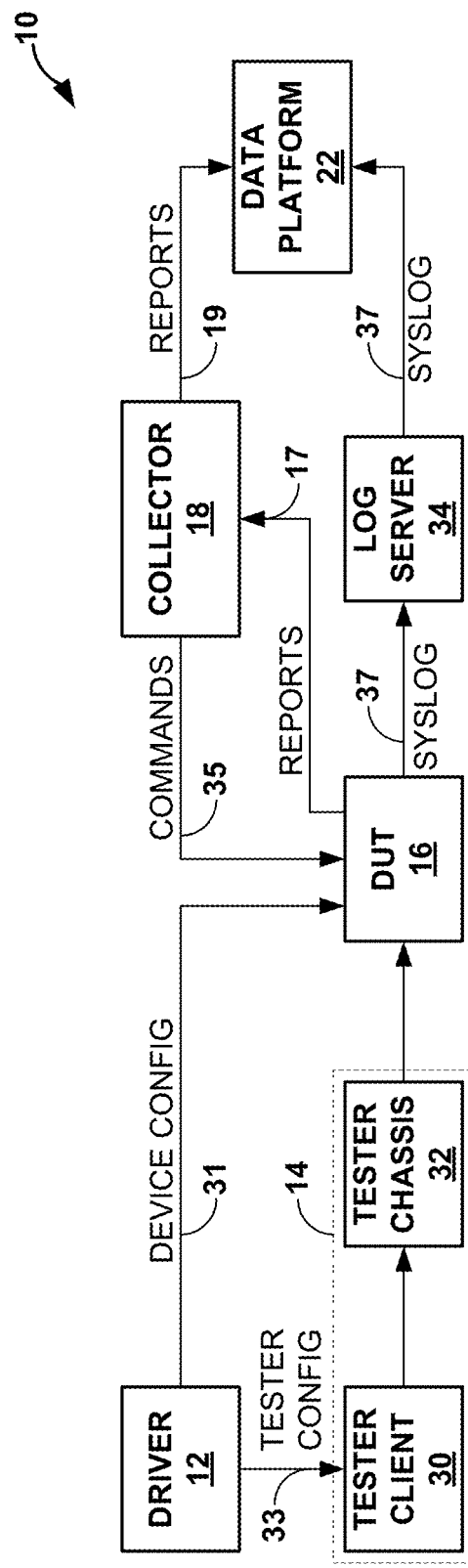
FIG. 2 is a block diagram illustrating the modeling environment of FIG. 1 in more detail.

FIG. 2 is a block diagram illustrating the modeling environment of FIG. 1 in more detail. In the example of FIG. 2, driver 12 is shown outputting separate configurations 31 and 33 to DUT 16 and a tester client 30 respectively. Device configuration 31 may represent a subset of DUT configuration objects 15 that specify parameters having values randomly selected and with sufficient entropy to permit Monte Carlo style experimentation. Tester configuration 33 may represent tester configuration objects 13 that also specify parameters having randomly selected values that attempt to replicate actual real-world network configurations for tester client 30 and which correspond to device configurations 31 in a manner that allows for expected execution of services, functions, and/or operations device configurations 31 configure DUT 16 to support.

In the example of FIG. 2, test environment 14 is shown as tester client 30 and tester chassis 32. Tester client 30 may represent an interface by which to interact with tester chassis 32. Tester chassis 32 may represent one or more virtual network devices and/or actual network devices interlinked by a virtual and/or actual network links that can be configured to mirror real-world networks. The virtual and/or actual network devices may include, as examples, core routers, edge routers, customer edge devices, broadband remote access servers (BRAS), digital subscriber line access multiplexer (DSLAM), and customer user equipment—such as computers, broadband modems, switches, hubs, cellular phones (including so-called "smart phones"), tablet computers, etc., to provide a few examples.

Driver 12 may configure DUT 16 and test environment 14 in the manner described above, and conduct the simulation, iterating as noted above through each of the device configurations 31, while data collector tool 18 (shown as "collector 18" in the example of FIG. 2) issues commands 35 to retrieve operational data 17 (which may, in one example, include reports—hence "reports 17" shown in the example of FIG. 2) indicative of the operating state of DUT 16. DUT 16 may also be configured to output system logs 37 ("syslog 37") to a log server 34. Log server 34 may represent a LogStash implementation for ingesting system logs 37 for processing. While described with respect to syslog 37, the techniques may utilize different types of logs or data-interchange formats, such as a JavaScript Object Notation (JSON).

Collector 18 may condition reports 17 to form serialized data 19 noted above, which may also be referred to as conditioned reports 19 (or, "reports 19" as shown in FIG. 2). Collector 18 may output reports 19 to data platform 22, which may be another way to refer to backend analysis unit 22. Data platform 22 may retrieve system logs 37 from log server 34 and perform the operations described above to generate model 20.

Figure 3:
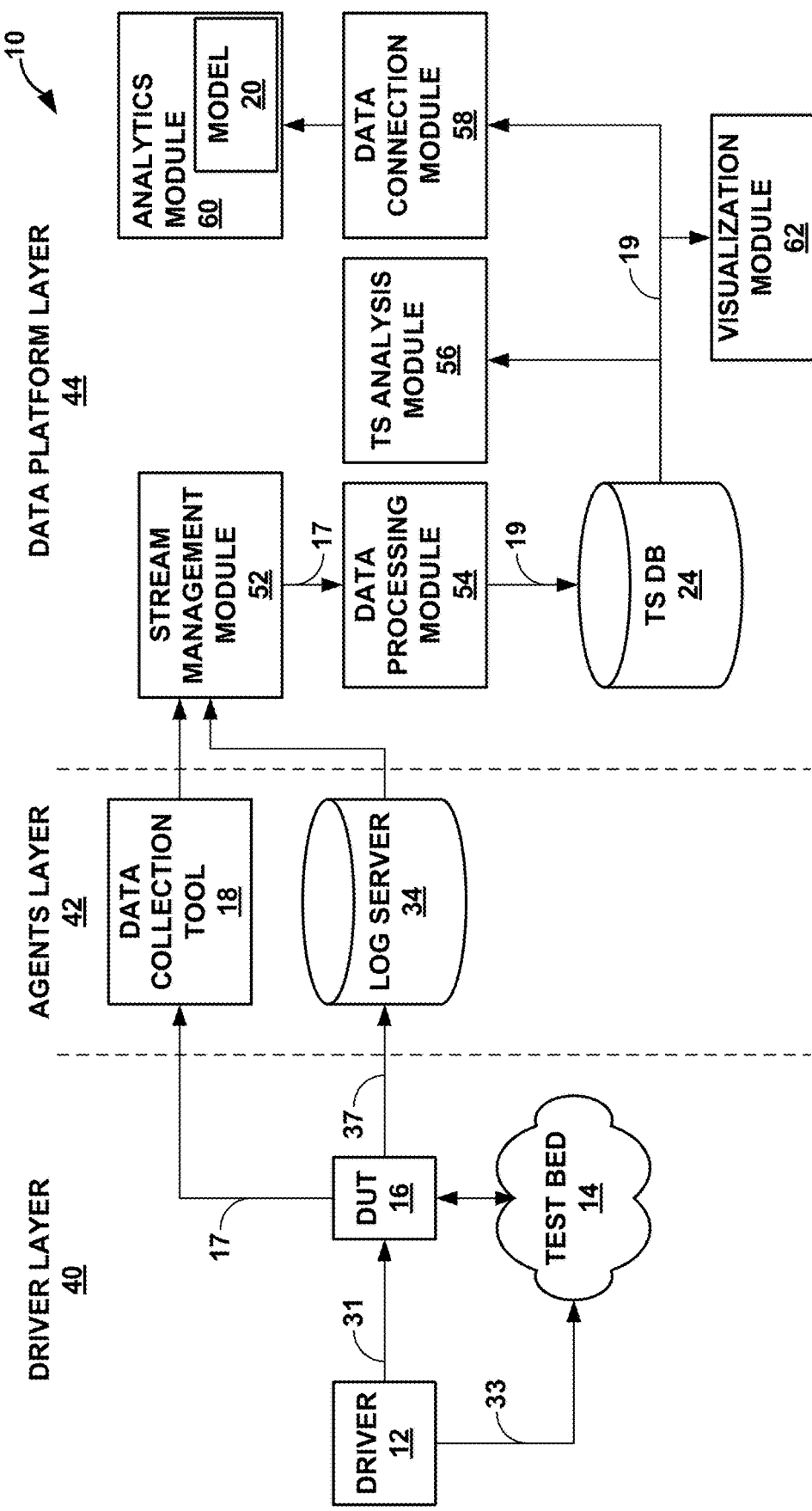
FIG. 3 is a block diagram illustrating the modeling environment of FIGS. 1 and 2 in terms of various layers of operation.

FIG. 3 is a block diagram illustrating the modeling environment of FIGS. 1 and 2 in terms of various layers of operation. In the example of FIG. 3, modeling environment 10 is shown as operating in three layers, i.e., a driver layer 40, an agents layer 42, and a data platform layer 44. Driver layer 40 includes driver 12, test bed 14, and DUT 16. Driver 12 may generate configuration data 31 for DUT 16 and configuration data 33 for test bed 14, where configuration data 31 and 33 may collectively be referred to as simulation configuration files.

In instances where configuration files may be fully specified without restriction, driver 12 may configure all of the data within each of the configuration files so as to set up the network structure of test bed 14 and incorporate DUT 16, as well as initialize the traffic data for simulation (e.g., execution of routing protocols to establish routes, functions and other services—such as the above noted L3VPN service). Assuming for purposes of example a L3VPN network, driver 12 may configure multiple parameters in a YAML™ file including a number of routing instances, BGP groups, BGP peers, BGP routes per protocol, etc. to generate instances of DUT configuration objects 15 and corresponding instances of tester configuration objects 13. Driver 12 may iteratively load the different instances of DUT configuration objects 15 (shown as "configuration data 31") and the corresponding instances of tester configuration objects 13 (shown as "configuration data 33") to iteratively conduct each of the simulations.

Agents layer 42 may include data collection tool 18 and log server 34. Data collection tool 18 may operate as an agent to extract data from DUT 16 (by way of issuing commands 35 to extract reports 17). Data collection tool 18 may represent a python client that processes YAML™ files to issue commands 35 and process reports 17. Configuration data 31 may configure DUT 16 to (potentially periodically) output syslogs 37 to log server 34. Data collection tool 18 may process reports 17 and publish data from reports 17 to topics within a stream management module 52.

Data platform layer 44 may represent a layer configured to process and visualize data from reports 17 and/or syslogs 37. Data platform layer 44 includes stream management module 52, a data processing module 54, a timeseries ("TS") database 24 ("TS DB 24"), a TS analysis module 56, a data connection module 58, an analytics module 60, and a visualization module 62.

Stream management module 52 may represent a unit configured to handle potentially large streams of data. Stream management module 52 may implement Apache Kafka® or any other stream management platform. Stream management module 52 may provide interfaces (e.g., application programming interfaces—API) for producers and consumers of data streams. Stream management module 52 may maintain topics to which the producers may publish data. Stream management module 52 may allow different consumers to subscribe to different topics and thereby receive data published to each topic. Stream management module 52 may store each stream of data as records associated with one or more topics, where each record may include a key, a value, and a timestamp. These records effectively condition operational data 17, serializing the data according to topics to which consumers may subscribe. The conditions records organized by topics may generally be referred to as serialized data 19.

To effectively serialize data 19, agents layer 42 only collects data from DUT 16 in the form of reports 17 and syslogs 37. That is, agents layer 42 does not collect data from test bed 14, only collecting reports 17 and syslogs 37 from DUT 16. Data collection is limited to DUT 16 to allow for all data to be easily coordinated within a single timeline. In other words, agents layer 42 limits data collection to a single device, DUT 16, so that there are not competing timers that may conflict and create time divergence for which stream management module 52 and/or data processing module 54 may have to correct. Although described as collecting data form a single device, DUT 16, agents layer 42 may collect data from multiple devices (including virtual devices or other devices of test bed 14).

Stream management module 52 may include a producer API by which an application may publish a stream of records to one or more topics. Stream management module 54 may also include a consumer API by which an application may subscribe to one or more topics and process the stream of records provided to the consumer. Stream management module 54 may further include a streams API by which an application may act as a stream processor to consume an input stream from one or more topics and produce an output stream to one or more output topics, effectively transforming the input streams to output streams. Stream management module 54 may additionally include a connector API that allows building and executing reusable producers or consumers that connect topics to existing applications or data systems.

In the context of FIG. 3, data collection tool 18 and log server 34 may operate according to the producers API to publish data streams (i.e., records 17 and syslogs 37 respectively in this example) to stream management module 52. Data processing module 54 may receive records 17 and syslogs 37 as input streams, and operate according to the stream API, conditioning the input streams to form the output streams, which are also referred to herein as serialized data 19. Data processing module 54 may create serialized records 19, publishing serialized records 19 to TS database 24. An example of TS database 24 includes an Influx database ("InfluxDB") executing within an Influx-Data platform (which may execute within a Docker container to promote resiliency).

TS analysis module 56 may represent a module configured to analyze serialized records 19 published to topics. TS analysis module 56 may analyze serialized records 19 to identify different metrics and provide feedback to driver 12 so as to improve future simulations. Visualization module 62 may represent a unit configured to visualize both serialized records 19 and any analysis output by TS analysis module 56.

Data connection module 58 may represent a module configured to coordinate delivery of data to analytics module 60. Data connection module 58 may ensure that different sets of serialized records 19 differ sufficiently from one another such that model 20 is able to accurately predict operational data for most, if not all, scenarios. As such, data connection module 58 may implement a data similarity model, which may measure the difference (or similarity) over two serialized records 19 (which may also be referred to as "operational data 19," "operational datasets 19," or "simulation datasets 19").

From a data science modeling perspective, simulation datasets 19 is expected to be different across multiple simulations, which may suggest that the distribution patterns in simulation datasets 19 are varied as much as possible. The data similarity model may determine the similarity (or difference) of the distribution patterns for two simulation datasets 19 and provide a single-value similarity measurement (which may also be referred to as a "difference measurement").

The data similarity model may assess two different simulation datasets 19 using the following algorithm. First, the data similarity model may create a random sample set from the first one of simulation datasets 19 (which may be denoted "first simulation dataset 19*i*"), adding a new feature "Original" with the value "DS_I" to each instance in the sample set. The data similarity model may next create a random sample set from the second one of simulation datasets 19 (which may be denoted "second simulation dataset 19*ii*"), adding a new feature "Original" with the value "DS_II" to each instance in the sample set. The data similarity model is then built using a logistic regression algorithm to predict the "Original" of an instance using the sample sets, e.g., 80%, from each of two simulation datasets as training data.

The data similarity model may be evaluated using the rest, e.g., 20%, of the simulation datasets, to predict the original of each instance, defining the evaluation measure (EM) as follows:

$$EM = \frac{TP \times TN - FP \times FN}{\sqrt{(TP+FP)(TP \times FN)(TN+FP)(TN+FN)}},$$

where TP is a variable denoting a number of true positives, TN is a variable denoting a number of true negatives, FP is a variable denoting a number of false positives, and FN is a variable denoting a number of false negatives. EM may be a single value number with a range from 0 to 1. The data similarity model may next compare EM to a similarity threshold (which for example may be set to 0.2, and which may also be referred to as a "diversity threshold").

In this respect, the data similarity module may generate a random sample set from the first simulation dataset 19*i*, and generate a random sample set from the second simulation dataset 19*ii*. The data similarity module may next be built using logistic regression algorithm to predict, based on the rest of the instances of the first simulation dataset 19*i* and second simulation dataset 19*ii*, the original of each instance. The data similarity module may then determine, based on a comparison (e.g., using the above equation) of the predicted original on the remaining instances of the first simulation dataset 19*i* and the second simulation dataset 19*ii*, the level of similarity between the first simulation dataset 19*i* and second simulation dataset 19*ii*. The level of similarity as noted above may be a single value between zero and one facilitating comparison to a diversity threshold (which may also be referred to as a "similarity threshold").

When EM is less than or equal to the similarity threshold, the data similarity model may determine that the first and second simulation datasets 19*i* and 19*ii* are sufficiently different such that both may be selected. When EM is greater than the similarity threshold, the data similarity model may determine that the first and second simulation datasets 19*i* and 19*ii* are similar and eliminate one of the first or second operational datasets 19*i*/19*ii*. The data simulation model may repeat the foregoing process for additional non-redundant pairs of operational datasets 19, while also potentially applying k-fold cross validation. Data connection module 58 may output the selected subset of the operational datasets 19 to analytics module 60.

Analytics module 60 may represent a module configured to generate a number of different sub-models that form model 20. Analytics module 60 may include a memory forecast sub-model that estimates memory consumption given specified inputs of a router status, e.g., a number of routing instances, number of groups, a number of peers, and/or a number of routes per protocol. The memory forecast sub-model may output, based on the specified inputs, an estimate of memory consumption in both a routing engine (RE) and a packet forwarding engine (PFE) of a router (assuming for purposes of illustration that DUT 16 is a router).

Analytics module 60 may perform ridge regression and gradient boosting regression to build the memory forecast sub-model given the different relationship between the inputs and the RE/PFE memory consumptions. The relationship is "learned" by the memory forecast sub-model from operational datasets 19 as associated with the simulation configuration files 28. Analytics module 60 employs ridge regression to model linear relationships while employing gradient boosting regression for nonlinear cases.

Ridge regression refers to a process that models the linear relationship between explanatory variables and target variables. Compared to other linear models, ridge regression better handles data with large variance and reduces the standard errors to give more reliable estimates. Although beneficial in certain aspects, linear models other than ridge regression may be used for the linear cases.

Gradient boosting regression is one of ensemble models to capture nonlinear relationships between explanatory variables and target variables. Gradient boosting regression produces a forecast model in the form of an ensemble of weak forecast models (e.g., decision trees). Although beneficial in certain aspects, nonlinear models other than gradient boosting regression may be used for the nonlinear cases.

Analytics module 60 may also generate a route learning sub-model that estimates how long a router will take to finish reconfiguration to adapt to changes in the network environment. Route learning duration may also be referred to as a duration taken to converge on the current configuration state.

To illustrate, the route learning sub-model may predict how long the router takes to reconfigure when a new peer is online that results in the addition of 1 million new routes. Inputs to the route learning sub-model include a number of BGP routes, a number of open shortest path first (OSPF) routes, a number of virtual private LAN (local area network) service (VPLS) routes, a number of label distribution protocol (LDP) routes, etc. The route learning sub-model may output, responsive to one or more of the foregoing inputs, a predicted learning duration.

Analytics module 60 may generate the route learning sub-model using a cox proportional hazards (CPH) algorithm. CPH algorithm is a statistical regression process used for exploring the relationship between the survival of a patient and several explanatory variables. As such, the CPH algorithm allows estimates of hazard (or risk) of death, or other event of interest given prognostic variables. Analytics module 60 utilizes the CPH algorithm to evaluate an event of interest, which in this instance is route learning, when considering the learning process as a survival period of the router and the explanatory variables as the above noted inputs. The resulting route learning sub-model outputs an expected learning duration (in seconds or other time metric), a worst learning duration (in seconds or other time metric), and a probability curve of learning duration. In this way, analytics module 60 generates model 20 as a combination of sub-models.

Figure 4:
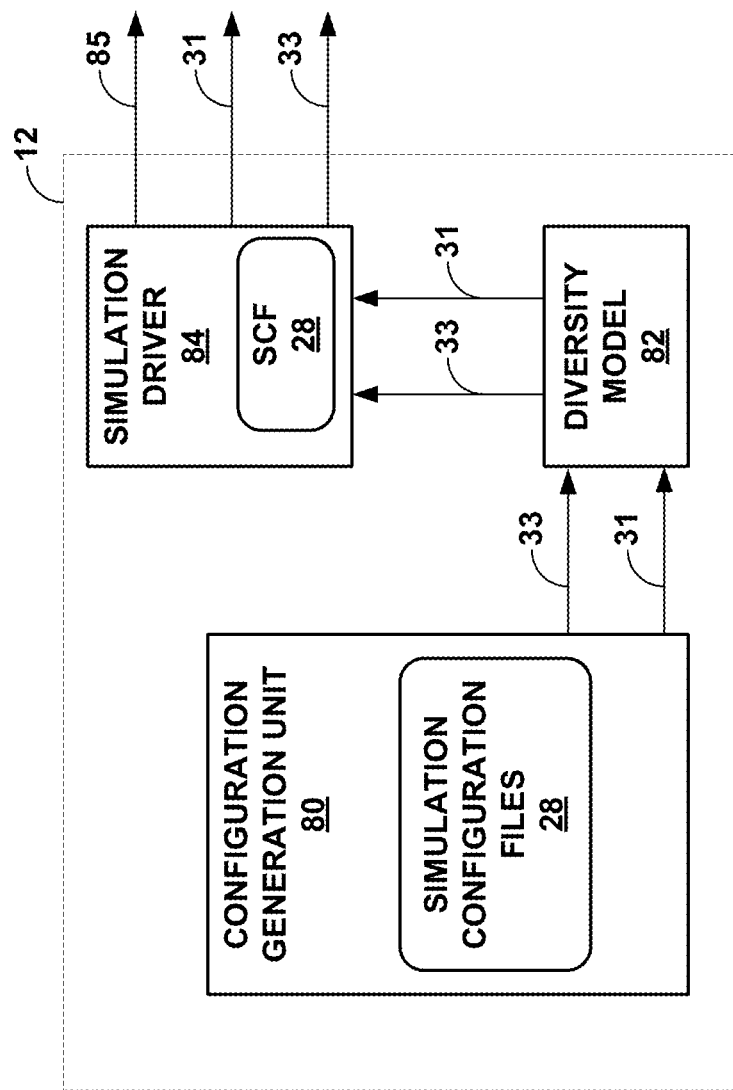
FIG. 4 is a block diagram illustrating the driver of FIGS. 1-3 in more detail.

FIG. 4 is a block diagram illustrating driver 12 of FIGS. 1-3 in more detail. In the example of FIG. 4, driver 12 includes a configuration generation unit 82, a diversity model 82, and a simulation driver 84. Configuration generation unit 82 represents a unit configured to generate, based on simulation configuration files 28 ("SMC 28"), DUT configuration objects 15 and tester configuration objects 13.

That is, driver 12 uses a domain specific language (DSL), which consists of markup used within a YAML-based template file (e.g., configuration file 28B). The input to the markup is the parameters file 28A. The purpose of the DSL is to facilitate creation of flexible syntax for expanding imposed data to create large, randomized configurations. Driver 12 utilizes a configuration template mechanism for configuration creation, and the DSL provides syntax used for expressing data expansion. The output of running configuration file 28B is a configuration in *set* format, which may result in output that is prepended with "set."

The DSL may support the following three different markup syntaxes:
  '< >' [single chevron];
  '<< >>' [double chevron]; and
  '{func: . . . }' function block.

The above syntax may be placed as a key or value within the YAML with exceptions listed discussed below in more detail. The single chevron, when used in a YAML key position, may result in iterating through data imposed by the corresponding variable's values within parameters file 28A.

The following example configuration file 28B may illustrate use of a single chevron in key positions:

```
Example 'config.yaml':
"""
interfaces:
    <my_interfaces>:
        unit: 0
```

The following example parameters file 28A may be referenced by the above configuration file 28B, which results in the example expected output listed below the example parameters file 28A:

```
"""
Example matching 'params.yaml':
    my_interfaces: ['ge-0/0/0', 'ge-0/0/1']
"""
Example expected output:
"""
    set interfaces ge-0/0/0 unit 0
    set interfaces ge-0/0/1 unit 0
```

In the above example configuration file 28B, the "my_interfaces" parameter is within the single chevron, which results in two iterations for each of the parameter values of 'ge-0/0/0', 'ge-0/0/1' that produces the two set configuration objects listed in the example expected output.

The following is another example configuration file 28B that may illustrate use of a single chevrons in further key positions:

```
Example 'config.yaml':
interfaces:
    <my_interfaces>:
        unit:
            <static_units>:
```

The following example parameters file 28A may be referenced by the above configuration file 28B, which results in the example expected output listed below the example parameters file 28A:

```
"""
Example matching 'params.yaml':
"
    my_interfaces: ['ge-0/0/0', 'ge-0/0/1']
    static_units: [0,1,2,3]
"""
Example expected output:
"
    set interfaces ge-0/0/0 unit 0
    set interfaces ge-0/0/0 unit 1
    set interfaces ge-0/0/0 unit 2
    set interfaces ge-0/0/0 unit 3
    set interfaces ge-0/0/1 unit 0
    set interfaces ge-0/0/1 unit 1
    set interfaces ge-0/0/1 unit 2
    set interfaces ge-0/0/1 unit 3
```

In the above example configuration file 28B, the "my_interfaces" parameter is within the single chevron, which results in two iterations for each of the parameter values of 'ge-0/0/0', ' ge-0/0/1'. In each iteration, there is another sub-iteration that produces four set configuration objects that set units 0-3, resulting in the eight set configuration objects listed above in the expected output. When single chevrons are used within the *value* position within YAML, the value expressed is the first of the values imposed via parameters file 28A variable value.

When single chevrons are used within the *value* position within YAML, the value expressed is the first of the values imposed via parameters file 28A variable value. The following is another example configuration file 28B that may illustrate use of a single chevrons in value positions:

```
Example 'config.yaml':
    interfaces:
        <my_interfaces>:
            unit: <static_units>
```

The following example parameters file 28A may be referenced by the above configuration file 28B, which results in the example expected output listed below the example parameters file 28A:

```
"""
Example matching 'params.yaml':
"
my_interfaces: ['ge-0/0/0', 'ge-0/0/1']
static_units: [0,1,2,3]
"""
Example expected output:
"
set interfaces ge-0/0/0 unit 0
set interfaces ge-0/0/1 unit 0
"""
```

In the above example configuration file 28B, the "static_unit" parameter is within the single chevron in the value position, which results in two iterations for each of the parameter values of 'ge-0/0/0', 'ge-0/0/1', each of which have a unit value of the first value (i.e., 0 in this example) in the parameters file 28A list for "static_unit."

The following example configuration file 28B may illustrate use of a double chevrons:

```
Example 'config.yaml':
"
interfaces:
    <my_interfaces>:
        unit: <<static_units>>
```

The following example parameters file 28A may be referenced by the above configuration file 28B, which results in the example expected output listed below the example parameters file 28A:

```
"""
Example matching 'params.yaml':
"
my_interfaces: ['ge-0/0/0', 'ge-0/0/1']
static_units: [0,1,2,3]
Example expected output:
"""
set interfaces ge-0/0/0 unit 0
set interfaces ge-0/0/1 unit 0
"
```

In the above example configuration file 28B, the "static_units" parameter is within the double chevron, which results in two iterations for each of the parameter values of 'ge-0/0/0', 'ge-0/0/1' that produces the two set configuration objects listed in the example expected output.

As shown, double chevrons express a single value. When the variable represented within parameters file 28A is a string, integer, list of dictionary items, the double chevron results in the first of the imposed values being selected. A single chevron in a values position may function equivalently to a double chevron.

The following example configuration file 28B may illustrate additional use of a double chevrons:

```
Example 'config.yaml':
"
interfaces:
    <<my_interfaces>>:
        unit: <<static_units>>
```

The following example parameters file 28A may be referenced by the above configuration file 28B, which results in the example expected output listed below the example parameters file 28A:

```
"""
Example matching 'params.yaml':
"
my_interfaces: ['ge-0/0/0', 'ge-0/0/1']
static_units: [0,1,2,3]
"
Example expected output:
"
set interfaces ge-0/0/0 unit 0
"
```

In the above example configuration file 28B, the "my interfaces" and "static_units" parameters are within the double chevron, which results in a single iteration that produces the single set configuration object listed in the example expected output having only the first parameter value selected for each of the two parameters.

Additional syntax is also supported within parameters file 28A for more advanced operations. A variable within parameters file 28A may be in a key position and associated with 'range' and 'op' keys and values. The following illustrates the syntax for enabling the advanced operations:

```
"
variable_name:
    range: (<values>)
    op: <supported_op_name>
"
```

The supported operation values for the "op" key are "iter," "rand," "pick," and "choose," which are explained in more detail below.

[iter]—Iterator such as Python "range( );"
[rand]—Returns a random, non-empty subset of elements from a range;
[pick]—Picks a single random element from a range, per use, without repetition; and
[choose]—Chooses a single element at random from a range.

When using the above operations, a single chevron may be used within the YAML key position, and a double chevron may be used within the YAML value position. The value within the double chevron may take the same value as that from within the single chevron, but the double chevron within the value position can be expressed many times under a key position.

The following example configuration file 28B may illustrate use of the iter operation:

```
Example 'config.yaml':
"""
example_params_range_iter:
    <example_range_iter>:
        value: <<example_range_iter>>
```

The following example parameters file 28A may be referenced by the above configuration file 28B, which results in the example expected output listed below the example parameters file 28A:

```
"""
Example matching 'params.yaml':
"""
example_range_iter:
  range: (1-4)
  op: iter
"""
Example expected output:
"""
set example_params_range_iter 1 value 1
set example_params_range_iter 2 value 2
set example_params_range_iter 3 value 3
set example_params_range_iter 4 value 4
"""
```

As shown in the expected output, there are four "set" configuration objects that iterate through the range of 1-4 shown in the parameters file 28A where the double chevrons pulls the same value as the current iteration for the "value" at the end of each configuration object.

In some instances, the value within the double chevron may take the same value as that form within the single chevron, but the double chevron within the value position can be expressed many times under the key, as illustrated in the following example showing how the double chevron can be used in conjunction with the iter operation.

```
Example 'config.yaml':
"""
example_params_range_iter:
  <example_range_iter>:
    value: <<example_range_iter>>
    another_value: foobar
    same_value again: <<example_range_iter>>
"""
Example matching 'params.yaml':
"""
example_range_iter:
  range: (1-4)
  op: iter
"""
Example expected output:
"""
set example_params_range_iter 1 value 1
set example_params_range_iter 1 another_value foobar
set example_params_range_iter 1 same_value_again 1
set example_params_range_iter 2 value 2
set example_params_range_iter 2 another_value foobar
set example_params_range_iter 2 same_value_again 2
set example_params_range_iter 3 value 3
set example_params_range_iter 3 another_value foobar
set example_params_range_iter 3 same_value_again 3
set example_params_range_iter 4 value 4
set example_params_range_iter 4 another_value foobar
set example_params_range_iter 4 same_value_again 4
```

Directly above illustrates how the double chevron can be used many times to set various values for different parameters.

The following is another illustration of the iter operation.

```
Example 'config.yaml':
"""
policy-options:
  policy-statement:
    vpn-export-<num_vpns>:
      term:
        a:
          then:
            community:
              add: vpn<<num_vpns>>
            accept:
        b:
          then:
            - reject
  community:
    vpn<num_vpns>:
      members:
        - "target:<<local-as>>:<<num_vpns>>"
"""
Example matching 'params.yaml':
"""
example_range_iter:
  range: (1-4)
  op: iter
"""
Example expected output:
"""
set policy-options policy-statement vpn-export-1 term a then community add vpn1
set policy-options policy-statement vpn-export-1 term a then accept
set policy-options policy-statement vpn-export-1 term b then reject
set policy-options policy-statement vpn-export-2 term a then community add vpn2
set policy-options policy-statement vpn-export-2 term a then accept
set policy-options policy-statement vpn-export-2 term b then reject
set policy-options policy-statement vpn-export-3 term a then community add vpn3
set policy-options policy-statement vpn-export-3 term a then accept
set policy-options policy-statement vpn-export-3 term b then reject
set policy-options community vpn1 members target:10020:1
set policy-options community vpn2 members target:10020:2
set policy-options community vpn3 members target:10020:3
```

The following example configuration file 28B may illustrate use of the rand operation:

```
Example 'config.yaml':
"
example_params_range_rand:
  key<example_range_rand>:
    value: <<example_range_rand>>
    another_value: foobar
    same_value_again: <<example_range_rand>>
```

The following example parameters file 28A may be referenced by the above configuration file 28B, which results in the example expected output listed below the example parameters file 28A:

```
"""
Example matching 'params.yaml':
"""
example_range_rand:
  range: (1-5)
  op: rand
"""
Example expected output:
"""
set example_params_range_rand key3 value 3
set example_params_range_rand key3 another_value_foobar
set example_params_range_rand key3 same_value_again 3
set example_params_range_rand key1 value 1
```

```
set example_params_range_rand key1 another_value_foobar
set example_params_range_rand key1 same_value_again 1
"""
```

As shown in the expected output, there are six "set" configuration objects with values randomly selected from the range of 1-5 shown in the configuration file 28B where the double chevrons pulls the same value as the current iteration for the "value" at the end of each configuration object. The rand operation may select a random quantity of items from the range and use the selected data as the imposed data. The lower bound may be a single item within the range, and the upper bound is all items within the range. For example, when the range is "range: (1-5)," the rand operation may select "2, 3, 5" as the data to impose.

The following example configuration file 28B may illustrate use of the pick operation:

```
Example 'config.yaml':
  example_params_range_pick:
    static:
      value: <<example_range_pick>>
      another_value: foobar
      different_value_this_time: <<example_range_pick>>
```

The following example parameters file 28A may be referenced by the above configuration file 28B, which results in the example expected output listed below the example parameters file 28A:

```
"""
Example matching 'params.yaml':
"""
example_range_pick:
    range: [(1-3), 5, (6-7)]
    op: pick
"""
Example expected output: (5 and 2 were randomly chosen)
"""
set example_params_range_pick static value 5
set example_params_range_pick static another_value foobar
set example_params_range_pick static different_value_this_time 2
"""
```

As shown in the expected output, there are three "set" configuration objects with values randomly selected from the range of 1-3, 5, and 6-7 shown in the parameters file 28A. The pick operation may randomly select a single element, without repetition, from a range of elements. When the pick operation is used within an iterator that is longer than the range of elements to be picked, driver 12 may generate an error.

The following example configuration file 28B may illustrate use of the pick operation in conjunction with single chevron notation:

```
Example 'config.yaml':
"""
example_params_range_pick:
    <example_range_pick>:
        value: <<example_range_pick>>
        another_value: foobar
        same_value_again: <<example_range_pick>>
```

The following example parameters file 28A may be referenced by the above configuration file 28B, which results in the example expected output listed below the example parameters file 28A:

```
"""
Example matching 'params.yaml':
"""
example_range_pick:
    range: [(1-3), 5, (6-7)]
    op: pick
"""
Example expected output: (6 was randomly chosen)
"""
set example_params_range_pick 1 value 1
set example_params_range_pick 1 another_value foobar
set example_params_range_pick 1 same_value_again 1
set example_params_range_pick 2 value 2
set example_params_range_pick 2 another_value foobar
set example_params_range_pick 2 same_value_again 2
set example_params_range_pick 3 value 3
set example_params_range_pick 3 another_value foobar
set example_params_range_pick 3 same_value_again 3
set example_params_range_pick 4 value 4
set example_params_range_pick 4 another_value foobar
set example_params_range_pick 4 same_value_again 4
set example_params_range_pick 5 value 5
set example_params_range_pick 5 another_value foobar
set example_params_range_pick 5 same_value_again 5
set example_params_range_pick 6 value 6
set example_params_range_pick 6 another_value foobar
set example_params_range_pick 6 same_value_again 6
"""
```

As shown above, the pick operation randomly selects an integer from a range of integers. The picked value becomes the upper bound of an iterator starting at one (1). The iterator is the imposed data. In the above expected output, the picked value is 6 forming the upper bound for the iterator, starting from one and iterating up to the picked value of six.

The following example configuration file 28B may illustrate use of the choose operation:

```
Example 'config.yaml':
"""
bgp_neighbor_qty: <<example_range_choose>>
```

The following example parameters file 28A may be referenced by the above configuration file 28B, which results in the example expected output listed below the example parameters file 28A:

```
"""
Example matching 'params.yaml':
"""
example_range_choose:
    range: (1-5)
    op: choose
"""
Example expected output: (3 was randomly chosen)
"""
set bgp_neighbor_qty 3
"""
```

As shown above, the choose operation randomly selects a single integer from the specified range of integers (i.e., 1-5 in this example).

The following example configuration file 28B may illustrate use of the choose operation in conjunction with single chevron notation:

Example 'config.yaml':
```
"""
    example_params_range_choose:
        key<example_range_choose>: # single chevron usage
            value: <<example_range_choose>>
            another_value: foobar
            different_value_this_time: <<example_range_choose>>
"""
```

The following example parameters file 28A may be referenced by the above configuration file 28B, which results in the example expected output listed below the example parameters file 28A:

```
"""
Example matching 'params.yaml':
"""
example_range_choose:
    range: (1-5)
    op: choose
"""
Example expected output: (3 was randomly chosen)
"""
    set example_params_range_choose key1 value 1
    set example_params_range_choose key1 another_value foobar
    set example_params_range_choose key1 different_value_this_time 1
    set example_params_range_choose key2 value 2
    set example_params_range_choose key2 another_value foobar
    set example_params_range_choose key2 different_value_this_time 2
    set example_params_range_choose key3 value 3
    set example_params_range_choose key3 another_value foobar
    set example_params_range_choose key3 different_value_this_time 3
"""
```

Similar to the pick operation above, the single chevrons results in an upper bound for an iteration starting from one. In the above example, the value of three (3) was randomly chosen, resulting in three iterations of three set configuration objects.

Function blocks are used within DSL configuration file 28B to provide syntax for custom functions as a way to take action on, or obtain, imposed data from elsewhere in the above YAML structure. YAML is processed from top down, and as such, a path mentioned within a function block should exist somewhere in the YAML above the function block, not below.

DSL supports the following functions within the function blocks:

[subnet]—Obtain IP addressing from an input subnet;
[rand]—Return random elements from above template configuration;
[rand_unit]—Return a random interface.unit value for use within various Junos configuration statements.
[incr]—Integer incrementor.
[hosts]—Returns a random set of host neighbor IP addresses associated with a configured IP address.
[pick]—Picks a single element from a list of elements represented by a hook path.
[hosts_network]—Returns a randomly selected set of IP addresses from a given subnet, with control of the upper and lower bounds, and with the ability to skip IP outputs.
[enum]—This function block returns all elements found based on the 'hook:' path.

A function block is an iterator returning custom values, where these values may represent IP addresses, integers, interfaces, etc. The iterators are activated when the function block is located under a single chevron statement. To illustrate, consider N number of logical interfaces (which may be denoted by the term "IFL") created under an interface, and the IFLs need to be assigned to virtual routing functions (VRF) routing instances in a randomized fashion without overlap. A custom function may perform this assignment as illustrated below. Additionally, each of the VRFs may need to have eBGP neighbors configured that involves forming an IP address that is within the same subnet at the IP address of the IFL(s). However, because IP addresses were randomly assigned, the IP addresses selected for use within each of the VRFs is not known. A custom function may also address this situation as demonstrated below.

To begin, consider first the following example function block statement:

```
Example function block statement:
"""
    some_key: {func: {id: 3, name: rand_unit, hook:
groups|access_cpe|interfaces|*|unit|*, min: 1, max: 3, stateful: True}}
"""
```

A functional block statement is built in a manner similar to a Python dictionary, and consists of the following elements:

'{func:'—function block statement header

'{id: <int>,'—integer id value for identifying this functions output. Possibly required if this is a stateful function.

'name: <function_name>,'—name of supported DSL function.

'hook: <path to imposed data>,'—path (e.g., an xpath) to the imposed data you wish to take action on.

'min: <int>, max: <int>,'—function arguments. These will change depending on the function.

'stateful: True}}'—(Optional) Makes sure that the output of the created data is unique between function ids. Requires a unique function id. (i.e.—The same IP address from a range will not be used more than once)

In some instances, a function block may only be used within the YAML value position (under a key). As such, the DSL may not allow for other keys or list items underneath the dynamically imposed value.

Considering the subnet function block first, the subnet function block returns a single IP address from within a given subnet, and increments the subnet based on the netmask provided within the function block. The arguments to the subnet block shown below are as follows:

'network:' The IP and subnet mask from which to return addresses.

'offset:' This field tells the function which IP address value to start from, based on the network address. (e.g. 'network: 6.0.0.0/24, offset: 1' will start returning with the IP address '6.0.0.1'. An offset value of 2 would return starting at '6.0.0.2', etc)

'id:' This field helps identify the results of the function when the 'stateful:' option is set to True. Stateful functions with the same ID will never return the same values within the scope of the subnet range.

'stateful:' Enables unique output across usages of the same function. Options are 'True' or 'False'.

The following is an example of the subnet function block when the stateful option is set to true:

```
Example 'config.yaml':
"""
interfaces:
    <my_interfaces>:
        unit:
            <these_units>:
                family inet:
                    address: {func: {id: 1, name: subnet,
network: 6.0.0.0/24, offset: 1, stateful: True}}
            <those_units>:
                family inet:
                    address: {func: {id: 1, name: subnet,
network: 6.0.0.0/24, offset: 3, stateful: True}}
                family mpls:
"""
```

The following example parameters file 28A may be referenced by the above configuration file 28B, which results in the example expected output listed below the example parameters file 28A:

```
Example matching 'params.yaml':
"""
my_interfaces: ['ge-0/0/0', 'ge-0/0/1']
these_units:
    range: (1-2)
    op: iter
those_units:
    range: (6-7)
    op: iter
"""
Example expected output:
"""
    set interfaces ge-0/0/0 unit 1 family inet address 6.0.0.1/24
    set interfaces ge-0/0/0 unit 2 family inet address 6.0.1.1/24
    set interfaces ge-0/0/0 unit 6 family inet address 6.0.2.3/24
    set interfaces ge-0/0/0 unit 6 family mpls
    set interfaces ge-0/0/0 unit 7 family inet address 6.0.3.3/24
    set interfaces ge-0/0/0 unit 7 family mpls
    set interfaces ge-0/0/1 unit 1 family inet address 6.0.4.1/24
    set interfaces ge-0/0/1 unit 2 family inet address 6.0.5.1/24
    set interfaces ge-0/0/1 unit 6 family inet address 6.0.6.3/24
    set interfaces ge-0/0/1 unit 6 family mpls
    set interfaces ge-0/0/1 unit 7 family inet address 6.0.7.3/24
    set interfaces ge-0/0/1 unit 7 family mpls
"""
```

The following is an example of the subnet function block when the stateful option is set to false:

```
Example 'config.yaml':
"""
interfaces:
    <my_interfaces>:
        unit:
            <my_units>:
                family inet:
                    address: {func: {id: 1, name: subnet,
network: 6.0.0.0/24, offset: 1, stateful: False}}
"""
```

The following example parameters file 28A may be referenced by the above configuration file 28B, which results in the example expected output listed below the example parameters file 28A:

```
Example matching 'params.yaml':
"""
my_interfaces: ['ge-0/0/0', 'ge-0/0/1']
my_units:
    range: (1-3)
    op: iter
"""
Example expected output:
"""
    set interfaces ge-0/0/0 unit 1 family inet address 6.0.0.1/24
    set interfaces ge-0/0/0 unit 2 family inet address 6.0.0.1/24
    set interfaces ge-0/0/1 unit 1 family inet address 6.0.0.1/24
    set interfaces ge-0/0/1 unit 2 family inet address 6.0.0.1/24
"""
```

The rand function block returns random set of elements based on a hook path representing a set of configuration values. The arguments to the rand block shown below are as follows:

'hook:'—Path to the YAML of interest above the function statement.
'min:'—The lower bound of possible qty of returned elements
'max:'—The upper bound of possible qty of returned elements
'id:'—(Optional) The ID of the function to help track the uniqueness of output. Required if used in conjunction with 'stateful: True'
'stateful:'—(Optional) Used to maintain unique output across function usages with the same ID.

The following is an example of the rand function block:

```
Example 'config.yaml':
"""
interfaces:
    ge-0/0/0:
        unit:
            <these_units>:
                family inet:
                    address: {func: {id: 1, name: subnet,
network: 6.0.0.0/24, offset: 1, stateful: True}}
            random_value: {func: {id: 2, name: rand, hook: interfaces|*|unit|*,
min: 1, max: 3, stateful: True}}
"""
```

The following example parameters file 28A may be referenced by the above configuration file 28B, which results in the example expected output listed below the example parameters file 28A:

```
Example matching 'params.yaml':
"""
these_units:
    range: (1-5)
    op: iter
"""
Example expected output:
"""
    set interfaces ge-0/0/0 unit 1 family inet address 6.0.0.1/24
    set interfaces ge-0/0/0 unit 2 family inet address 6.0.1.1/24
    set interfaces ge-0/0/0 unit 3 family inet address 6.0.2.1/24
    set interfaces ge-0/0/0 unit 4 family inet address 6.0.3.1/24
    set interfaces ge-0/0/0 unit 5 family inet address 6.0.4.1/24
    set random_unit 5
    set random_unit 4
    set random_unit 1
"""
```

The rand_unit function block randomly selects the interface.unit value from the interface statements, which may be useful when specifying interfaces under a protocol but have not yet identified which interfaces the template has created. The arguments to the rand_unit block shown below are as follows:

'hook:'—Path to the YAML of interest above the function statement.

'min:'—The lower bound of possible qty of returned elements

'max:'—The upper bound of possible qty of returned elements

'id:'—(Optional) The ID of the function to help track the uniqueness of output. Required if used in conjunction with 'stateful: True'

'stateful:'—(Optional) Used to maintain unique output across function usages with the same ID.

The following is an example of the rand_unit function block:

```
Example 'config.yaml':
```
interfaces:
    <my_interfaces>:
        unit:
            <these_units>:
                family inet:
                    address: {func: {id: 1, name: subnet, network: 6.0.0.0/24, offset: 1, stateful: True}}
    protocols:
        ospf:
            area 0:
                interface: {func: {id: 2, name: rand_unit, hook: interfaces|*|unit|*, min: 1, max: 3, stateful: True}}
```

The following example parameters file 28A may be referenced by the above configuration file 28B, which results in the example expected output listed below the example parameters file 28A:

```
Example matching 'params.yaml':
```
my_interfaces: ['ge-0/0/0', 'ge-0/0/1']
these_units:
    range: (1-5)
    op: iter
```

Example expected output:
```
set interfaces ge-0/0/0 unit 1 family inet address 6.0.0.1/24
set interfaces ge-0/0/0 unit 2 family inet address 6.0.1.1/24
set interfaces ge-0/0/0 unit 3 family inet address 6.0.2.1/24
set interfaces ge-0/0/0 unit 4 family inet address 6.0.3.1/24
set interfaces ge-0/0/0 unit 5 family inet address 6.0.4.1/24
set interfaces ge-0/0/1 unit 1 family inet address 6.0.5.1/24
set interfaces ge-0/0/1 unit 2 family inet address 6.0.6.1/24
set interfaces ge-0/0/1 unit 3 family inet address 6.0.7.1/24
set interfaces ge-0/0/1 unit 4 family inet address 6.0.8.1/24
set interfaces ge-0/0/1 unit 5 family inet address 6.0.9.1/24
set protocols ospf area 0 interface ge-0/0/1.4
set protocols ospf area 0 interface ge-0/0/0.4
```
```

The incr function block provides integer incrementing. The arguments to the incr block shown below are as follows:

'id:'—(Optional) The ID of the function to help track the uniqueness of output. Required if used in conjunction with 'stateful: True'

'start:'—Begin integer to product

'stateful:'—(Optional) Used to maintain unique output across function usages with the same ID.

The following is an example of the incr function block:

```
Example 'config.yaml':
```
<these_units>:
    my_incr: {func: {id: 1, name: incr, start: 1400, stateful: True}}
a:
    {func: {id: 1, name: incr, start: 1400, stateful: True}}
b:
    {func: {id: 1, name: incr, start: 1400, stateful: True}}
c:
    {func: {id: 2, name: incr, start: 1400, stateful: True}}
```

The following example parameters file 28A may be referenced by the above configuration file 28B, which results in the example expected output listed below the example parameters file 28A:

```
Example matching 'params.yaml':
```
these_units:
    range: (1-5)
    op: iter
```

Example expected output:
```
set 1 my_incr 1400
set 2 my_incr 1401
set 3 my_incr 1402
set 4 my_incr 1403
set 5 my_incr 1404
set a 1405
set b 1406
set c 1400
```
```

The hosts function block returns a random set of host neighbor IP addresses associated with a configured IP address, which may be useful for, as one example, matching BGP neighbor IP addresses to an interface IP address. The arguments to the hosts block shown below are as follows:

'hook:'—Path to the YAML, of interest above the function statement.

'min:'—The lower bound of possible qty of returned elements

'max:'—The upper bound of possible qty of returned elements

'id:'—(Optional) The ID of the function to help track the uniqueness of output. Required if used in conjunction with 'stateful: True'

'stateful:'—(Optional) Used to maintain unique output across function usages with the same ID.

The following is an example of the host function block:

```
Example 'config.yaml':
```
interfaces:
    <my_interfaces>:
        unit:
            <these_units>:
                family inet:
                    address: {func: {id: 1, name: subnet, network: 6.0.0.0/24, offset: 1, stateful: True}}
    routing-instances:
        instance1:
            interface:
                {func: {id: 3, name: rand_unit, hook: interfaces|*|unit|*, min: 2, max: 2, stateful: True}}
```

-continued

```
        protocols:
            bgp:
                group:
                    ebgp_group<access_num_groups>:
                        neighbor:
                            {func: {id: 4, name: hosts, hook:
..|..|..|..|..|interface|*|family inet|address, min: 1, max: 3, skip: 1,
stateful: True}}
```

The following example parameters file 28A may be referenced by the above configuration file 28B, which results in the example expected output listed below the example parameters file 28A:

Example matching `params.yaml`:
```
my_interfaces: ['ge-0/0/0', 'ge-0/0/1']
these_units:
    range: (1-5)
    op: iter
```

Example expected output:
```
set interfaces ge-0/0/0 unit 1 family inet address 6.0.0.1/24
set interfaces ge-0/0/0 unit 2 family inet address 6.0.1.1/24
set interfaces ge-0/0/0 unit 3 family inet address 6.0.2.1/24
set interfaces ge-0/0/0 unit 4 family inet address 6.0.3.1/24
set interfaces ge-0/0/0 unit 5 family inet address 6.0.4.1/24
set interfaces ge-0/0/1 unit 1 family inet address 6.0.5.1/24
set interfaces ge-0/0/1 unit 2 family inet address 6.0.6.1/24
set interfaces ge-0/0/1 unit 3 family inet address 6.0.7.1/24
set interfaces ge-0/0/1 unit 4 family inet address 6.0.8.1/24
set interfaces ge-0/0/1 unit 5 family inet address 6.0.9.1/24
set routing-instances instance1 interface ge-0/0/0.4
set routing-instances instance1 interface ge-0/0/0.3
set routing-instances instance1 protocols bgp group ebgp_group1 neighbor 6.0.2.64
set routing-instances instance1 protocols bgp group ebgp_group1 neighbor 6.0.2.150
set routing-instances instance1 protocols bgp group ebgp_group2 neighbor 6.0.3.28
set routing-instances instance1 protocols bgp group ebgp_group2 neighbor 6.0.2.21
set routing-instances instance1 protocols bgp group ebgp_group2 neighbor 6.0.3.96
```

The pick function block enables selection of a single element form a list of elements represented by a hook. The arguments to the pick block shown below are as follows:

'hook:'—Path to the YAML of interest above the function statement.

'pos:'—The index of the item to pick.

The following is an example of the pick function block:

Example `config.yaml`:
```
interfaces:
    <my_interfaces>:
        unit:
            <these_units>:
                filter: {func: {id: 1, name: incr, start: 1400, stateful: True}}
                family inet:
                    address: {func: {id: 1, name: subnet, network: 6.0.0.0/24, offset: 1, stateful: True}}
units: {func: {name: pick, hook: interfaces|ge-0/0/0|unit|*, pos: 2}}
```

The following example parameters file 28A may be referenced by the above configuration file 28B, which results in the example expected output listed below the example parameters file 28A:

Example matching `params.yaml`:
```
my_interfaces: ['ge-0/0/0', 'ge-0/0/1']
these_units:
    range: (1-3)
    op: iter
```

Example expected output:
```
set interfaces ge-0/0/0 unit 1 filter 1400
set interfaces ge-0/0/0 unit 1 family inet address 6.0.0.1/24
set interfaces ge-0/0/0 unit 2 filter 1401
set interfaces ge-0/0/0 unit 2 family inet address 6.0.1.1/24
set interfaces ge-0/0/0 unit 3 filter 1402
set interfaces ge-0/0/0 unit 3 family inet address 6.0.2.1/24
set interfaces ge-0/0/1 unit 1 filter 1403
set interfaces ge-0/0/1 unit 1 family inet address 6.0.3.1/24
set interfaces ge-0/0/1 unit 2 filter 1404
set interfaces ge-0/0/1 unit 2 family inet address 6.0.4.1/24
set interfaces ge-0/0/1 unit 3 filter 1405
set interfaces ge-0/0/1 unit 3 family inet address 6.0.5.1/24
set units 3
```

The following is another example of the pick function block:

Example `config.yaml`:
```
interfaces:
    <my_interfaces>:
        unit:
            <these_units>:
                filter: {func: {id: 1, name: incr, start: 1400, stateful: True}}
                family inet:
                    address: {func: {id: 1, name: subnet, network: 6.0.0.0/24, offset: 1, stateful: True}}
units: {func: {name: pick, hook: interfaces|ge-0/0/0|unit|*, pos: 2}}
protocols:
    ldp:
        interface:
            <my_interfaces>: {func: {name: pick, hook: interfaces|*|unit|*}}
```

The following example parameters file 28A may be referenced by the above configuration file 28B, which results in the example expected output listed below the example parameters file 28A:

Example matching `params.yaml`:
```
my_interfaces: ['ge-0/0/0', 'ge-0/0/1']
these_units:
    range: (1-3)
    op: iter
```

Example expected output:
```
set interfaces ge-0/0/0 unit 1 filter 1400
set interfaces ge-0/0/0 unit 1 family inet address 6.0.0.1/24
set interfaces ge-0/0/0 unit 2 filter 1401
set interfaces ge-0/0/0 unit 2 family inet address 6.0.1.1/24
set interfaces ge-0/0/0 unit 3 filter 1402
set interfaces ge-0/0/0 unit 3 family inet address 6.0.2.1/24
set interfaces ge-0/0/1 unit 1 filter 1403
set interfaces ge-0/0/1 unit 1 family inet address 6.0.3.1/24
set interfaces ge-0/0/1 unit 2 filter 1404
set interfaces ge-0/0/1 unit 2 family inet address 6.0.4.1/24
set interfaces ge-0/0/1 unit 3 filter 1405
set interfaces ge-0/0/1 unit 3 family inet address 6.0.5.1/24
set protocols ldp interface ge-0/0/0.1
set protocols ldp interface ge-0/0/1.1
```

The hosts_network function block returns a random number of IP addresses from the same subnet as an input IP address variable, based on a given lower and upper bound. The arguments to the hosts_network block shown below are as follows:

- 'network:'—IP address/netmask input from which to create values. This value can be a static string or a double chevron variable. (e.g.—'192.168.1.1/24' or '<<local-ip>>/29', etc)
- 'min:'—The lower bound of possible returned IP addresses
- 'max:'—The upper bound of possible returned IP addresses
- 'skip:'—(Optional) List of positions of IP addresses that you do not want returned.
- 'id:'—(Optional) The ID of the function to help track the uniqueness of output. Required if used in conjunction with 'stateful: True'
- 'stateful:'—(Optional) Used to maintain unique output across function usages with the same ID.

The following is an example of the host_network function block:

```
Example `config.yaml`:
```
neighbor: {func: {id: 8, name: hosts_network, network: <<local-ip>>, min: 1, max: 2, skip: [1, 2], stateful: True}}
foobar:
neighbor2: {func: {id: 8, name: hosts_network, network: <<local-ip>>, min: 1, max: 2, skip: [1, 2], stateful: False}}
```
```

The following example parameters file 28A may be referenced by the above configuration file 28B, which results in the example expected output listed below the example parameters file 28A:

```
Example matching `params.yaml`:
```
    local-ip: 193.2.0.1/24
```
Example expected output:
```
    set neighbor 193.2.0.174
    set neighbor 193.2.0.230
    set neighbor 193.2.0.158
    set neighbor 193.2.0.106
    set neighbor 193.2.0.90
    set neighbor 193.2.0.39
    set foobar
    set neighbor2 193.2.0.182
```
```

The enum function block returns all elements found based on the hook. Additionally, the enum function block may provide additional functionality when used in conjunction with interfaces, allowing the return of interface.unit elements. The additional functionality may be usewhen when including interfaces under a protocol from within a VRF or other configuration section. The arguments to the enum block shown below are as follows:

- 'hook:'—Path to the YAML of interest above the function statement.

The following is an example of the enum function block:

```
Example `config.yaml`:
```
interfaces:
  ge-0/0/0:
    unit:
      <these_units>:
        filter: {func: {id: 1, name: incr, start: 1400, stateful: True}}
        family inet:
          address: {func: {id: 1, name: subnet, network: 6.0.0.0/24, offset: 1, stateful: True}}
units: {func: {name: enum, hook: interfaces|ge-0/0/0|unit|*}}
```
```

The following example parameters file 28A may be referenced by the above configuration file 28B, which results in the example expected output listed below the example parameters file 28A:

```
Example matching `params.yaml`:
```
    these_units:
      range: (1-3)
      op: iter
```
Example expected output:
```
    set interfaces ge-0/0/0 unit 1 filter 1400
    set interfaces ge-0/0/0 unit 1 family inet address 6.0.0.1/24
    set interfaces ge-0/0/0 unit 2 filter 1401
    set interfaces ge-0/0/0 unit 2 family inet address 6.0.1.1/24
    set interfaces ge-0/0/0 unit 3 filter 1402
    set interfaces ge-0/0/0 unit 3 family inet address 6.0.2.1/24
    set units 1
    set units 2
    set units 3
```
```

The following is another example usage of the enum function block that illustrates the additional interface functionality:

```
interfaces:
  <my_interfaces>:
    unit:
      <these_units>:
        filter: {func: {id: 1, name: incr, start: 1400, stateful: True}}
        family inet:
          address: {func: {id: 1, name: subnet, network: 6.0.0.0/24, offset: 1, stateful: True}}
protocols:
  ldp:
    interface:
      <my_interfaces>: {func: {name: enum, hook: interfaces|<my_interfaces>|unit|*}}
```

The following example parameters file 28A may be referenced by the above configuration file 28B, which results in the example expected output listed below the example parameters file 28A:

Example matching `params.yaml`:

```
my_interfaces: ['ge-0/0/0', 'ge-0/0/1']
these_units:
    range: (1-3)
    op: iter
```

Example expected output:

```
set interfaces ge-0/0/0 unit 1 filter 1400
set interfaces ge-0/0/0 unit 1 family inet address 6.0.0.1/24
set interfaces ge-0/0/0 unit 2 filter 1401
set interfaces ge-0/0/0 unit 2 family inet address 6.0.1.1/24
set interfaces ge-0/0/0 unit 3 filter 1402
set interfaces ge-0/0/0 unit 3 family inet address 6.0.2.1/24
set interfaces ge-0/0/1 unit 1 filter 1403
set interfaces ge-0/0/1 unit 1 family inet address 6.0.3.1/24
set interfaces ge-0/0/1 unit 2 filter 1404
set interfaces ge-0/0/1 unit 2 family inet address 6.0.4.1/24
set interfaces ge-0/0/1 unit 3 filter 1405
set interfaces ge-0/0/1 unit 3 family inet address 6.0.5.1/24
set protocols ldp interface ge-0/0/0.1
set protocols ldp interface ge-0/0/0.2
set protocols ldp interface ge-0/0/0.3
set protocols ldp interface ge-0/0/1.1
set protocols ldp interface ge-0/0/1.2
set protocols ldp interface ge-0/0/1.3
```

Global parameter file 28C may be similar to parameter file 28A, except that global parameter file 28C may define parameter values that remain the same for each iteration of the simulation. Global parameter file 28C may also define parameters values concerning the number of iterations of a simulation, information regarding a debug mode (e.g., enabled or disabled), a maximum number of routes (e.g., across all of the different routing protocols), a maximum number of routes per instance, a maximum number or routes per neighbor, a min netmask length, a maximum netmask length, etc. The foregoing parameter values may address limitations of DUT 16 (e.g., DUT 16 may only include a set number of memory for storing a maximum of 1,000,000 routes, thereby resulting in the maximum number of routes being set to 1,000,000 so as not to overrun the memory of DUT 16).

Configuration generation unit 80 may generate configuration objects 31 for DUT 16 in the manner described above, providing configuration objects 31 to diversity model 82. Configuration generation unit 80 may also automatically generate a corresponding configuration objects 33 for test bed 14. Configuration objects 33 may, when loaded into test bed 14, configure test bed 14 to emulate and/or execute the routing protocols in the manner that supports DUT 16 when configured to operate according to configuration objects 31. Configuration generation unit 80 may output the configuration objects 33 to diversity model 82 as well.

As noted above, a random sampling from the range of each parameter may present an optimal solution to diversify operational data 17. However, a random sampling is not feasible in all instances due to data bias incurred as a result of domain logic being pre-defined. That is, different iterations of the configuration objects are biased towards a first operating state of DUT 16 over a second operating state of DUT 16. To illustrate, consider that research shows that the number of BGP peers in the L3VPN network simulation is heavily biased towards the 1-100 peers range in comparison to the 200-300 peer range, the 300-400 peer range, and any other higher range.

As a result, diversity model 82 represents a model configured to receive a biased sampling distribution as input and employ clustering analysis to rebalance the sampling distribution. An example of diversity model 82 may employ k-means clustering, as k-means clustering may be efficient and scale well to handle large amounts of data. Although described below with respect to k-means clustering, the techniques may be performed using other clustering algorithms.

In this example, diversity model 82 may implement the k-means clustering within the following three steps. First, the diversity model may perform k-means clustering to group the sampling data (which is another way of referring to the different iterations of the configuration objects) in the dense region of biased distribution and calculates the group center, e.g., a mean value of the parameters in the group. Second, the diversity model may select the closest sampling parameter (which again is another way to refer to the configuration objects) to the group center as representative of the group. The diversity model may, third, select the sampling parameters from each group as the inputs to form each of the configuration data 31 and 33. After the diversity model generates simulation configuration data 31 and 33, driver 12 may iteratively conduct the simulations according to each of configuration data 31 and 33.

Diversity model 82 may, in this respect, adjust parameters of configuration parameters set forth in configuration objects 31 for DUT 16 to account for data bias. Diversity model 82 may output the adapted configuration objects 31 to simulation driver 84. Diversity model 82 may also update configuration objects 33 to adjust various parameters in a manner that reflects the adaptations to configuration objects 31. Diversity model 82 may output configuration objects 31 and 33 to simulation driver 84.

Simulation driver 84 may represent a unit configured to interface with test bed 14. In some examples, test bed 14 may represent a virtualized network capable of emulating one or more routing protocols as executed by one or more network devices (and possibly up to hundreds or thousands of network devices). For example, test bed 14 may include a testing environment provided by ixia® and/or Spirent®. As such, simulation driver 84 may include an ixia and/or Spirent interface(s) for interfacing with test bed 14 to load configuration objects 33. Simulation driver 84 may also include an interface by which to interact with DUT 16 to load configuration objects 31.

Simulation driver 84 may also output notifications 85 to data collection tool 18 indicating when each iteration of the simulation starts and stops, each protocol starts and stops, etc. Simulation driver 84 may output notification 85 in this manner to facilitate data collection. That is, responsive to each of the notification, data collection tool 18 may begin and end data collection.

Figure 5:
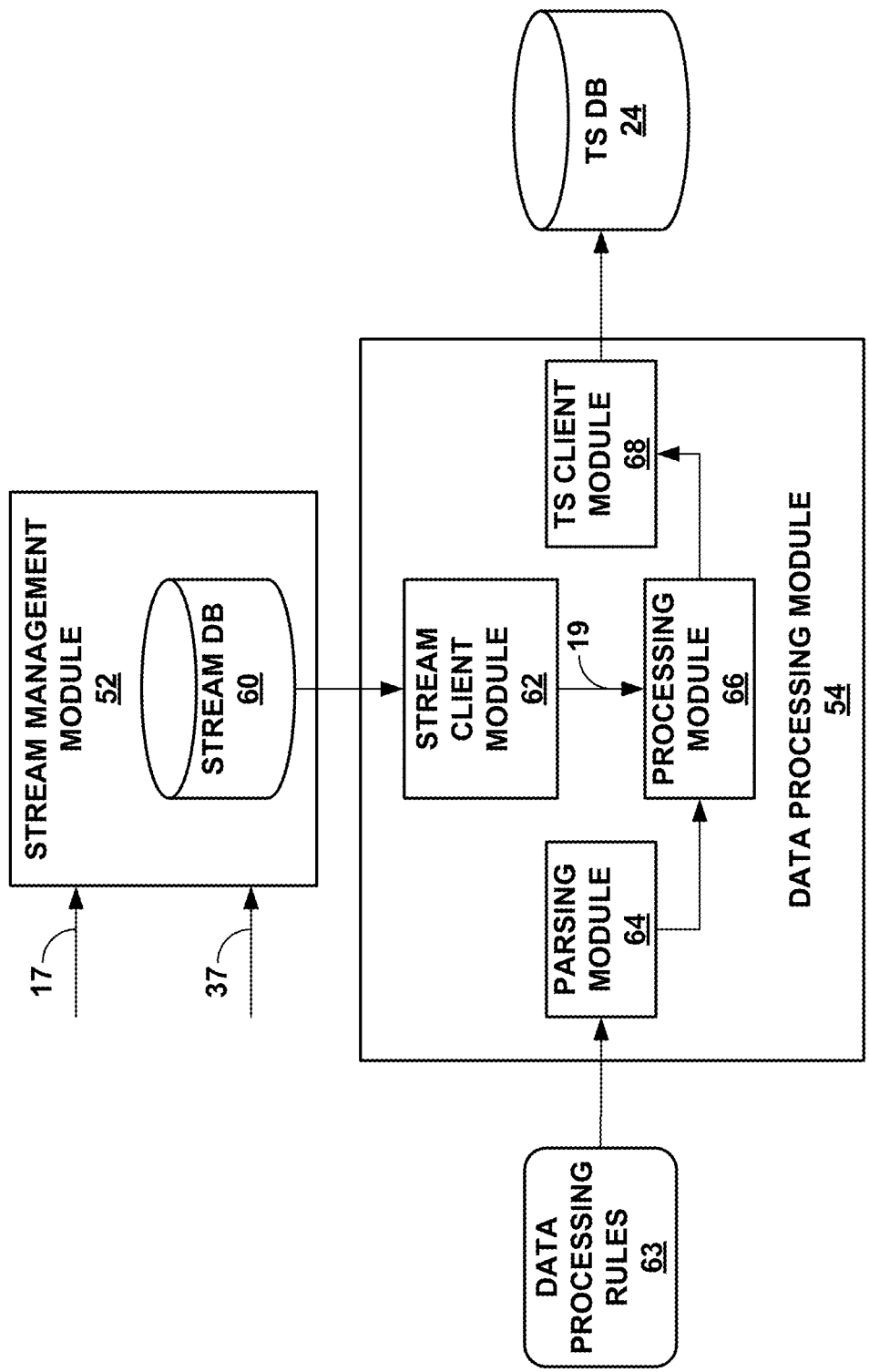
FIG. 5 is a block diagram illustrating the stream management module and the data processing module of FIG. 3 in more detail.

FIG. 5 is a block diagram illustrating stream management module 52 and data processing module 54 of FIG. 3 in more detail. As shown in the example of FIG. 5, stream management module 52 includes a stream database (DB) 60 ("stream DB 60"), while data processing module 54 includes a stream client module 62, a parsing module 64, a processing module 66, and a timeseries (TS) client module 68 ("TS client module 68").

Stream management module 52 may store serialized records 19 to stream database 60. Stream management module 52 may process simulation datasets 17 and syslogs 37 to form serialized records. Syslogs 37 may define a log of configuration changes, where each configuration changes are committed to DUT 16 using a "commit" command. Stream management module 52 may process syslogs 37 to identify each successive "commit" command and an associated a time at which each of the "commit" commands were issued. Using the time at which each of the "commit" commands were issued, stream management module 52 may generate serialized records 19 to only include portions of simulation datasets 17 occurring at and/or after each of the "commit" commands were logged, thereby dividing simulation datasets 17 into separate serialized records 19.

Stream client module 62 of data processing module 54 may represent a module configured to operate according to the consumer API in order to retrieve serialized records published to one or more topics to which stream client module 62 subscribes. Stream client module 62 may provide the serialized records 19 to processing module 66.

Parsing module 64 of data processing module 54 may represent a module configured to process data processing rules 63, which may be defined as a YAML™ file, and output data processing rules 63 to processing module 66. The following is an example of data processing rules 63:

|--bgp-rib: struct (nullable=true)
| |--@style: string (nullable=true)
| |--accepted-prefix-count: long (nullable=true)
| |--active-prefix-count: long (nullable=true)
| |--advertised-prefix-count: long (nullable=true)
| |--name: string (nullable=true)
| |--received-prefix-count: long (nullable=true)
| |--suppressed-prefix-count: long (nullable=true)
|--type: string (nullable=true)
root_tag: bgp-group
child_tag: bgp-rib
aggregations:
    agg_name: ebgp_inet0_accepted_prefix_sum
    filter: bgp-rib.name~inet.0, type=External # rib name 'like' inet.0
    calc: sum
    calc_field: bgp-rib.accepted-prefix-count
    groupby : type
    agg_name: ebgp_inet0_ri_count
    filter: bgp-rib.name~inet.0, type=External
    calc: count # distinct count
    calc_field: bgp-rib.name In the foregoing example of data processing rules 63, the "#" denotes that a comment follows, which is non-executable code. The above example of data processing rules 63 may configure processing module 66 to identify BGP groups and aggregate BGP routing information bases (RIB) having a RIB name of inet.0, calculating a sum of the BGP routes for accepted prefix counts, grouping each sum by type. In this respect, processing module 66 may process, based on the data processing rules 63, serialized records 19 to generate adapted serialized records 19.

Processing module 66 may represent a unit configured to process serialized records 19 according to data processing rules 63. Processing module 66 may implement a Python programming language library referred to as Pandas, creating so-called "DataFrames," which refer to a two-dimensional labeled data structure with columns of potentially different types of data (e.g., integer, floating point value, character, string, Boolean value, etc.) and which can be accessed via an index.

Processing module 66 may utilize DataFrames to further serialize groups of serialized records 19, thereby creating, as one example, a DataFrame that specifies RE and PFE memory utilization. Processing module 66 may associate this RE and PFE memory utilization to the various different number of routes described above, and specified in the feature usage data of serialized records 19. Processing module 66 may specify the association in the DataFrame by setting out the number of routes in different columns followed by the RE and PFE memory utilization in columns that follow. Each row then defines the corresponding value at a given timestamp (which may be yet another column) for the identified column.

Processing module 66 may, as another example, generate a DataFrame that specifies route learning duration, processing serialized records 60 according to data processing rules 63 to remove redundant or irrelevant data between when route learning started and when route learning was complete. The resulting route learning DataFrame may identify all of the durations during a given simulation that route learning was performed. Data processing module 66 may specify the associations in the DataFrame in a manner similar to that described above for the memory utilization DataFrame. In this example, processing module 66 may specify the timestamp in the first column, followed by columns for the number of routes for each different type (BGP, OSPF, etc.), and followed by a column for the learning duration. Each row then defines the corresponding value at a given timestamp for the identified column. Processing module 66 may, in other words, further condition the serialized data 19.

TS client module 68 may represent module configured to operate as a client of TS database 24. TS client module 68 may implement proprietary or open-source protocols by which to interface with TS database 24. TS client module 68 may store the resulting DataFrames generated by processing module 66 as serialized data 19 to TS database 24.

Figure 6:
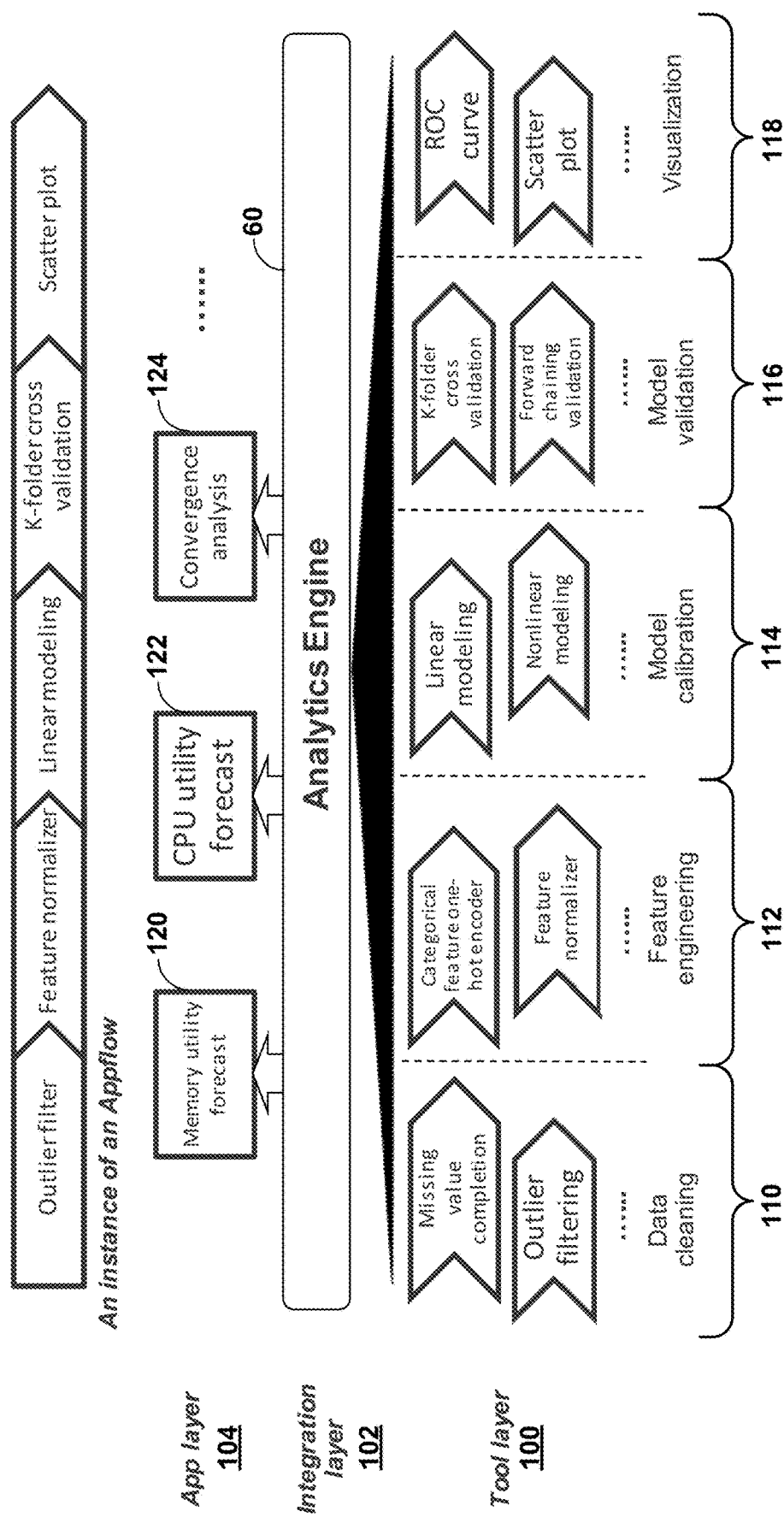
FIG. 6 is a diagram illustrating example operation of the modeling environment in generating model according to various aspects of the techniques described in this disclosure.

FIG. 6 is a diagram illustrating example operation of modeling environment 10 in generating model 20 according to various aspects of the techniques described in this disclosure. As shown in the example of FIG. 6, there are three vertical layers, a tool layer 100, an integration layer 102, and an application layer 104 ("app layer 104").

Within the tool layer 100, data processing module 54 (FIG. 3) may perform data cleaning 110. Data processing module 54 may "clean" the data by completing missing values and performing outlier filtering. Analytics module 60 (which may also be referred to as "analytics engine 60" as shown in the example of FIG. 6) may perform most of the remaining portions of tool layer 100, performing feature engineering 112, model calibration 114, and model validation 116.

During feature engineering 112, analytics module 60 may perform categorical feature one-hot encoding, which refers to a process by which to condition data prior to application of machine learning. Categorical data refers to variables that contain label values rather than numeric values. One-hot encoding refers to a process whereby categorical data (and, potentially more specifically, categorical data where no ordinal relationship exists) is reduced to an integer and then mapped to a binary value having a number of bits equal to the number of categories with a single bit set to one denoting that a sample from that category is present. Consider the following example showing one-hot encoded values for a category "color" having three different values, red, green, or blue:

| Red | Green | Blue |
|---|---|---|
| 1, | 0, | 0 |
| 0, | 1, | 0 |
| 0, | 0, | 1 |

In the foregoing example, the color red is encoded as 100, green is encoded as 010, and blue is encoded as 001. Analytics module 60 may also perform feature normalization, which further conditions the data within defined ranges, during feature engineering 112.

Analytics module 60 may also perform model calibration 114 during which analytics module 60 may perform linear modeling and non-linear modeling as discussed in more detail above to produce memory utility forecast sub-model 120, a CPU utility forecast sub-model 122, a route learning forecast sub-model 124 (shown as "convergence analysis" sub-model), etc. Analytics module 60 may generate the memory utility forecast sub-model 120 and the route learning forecast sub-model 124 in the manner described above.

To generate CPU utility forecast sub-model 122, analytics module 60 may utilize the same portions of the feature usage data of simulation datasets 19 as those utilized when generating memory utility forecast sub-model 120 (i.e., a number of peers, a number of groups, a number of route instances, a number of customer edge (CE) devices, a number of CE interfaces, a number of routes, and a type for each of the routes in this example). Analytics module 60 may identify associations between the above portions of the feature usage data and one or more of the resource utilization data (e.g., one or more of processor utilization per routing daemon executed by the router, and processor utilization in a packet forwarding engine (PFE) of the router). As such, analytics module 60 may perform machine learning with respect to each of the associations to generate CPU utility forecast sub-model 124 representative of the device that predicts, responsive to configuration parameters (which are the same or a subset of the configuration objects obtained as the feature usage data), the processor usage per routing daemon executed by the router, and the processor usage in the PFE of the router.

Analytics module 60 may also perform model validation 116 as described in more detail above, which may include K-fold cross validation, and forward chaining validation. Visualization module 62 may perform visualization 118, providing access to a receiver operating characteristic (ROC) curve, scatter plots, and the like.

Although described with respect to particular operational data 17, the techniques described in this disclosure may also capture CPU and convergence, providing models for CPU and convergence. Other operational data 17 that could form the basis for additional models include summarized routing statistics (e.g., quantities of route protocol and/or family types and/or quantities of instances), AS path statistics, route change push notifications, routing protocol daemon (RPD) intermediate component statistics (such as statistics for various parts of RPD as route is push to a forwarding information base—FIB), FIB route object statistics (e.g., next hop pointers, summary statistics similar to RIB), and BGP output queue statistics.

Figure 7A:
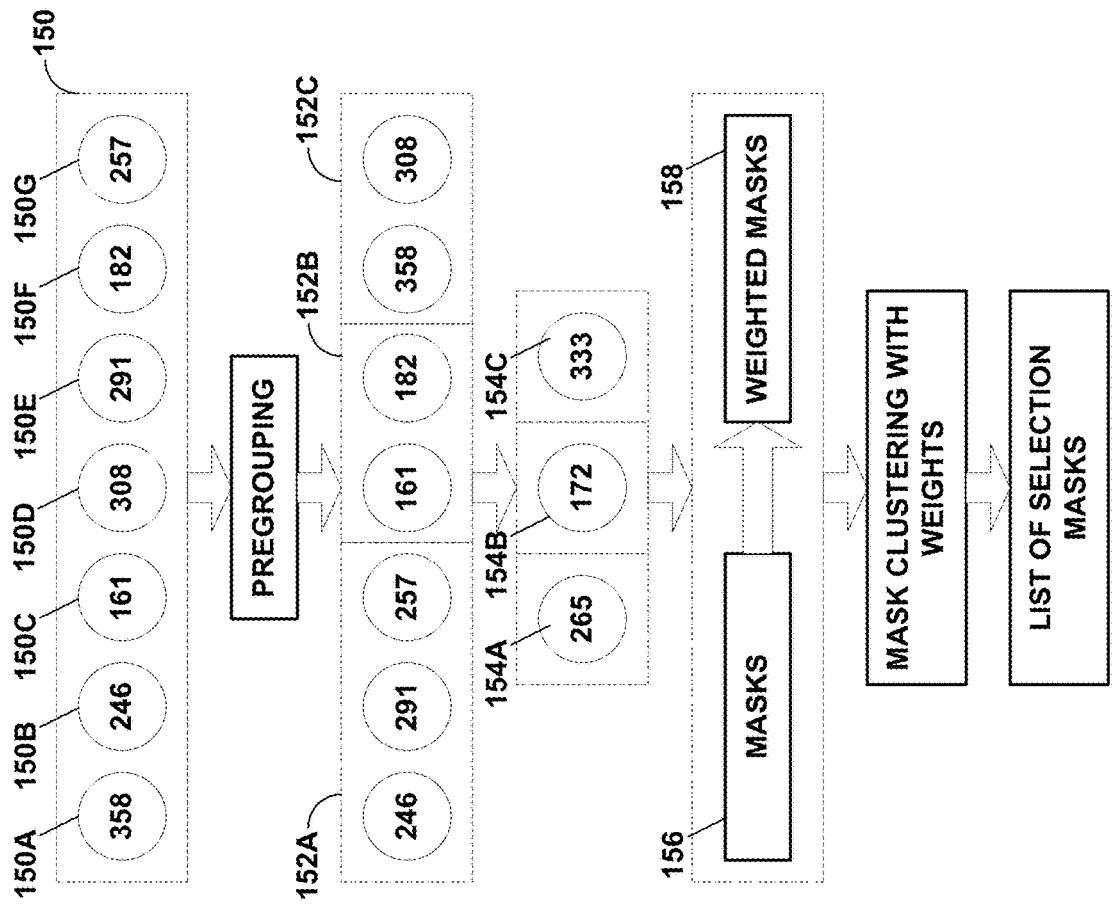

FIGS. 7A and 7B are diagrams illustrating simulation dataset generation for preconfigured modeling environments according to various aspects of the techniques described in this disclosure. A preconfiguring modeling environment refers to a modeling environment in which testing environment 14 (FIG. 3) is preconfigured and often employed by customers for internal testing of devices and service. The customers may permit modeling using their testing environment 14, however the customer may not permit full control of all parameters. In this context, driver 12 may be configured according to various aspects of the techniques to adapt one or more pre-defined configuration objects and conduct a simulation for each iteration of the adaptation. Data collection tool 18 may then collect operational data 17, which analytics module 60 may utilize to generate model 20.

Referring first to FIG. 7A, driver 12 may interface with DUT 16 to collect preconfigured configuration objects. Driver 12 may also interface with test environment 14 to obtain configuration data for the preconfigured test environment 14. Driver 12 may identify, based on the configuration data for the preconfigured test environment 14, those of the obtained configuration objects capable of being adapted (e.g., changed, activated, deactivated, etc.). In the example of FIG. 7A, configuration objects 150 may represent those of the obtained configuration objects capable of being adapted.

In any event, driver 12 may adapt configuration objects 150A-150G ("configuration objects 150"), assigning random values to each of the configuration objects 150. For purposes of illustration, it is assumed that configuration objects 150 each denote a number of routes. Driver 12 may next perform pre-grouping that results in three groups 152A-152C ("groups 152") in the example of FIG. 7A. Driver 12 may utilize k-means clustering (or perform other clustering analysis) to group the similar objects 150, resulting in a reduced number of configuration objects 154A-154C having a mean of the objects 150 in each corresponding one of groups 152.

Driver 12 may generate a mask pool ("masks 156"), where each mask in the pool is a bitmask of ones and zeros, indicative of whether a corresponding one of configuration objects 154 are present. As such, driver 12 may compute the number of masks as a number of configuration objects 154 raised to a power of two. In the example of FIG. 7A, driver 12 may determine 8 masks as there are three simulation objects and $3^2$ equals eight (inclusive of zero). Masks 156 may include the following [0, 0, 1], [0, 1, 1], etc. Driver 12 may then apply configuration object 154 to masks 156 to obtain weighted masks 158. Example weighted masks 158 for the two masks 156 listed in the example above may include [0, 0, 333], and [0, 172, 333]. Driver 12 may next perform mask clustering to ensure diversity in simulations. Driver 12 may then select a subset of the clustered weighted masks 158, one for each of the clusters (e.g., the mask closest to the center of each group).

Referring to FIG. 7B, driver 12 may also generate simulations in which there is a random selection of generated configuration objects 150. Driver 12 may perform pre-grouping, resulting in groups 152A and 152C. Driver 12 may then randomly select different subsets of configuration objects 150 from each of groups 152A and 152C to generate three distinct configuration objects 160A-160C. The result of the foregoing simulation generation is to, for pre-defined network configurations in which only a subset of the configuration objects may be adjusted, activate and deactivate various configuration objects in order to change the operational status of DUT 16. Instead of fully defining all of the configuration objects, the foregoing allows for simulation diversity by way of activating and deactivating those configuration objects for which control is provided.

Figure 8:
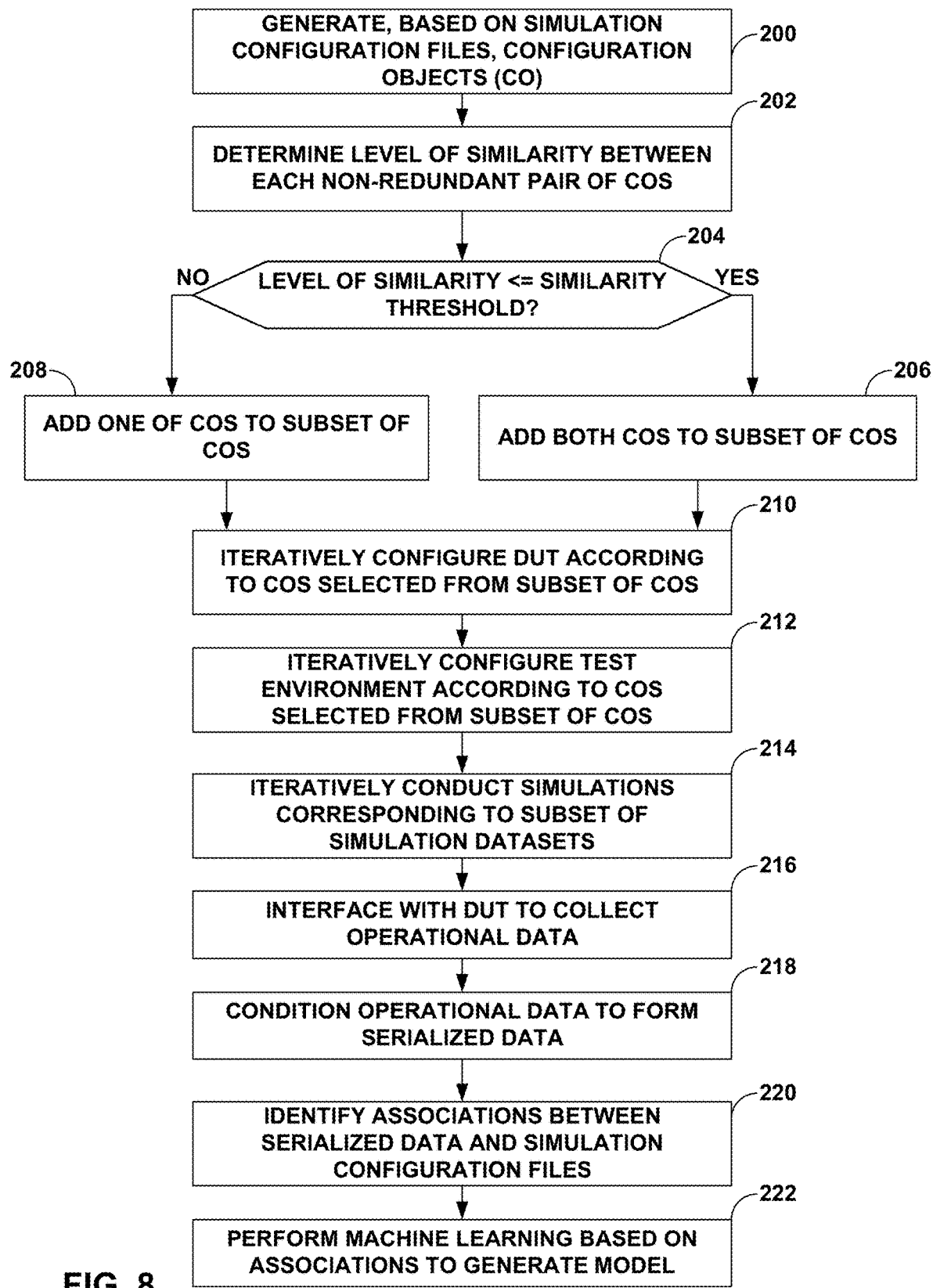
FIG. 8 is a flowchart illustrating example operation of the modeling environment of FIG. 1 in performing various aspects of the automated model generation described in this disclosure.

FIG. 8 is a flowchart illustrating example operation of the modeling environment of FIG. 1 in performing various aspects of the automated model generation described in this disclosure. Driver 12 (as shown in the example of FIG. 1) may initially obtain configuration parameters 28A ("params 28B"), configuration objects 28B ("config 28B") and global files 28C ("global files 28C"), which collectively may also be referred to as "simulation configuration files 28."

In some instances, driver 12 may generate, based on simulation configuration files 28, configuration objects 15 for DUT 16 in a manner that ensure sufficient randomization between configuration objects 28B in a different one of simulation configuration files 28 for DUT 16 (200). In addition to randomizing parameters 28A, driver 12 may generate or otherwise obtain a plurality of configuration objects 15, each of which may define a different simulation of DUT 16 within test environment 14. Driver 12 may randomize the various parameters values in the manner described above within each of the different ones of resulting configuration objects 15 corresponding to a different iteration of the simulation (or, in other words, "simulation iteration"). Because model generation requires a certain degree of variability between simulations to ensure a full representation of DUT 16, driver 12 may determine a level of similarity between each non-redundant pair of configuration objects 15 (202).

Although random sampling from the range of each parameter may provide one solution to diversify the operational data collected during each simulation, total randomization is not possible because of the domain logic pre-defined in parameters 28A. That is, certain values of parameters set forth in parameters 28A are biased in terms of their distribution or, in other words, not statistically random in an equal amount per value.

As such, driver 12 may determine the level of similarity between each non-redundant pair of configuration objects 15 (202), taking into consideration the biased sampling distributions of certain values for parameters set forth in parameters file 28A. Driver 12 may select, responsive to a comparison of the level of similarity to a similarity threshold, a subset of configuration objects 15 (204). Driver 12 may select the subset of configuration objects 15 in order to conduct different iterations of a given simulation that result in a better collection of operational data representative of the operating state of DUT 16, and thereby produce a more complete model 20 that better predicts, responsive to configuration parameters, the operating state of DUT 16.

Driver 12 may, when the level of similarity is less than or equal to the similarity threshold ("YES" 204), add both of the configuration objects 15 to the subset of the configuration objects 15 (206). Driver 12 may, when the level of similarity is greater than the similarity threshold ("NO" 204), add only one of configuration objects 15 to the subset of configuration objects 15 (208). Driver 12 may iterate in this manner through every non-redundant pair of configuration objects 15.

Driver 12 may, after selecting the subset of configuration objects 15, interface with DUT 16 to configure DUT 16 according to a first one of simulation configuration files 28 (210). Driver 12 may next, or concurrent to configuring DUT 16, interface with test environment 14 to configure test environment 14 according to the first one of simulation configuration files 28 (212). Driver 12 may, after configuring DUT 16 and test environment 14, conduct the simulation corresponding to the selected one of the subset of simulation configuration files 28 (214). Driver 12 may conduct the foregoing steps iteratively until all simulations corresponding to the selected subset of simulation configuration files 28 have been performed (212, 214).

During or current to the simulation, data collection tool 18 may interface with DUT 16 to collect operational data 17 representative of the operating state of DUT 16 (216). Data collection tool 18 may issue commands and/or other queries to collect operational data 17. Data collection tool 18 may also retrieve or otherwise request system logs indicative of the operational data 17.

Data collection tool 18 may condition operational data 17 to form serialized data 19 (218). That is, data collection tool 18 may process each of the forms of operational data 17 (e.g., the polled data and the system logs) to systematically arrange the data temporally, and thereby generate serialized data 19. Driver 12 and data collection tool 18 may coordinate to collect serialized data 19 iteratively for each of the subset of simulation configuration files 28, repeating the foregoing process to collect serialized data 19 for each of the subset of simulation configuration files 28. Data collection tool 18 may output serialized data 19 to backend analysis unit 22.

Backend analysis unit 22 may generate, based on serialized data 19, model 20. In some examples, backend analysis unit 22 may identify serialized data 19, which is another way of referring to conditioned operational data 17, associated with each of simulation configuration files 28 for conducting the simulations (220). That is, using syslogs 37, backend analysis unit 22 may identify the above noted "commit" commands identifying a different one of simulation configuration files 28. Each "commit" command commits the entirety of the configuration objects to DUT 16, thereby allowing backend analysis unit 22 to identify which of operational data 17 corresponds to which of the simulation configuration files 28. In this way, backend analysis unit 22 may access each of simulation configuration files 28 and identify associations between each of the simulation configuration files 28 and serialized data 19.

Backend analysis unit 22 may determine the associations between configuration objects 28B and different portions of serialized data 19. Based on the associations between configuration objects 28B and different portions of serialized data 19, backend analysis module 22 may generate model 20 representative of DUT 16 that predicts, responsive to configuration parameters, the operating state of DUT 16. In some instances, backend analysis module 22 may perform machine learning with respect to the associations between the subset of simulation configuration files 28 and serialized data 19 to generate model 20 representative of DUT 16 (222).

Figure 9:
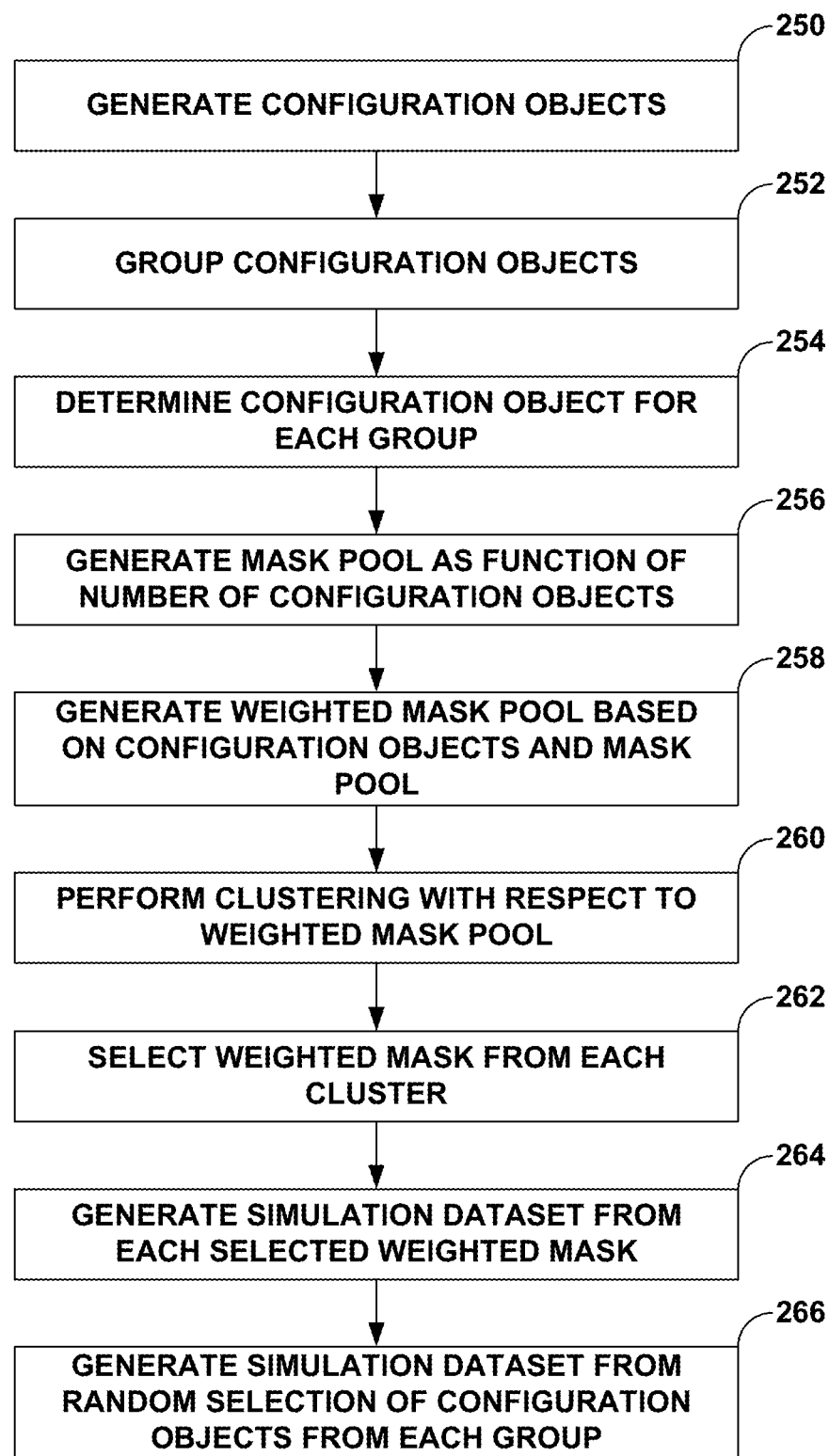
FIG. 9 is a flowchart illustrating example operation of the modeling environment of FIG. 3 in performing configuration object generation using preconfigured test environments.

FIG. 9 is a flowchart illustrating example operation of the modeling environment of FIG. 3 in performing simulation dataset generation using preconfigured test environments. Driver 12 may initially generate configuration objects 150A-150G ("configuration objects 150") having randomly assigned values (250). Driver 12 may next perform pre-grouping that results in three groups 152A-152C ("groups 152") in the example of FIG. 6A (252). Driver 12 may utilize k-means clustering to group the similar objects 150, resulting in configuration objects 154A-154C having a mean of the objects 150 in each corresponding one of groups 152. In this way, driver 12 may determine a configuration object 154 for each of groups 154 (254).

Driver 12 may generate a mask pool ("masks 156"), where each mask in the pool is a bitmask of ones and zeros, indicative of whether a corresponding one of configuration objects 154 are present. As such, driver 12 may compute the number of masks as a number of configuration objects 154 raised to a power of two (256). In the example of FIG. 6A, driver 12 may determine 8 masks as there are three simulation objects and $3^2$ equals eight (inclusive of zero). Driver 12 may then apply configuration object 154 to masks 156 to obtain weighted masks 158 (258). Driver 12 may next perform mask clustering with respect to weighted masks 158 to ensure diversity in simulations (260). Driver 12 may then select a subset of the clustered weighted masks 158, one for each of the clusters (e.g., the mask closest to the center of each group) (262). Driver 12 may generate a simulation dataset 28 from each selected weighted mask 158 (264).

Driver 12 may also generate (as shown in the example of FIG. 6B) simulation configuration files 28 from a random selection of groups 152 of generated configuration objects 150 (266), which may effectively activate and deactivate certain configuration objects. Driver 12 may perform pre-grouping, resulting in groups 152A and 152C. Driver 12 may then randomly select different subsets of configuration objects 150 from each of groups 152A and 152C to generate three distinct simulation configuration files 160A-160C.

Figure 10:
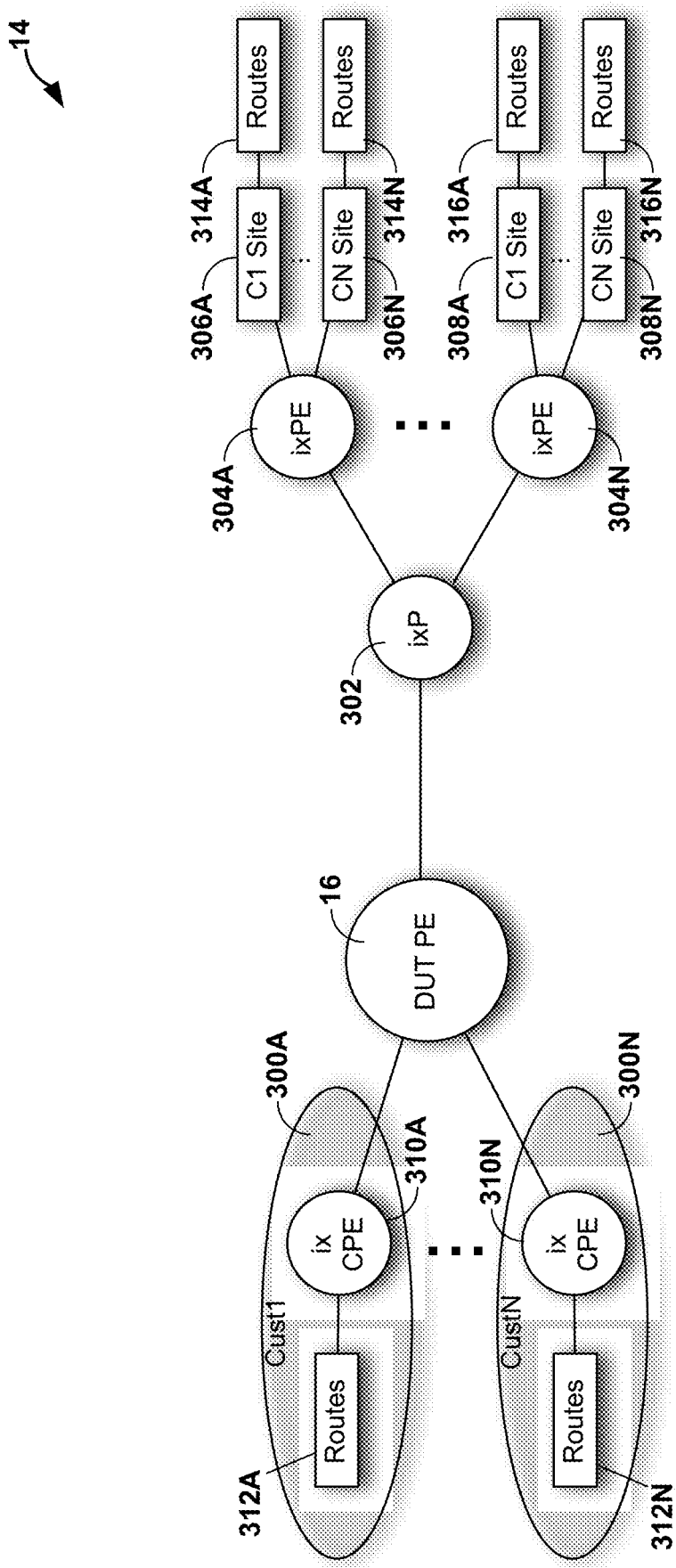
FIG. 10 is a block diagram illustrating an example of test bed 14 of FIGS. 1-3 in more detail.

FIG. 10 is a block diagram illustrating an example of test bed 14 of FIGS. 1-3 in more detail. In the example of FIG. 10, test bed 14 includes customers networks 300A-300N, provider router 302 ("ixP 302"), provider edge (PE) routers 304A-304N ("ixPE 304A-304N"), remote customer sites 306A-306N and 308A-308N. Each of customer networks 300A-300N also include a respective one of customer premises equipment (CPE) 310A-310N ("ixCPE 310A-310N"). Each of customer networks 300A-300N also each support routes 312A-312N, while each of remote customer sites 306A-306N and 308A-308N support routes 314A-314N and 316A-316N respectively. DUT 16 is shown as DUT PE 16 to denote that DUT 16 is a PE router. Each of CPEs 310A-310N may communicate with DUT PE 16 via external BGP (eBGP), internal BGP (iBGP) and/or OSPF routing protocols. Likewise, any CEs within remote customer sites 306A-306N and 308A-308N may communicate with respective PE routers 304A-304N via eBGP, iBGP and/or OSPF routing protocols.

As noted above, test bed 14 may emulate or otherwise simulate a service, such as a L3VPN, testing performance of DUT PE 16 in supporting the L3VPN service. Although described above as testing L3VPNs, the techniques described in this disclosure may be extended to a number of different services, including label distribution protocol (LDP) and/or open shortest path first (OSPF) protocols in the core, external BGP (eBGP) at network edges, auto bandwidth label switched paths (LSPs), overlapping routes, internal BGP (iBGP) for L3VPNs, an intermediate-system to intermediate-system (ISIS) protocol for L3VPNs, resource reservation protocol (RSVP) for L3VPNs and various other services.

Also, although shown as being fixed in terms of the number of routers or other devices per customer networks 300A-300N, test bed 14 may be configured in any suitable manner to emulate or replicate real world network environments. Furthermore, while shown as representing a PE router, DUT 16 may be any type of device, including any type of network device such as a switch, CPE, provider router, hub, etc.

Figure 11:
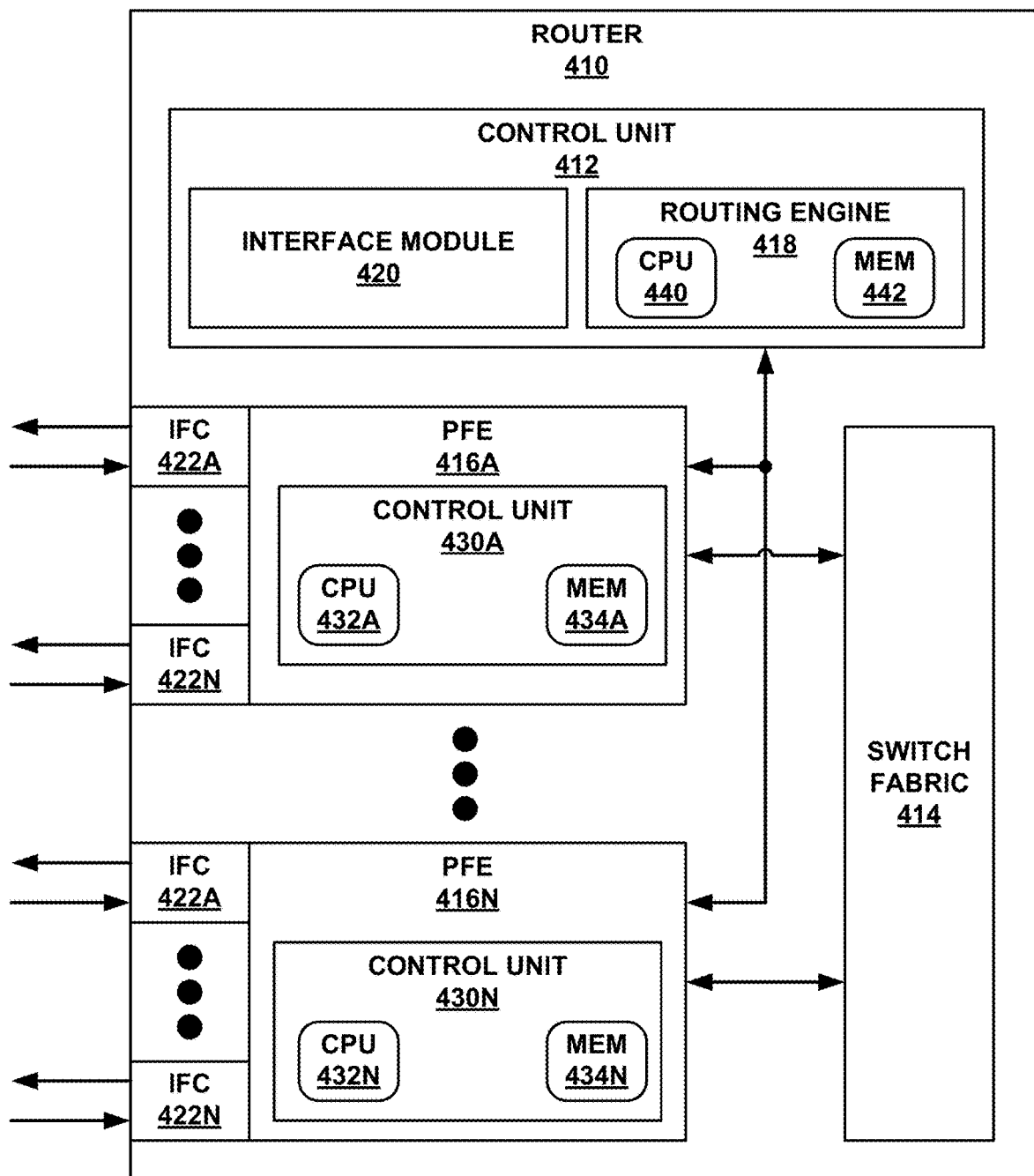
FIG. 11 is a block diagram illustrating an example router representative of the device under test described above.

FIG. 11 is a block diagram illustrating an example router 410 representative of the device under test described above. As shown in the example FIG. 11, router 410 includes a control unit 412, a switch fabric 414 and a plurality of packet forwarding engines (PFEs) 416A-416N ("PFEs 416"). Control unit 412 may represent one or more processors (not shown in FIG. 11) that execute software instructions, such as those used to define a software or computer program, stored to a non-transitory computer-readable medium (again, not shown in FIG. 11), such as a storage device (e.g., a disk drive, or an optical drive), or memory (such as Flash memory, random access memory or RAM) or any other type of volatile or non-volatile memory, that stores instructions to cause, when executed, one or more processors to perform the techniques described herein. Alternatively, control unit 38 may represent dedicated hardware, such as one or more integrated circuits, one or more Application Specific Integrated Circuits (ASICs), one or more Application Specific Special Processors (ASSPs), one or more Field Programmable Gate Arrays (FPGAs), or any combination of one or more of the foregoing examples of dedicated hardware, for performing the techniques described herein. Often, even when implemented as dedicated hardware, the dedicated hardware supports execution of software that may implement one or more aspects of the techniques described in this disclosure. The techniques may therefore generally be implemented in hardware or a combination of hardware and software.

Control unit 412 includes a routing engine 418 that provides control plane functionality for router 410. Routing engine 426 generally represents a module that provides control plane functions in the form of storing network topology as so-called "routing tables," executing routing protocols to communicate with peer routing devices and thereby maintain and update the routing tables, and providing a management interface to allow user access and configuration of router 410.

This management interface is shown in the example of FIG. 11 as interface module 420. Control unit 412 includes interface module 420 to facilitate communication with router 410. Interface module 420 may represent any common type of interface, including a command line interface (CLI) or a graphical user interface (GUI). Interface module 420 may include any interfaces necessary to interact with components for entering data to router 410. Interface module 420 may also represent one or more interfaces by which driver 12 may input device configuration 31, and by which collector 18 may input commands 35 to obtain reports 17 and initiate output of syslogs 37.

Switch fabric 414 provides a high-speed interconnect for forwarding incoming data packets to the correct one of PFEs 416 for transmission over a network, such as the large public network commonly referred to as the "Internet." PFEs 416 receive and send data packets via associated interface cards (IFCs) 422A-422N ("IFCs 422"). IFCs 422 may each represent an interface or port between a communication link and router 410 by which router 410 sends and receives data packets. PFEs 416 may each include one of control units 430A-430N ("control unit 430"), each of which may be similar to control unit 412. Control units 430 may each comprise a combination of dedicated hardware specially designed for packet processing and a central processing unit (CPU) for configuring this dedicated hardware and otherwise enabling communication between routing engine 418 and this dedicated hardware. IFCs 422 and PFEs 416, in combination with switch fabric 414, may form a "data plane" that is responsible for forwarding data packets in accordance with forwarding information. PFEs 416 may each also include one of memories ("MEM") 434A-434N ("MEMs 434").

As shown in the example of FIG. 11, routing engine 418 includes CPU 440 (which may be representative of one or more CPUs 440) and memory 442 ("MEM 442," which also may be representative of one or more memories). Data collection tool 18 may interface with router 410 via interface module 420 to collect operational data 17 indicative of utilization of CPU 440 per routing daemon, and indicative of utilization of MEM 442 per routing daemon. Data collection tool 18 may also interface with router 410 via interface module 420 to collect operational data 17 indicative of utilization of CPUs 432, and indicative of utilization of MEMs 434.

In this way, data collection tool 18 may interface with router 410 to collect operational data 17 indicative of the operational state of router 410 and thereby facilitate construction of a model that may allow for more accurate modeling of router 410. The more accurate model may result in the benefits discussed in detail above that improve network planning and better utilization of existing routers, which may improve performance of the network itself.

Figure 12:
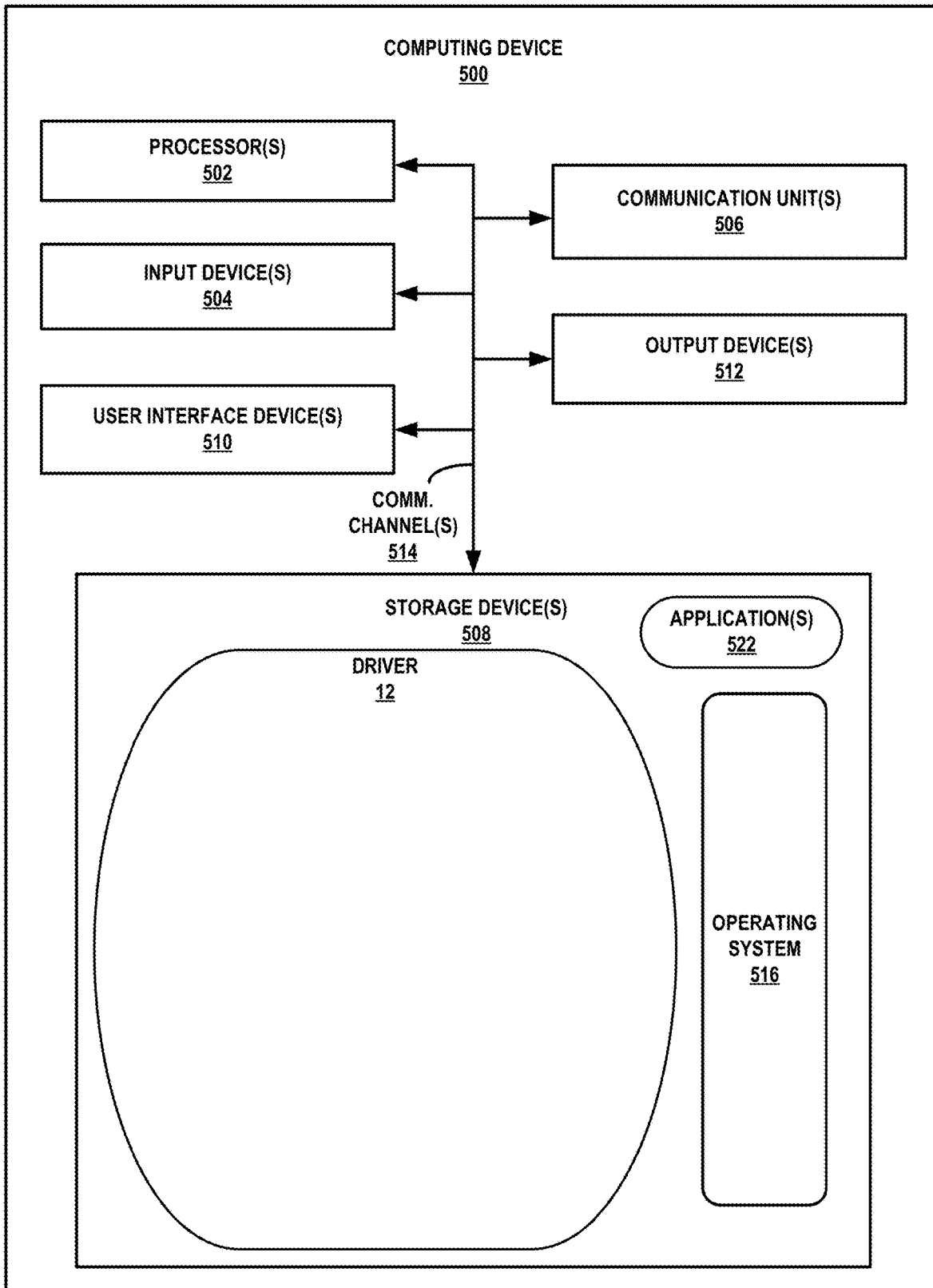
FIG. 12 is a block diagram illustrating further details of one example of a computing device that operates in accordance with one or more techniques of the present disclosure.

FIG. 12 is a block diagram illustrating further details of one example of a computing device that operates in accordance with one or more techniques of the present disclosure. FIG. 12 may illustrate a particular example of a server or other computing device 500 that includes one or more processor(s) 502 for executing any one or more of driver 12, or any other application described herein. Other examples of computing device 500 may be used in other instances. Although shown in FIG. 12 as a stand-alone computing device 500 for purposes of example, a computing device may be any component or system that includes one or more processors or other suitable computing environment for executing software instructions and, for example, need not necessarily include one or more elements shown in FIG. 12 (e.g., communication units 506; and in some examples components such as storage device(s) 508 may not be colocated or in the same chassis as other components).

As shown in the example of FIG. 12, computing device 500 includes one or more processors 502, one or more input devices 504, one or more communication units 506, one or more output devices 512, one or more storage devices 508, and user interface (UI) device(s) 510. Computing device 500, in one example, further includes one or more application(s) 522, driver 12, and operating system 516 that are executable by computing device 500. Each of components 502, 504, 506, 508, 510, and 512 are coupled (physically, communicatively, and/or operatively) for inter-component communications. In some examples, communication channels 514 may include a system bus, a network connection, an inter-process communication data structure, or any other method for communicating data. As one example, components 502, 504, 506, 508, 510, and 512 may be coupled by one or more communication channels 514.

Processors 502, in one example, are configured to implement functionality and/or process instructions for execution within computing device 500. For example, processors 502 may be capable of processing instructions stored in storage device 508. Examples of processors 502 may include, any one or more of a microprocessor, a controller, a digital signal processor (DSP), an application specific integrated circuit (ASIC), a field-programmable gate array (FPGA), or equivalent discrete or integrated logic circuitry.

One or more storage devices 508 may be configured to store information within computing device 500 during operation. Storage device 508, in some examples, is described as a computer-readable storage medium. In some examples, storage device 508 is a temporary memory, meaning that a primary purpose of storage device 508 is not long-term storage. Storage device 508, in some examples, is described as a volatile memory, meaning that storage device 508 does not maintain stored contents when the computer is turned off. Examples of volatile memories include random access memories (RAM), dynamic random access memories (DRAM), static random access memories (SRAM), and other forms of volatile memories known in the art. In some examples, storage device 508 is used to store program instructions for execution by processors 502. Storage device 508, in one example, is used by software or applications running on computing device 500 to temporarily store information during program execution.

Storage devices 508, in some examples, also include one or more computer-readable storage media. Storage devices 508 may be configured to store larger amounts of information than volatile memory. Storage devices 508 may further be configured for long-term storage of information. In some examples, storage devices 508 include non-volatile storage elements. Examples of such non-volatile storage elements include magnetic hard discs, optical discs, floppy discs, flash memories, or forms of electrically programmable memories (EPROM) or electrically erasable and programmable (EEPROM) memories.

Computing device 500, in some examples, also includes one or more communication units 506. Computing device 500, in one example, utilizes communication units 506 to communicate with external devices via one or more networks, such as one or more wired/wireless/mobile networks. Communication units 506 may include a network interface card, such as an Ethernet card, an optical transceiver, a radio frequency transceiver, or any other type of device that can send and receive information. Other examples of such network interfaces may include 3G and WiFi radios. In some examples, computing device 500 uses communication unit 506 to communicate with an external device.

Computing device 500, in one example, also includes one or more user interface devices 510. User interface devices 510, in some examples, are configured to receive input from a user through tactile, audio, or video feedback. Examples of user interface devices(s) 510 include a presence-sensitive display, a mouse, a keyboard, a voice responsive system, video camera, microphone or any other type of device for detecting a command from a user. In some examples, a presence-sensitive display includes a touch-sensitive screen.

One or more output devices 512 may also be included in computing device 500. Output device 512, in some examples, is configured to provide output to a user using tactile, audio, or video stimuli. Output device 512, in one example, includes a presence-sensitive display, a sound card, a video graphics adapter card, or any other type of device for converting a signal into an appropriate form understandable to humans or machines. Additional examples of output device 512 include a speaker, a cathode ray tube (CRT) monitor, a liquid crystal display (LCD), or any other type of device that can generate intelligible output to a user.

Computing device 500 may include operating system 516. Operating system 516, in some examples, controls the operation of components of computing device 500. For example, operating system 516, in one example, facilitates the communication of one or more applications 522 and driver 12 with processors 502, communication unit 506, storage device 508, input device 504, user interface devices 510, and output device 512. Application 522 and driver 12 may also include program instructions and/or data that are executable by computing device 500.

In addition to or as an alternative to the above, the following examples are described. The features described in any of the following examples may be utilized with any of the other examples described herein.

Example 1A

A method of automating model creation, the method comprising: generating, by one or more processors and based on simulation configuration files, configuration objects for performing a plurality of simulation iterations with respect to a network device operating within a test environment, each of the simulation iterations configured to randomly assign parameters within the test environment to reflect actual network environments; conducting, by the one or more processors and based on the configuration objects, each of the plurality of simulation iterations within the test environment to collect a corresponding plurality of simulation datasets representative of operating states of the network device; and performing, by the one or more processors, machine learning with respect to each of the plurality of simulation datasets to generate a model representative of the network device that predicts, responsive to configuration parameters for the network device, an operating state of the network device when configured with the configuration parameters for the network device.

Example 2A

The method of example 1A, wherein each of the plurality of simulation datasets include feature usage data indicative of operating states of the network device relative to the test environment, and resource utilization data indicative of resource utilization within the network device, wherein the method further comprises further comprises identifying associations between the feature usage data of each of the plurality of simulation datasets and the corresponding resource utilization data of each of plurality of simulation datasets, and wherein performing the machine learning comprises performing machine learning with respect to the associations between the feature usage data of each of the plurality of simulation datasets and the corresponding resource utilization data of each of plurality of simulation datasets.

Example 3A

The method of example 2A, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 4A

The method of any combination of examples 2A and 3A, wherein performing the machine learning comprises performing machine learning with respect to each of the associations to generate a memory forecast sub-model representative of the network device that predicts, responsive to the configuration parameters for the network device, the memory usage per routing daemon executed by the network device, and the memory usage in the PFE of the network device.

Example 5A

The method of any combination of examples 2A-4A, wherein the feature usage data includes one or more of a number of routes for each of a plurality of routing protocols, wherein the resource utilization data comprises a route learning duration for each of the plurality of routing protocols, wherein identifying the associations comprises identifying associations between the number of routes for each of the plurality of routing protocols and the route learning durations for the corresponding one of the plurality of routing protocols, and wherein performing the machine learning comprises performing machine learning with respect to each of the associations to generate a route learning sub-model representative of the device that predicts, responsive to the configuration parameters for the network device, a duration taken to converge on a current configuration state.

Example 6A

The method of any combination of examples 2A-5A, wherein the feature usage data includes one or more of a number of peers, a number of groups, a number of route instances, a number of customer edge (CE) devices, a number of CE interfaces, a number of routes, and a type for each of the routes, and wherein the resource utilization data comprises one or more of processor utilization per routing daemon executed by the network device, and processor utilization in a packet forwarding engine (PFE) of the network device, wherein performing the machine learning comprises performing machine learning with respect to each of the associations to generate a processor forecast sub-model representative of the network device that predicts, responsive to the configuration parameters for the network device, the processor usage per routing daemon executed by the network device, and the processor usage in the PFE of the network device.

Example 7A

The method of any combination of examples 1A-6A, further comprising: determining a level of similarity between one or more non-redundant pairs of the simulation configuration files; and selecting, by the one or more processors and responsive to a comparison of the level of similarity to a diversity threshold, a subset of the simulation configuration files, wherein generating, based on the simulation configuration files, the configuration objects comprises generating, based on the subset of the simulation configuration files, the configuration objects for performing the plurality of simulation iterations with respect to the network device operating within the test environment.

Example 8A

The method of any combination of examples 1A-7A, wherein each of the simulation configuration files include data for coherently configuring the test environment and the network device such that the network device operates consistent with the test environment to support one or more services.

Example 9A

The method of example 8A, wherein the one or more services include a layer three virtual private network service.

Example 10A

The method of any combination of examples 1A-9A, wherein the machine learning comprises Monte Carlo simulation style experimentation.

Example 11A

A device configured to automate model creation, the device comprising: one or more processors configured to: generate, based on simulation configuration files, configuration objects for performing a plurality of simulation iterations with respect to a network device operating within a test environment, each of the simulation iterations configured to randomly assign parameters within the test environment to reflect actual network environments; conduct, based on the configuration objects, each of the plurality of simulation iterations within the test environment to collect a corresponding plurality of simulation datasets representative of operating states of the network device; and perform machine learning with respect to each of the plurality of simulation datasets to generate a model representative of the network device that predicts, responsive to configuration parameters for the network device, an operating state of the network device when configured with the configuration parameters for the network device; and a memory configured to store the model.

Example 12A

The device of example 11A, wherein each of the plurality of simulation datasets include feature usage data indicative of operating states of the network device relative to the test environment, and resource utilization data indicative of resource utilization within the network device, wherein the one or more processors are further configured to identify associations between the feature usage data of each of the plurality of simulation datasets and the corresponding resource utilization data of each of plurality of simulation datasets, and wherein the one or more processors are configured to perform the machine learning with respect to the associations between the feature usage data of each of the plurality of simulation datasets and the corresponding resource utilization data of each of plurality of simulation datasets.

Example 13A

The device of example 12A, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 14A

The device of any combination of examples 12A and 13A, wherein the one or more processors are configured to perform the machine learning with respect to each of the associations to generate a memory forecast sub-model representative of the network device that predicts, responsive to the configuration parameters for the network device, the memory usage per routing daemon executed by the network device, and the memory usage in the PFE of the network device.

Example 15A

The device of any combination of examples 12A-14A, wherein the feature usage data includes one or more of a number of routes for each of a plurality of routing protocols, wherein the resource utilization data comprises a route learning duration for each of the plurality of routing protocols, wherein the one or more processors are configured to identify associations between the number of routes for each of the plurality of routing protocols and the route learning durations for the corresponding one of the plurality of routing protocols, and wherein the one or more processors are configured to perform the machine learning with respect to each of the associations to generate a route learning sub-model representative of the device that predicts, responsive to the configuration parameters for the network device, a duration taken to converge on a current configuration state.

Example 16A

The device of any combination of examples 12A-15A, wherein the feature usage data includes one or more of a number of peers, a number of groups, a number of route instances, a number of customer edge (CE) devices, a number of CE interfaces, a number of routes, and a type for each of the routes, and wherein the resource utilization data comprises one or more of processor utilization per routing daemon executed by the network device, and processor utilization in a packet forwarding engine (PFE) of the network device, and wherein the one or more processors are configured to perform the machine learning with respect to each of the associations to generate a processor forecast sub-model representative of the network device that predicts, responsive to the configuration parameters for the network device, the processor usage per routing daemon executed by the network device, and the processor usage in the PFE of the network device.

Example 17A

The device of any combination of examples 11A-16A, wherein the one or more processors are further configured to: determine a level of similarity between one or more non-redundant pairs of the simulation configuration files; and select, by the one or more processors and responsive to a comparison of the level of similarity to a diversity threshold, a subset of the simulation configuration files, and wherein the one or more processors are configured to generate, based on the subset of the simulation configuration files, the configuration objects for performing the plurality of simulation iterations with respect to the network device operating within the test environment.

Example 18A

The device of any combination of examples 11A-17A, wherein each of the simulation configuration files include data for coherently configuring the test environment and the network device such that the network device operates consistent with the test environment to support one or more services.

Example 19A

The device of example 18A, wherein the one or more services include a layer three virtual private network service.

Example 20A

The device of any combination of claims 11A-19A, wherein the machine learning comprises Monte Carlo simulation style experimentation.

Example 21A

A non-transitory computer-readable storage medium having stored thereon instructions that, when executed, cause one or more processors to: generate, based on simulation configuration files, configuration objects for performing a plurality of simulation iterations with respect to a network device operating within a test environment, each of the simulation iterations configured to randomly assign parameters within the test environment to reflect actual network environments; conduct, based on the configuration objects, each of the plurality of simulation iterations within the test environment to collect a corresponding plurality of simulation datasets representative of operating states of the network device; and perform machine learning with respect to each of the plurality of simulation datasets to generate a model representative of the network device that predicts, responsive to configuration parameters for the network device, an operating state of the network device when configured with the configuration parameters for the network device.

Example 1B

A method of automating model creation, the method comprising: generating, by one or more processors and based on simulation configuration files, different iterations of configuration objects for configuring a network device to participate in a plurality of simulations within a test environment for the network device; iteratively interfacing, by the one or more processors and based on the different iterations of the configuration objects, with the network device to configure the network device to participate in the simulations; interfacing, by one or more processors and concurrent to iteratively conducting the plurality of simulations within the test environment, with the network device to collect a plurality of simulation datasets representative of an operating state of the device during each of the plurality of simulations; and generating, by the one or more processors and based on the simulation datasets, a model representative of the network device that predicts, responsive to configuration parameters for the network device, an operating state of the network device when configured with the configuration parameters for the network device.

Example 2B

The method of example 1B, wherein the simulation configuration files include a parameter file defining values for parameters to be used when generating the different iterations of the configuration objects, a configuration file defining the different iterations of the configuration objects, and a global file defining global parameters that are the same between the different iterations of the configuration objects, and wherein generating the configuration objects comprises: processing the parameter file to obtain different values for the parameters; processing the global file to obtain values for the global parameters; and specifying, according to the configuration file and using the different values for the parameters and the values for the global parameters, the configuration objects.

Example 3B

The method of example 2B, wherein the parameter file defines the different values for the parameters using one or more of a maximum value, a minimum value, and a range, and wherein processing the parameter file comprises randomly selecting the different values limited by the maximum value or the minimum value or within the range.

Example 4B

The method of any combination of examples 1B-3B, further comprising: generating, based on the different iterations of configuration objects for the network device, corresponding iterations of configuration objects for configuring the test environment to accommodate operation of the network device when configured using each of the different iterations of the configuration objects for the network device; and iteratively interfacing, based on the corresponding iterations of the configuration objects, with the test environment to automatically configure the test environment to conduct the simulations.

Example 5B

The method of any combination of examples 1B-4B, wherein each of the plurality of simulation datasets include feature usage data indicative of operating states of the network device relative to the test environment, and resource utilization data indicative of resource utilization within the network device, wherein the method further comprises identifying associations between the feature usage data of each of the plurality of simulation datasets and the corresponding resource utilization data of each of plurality of simulation datasets, and wherein generating the model comprises generating, based on the associations between the feature usage data of each of the plurality of simulation datasets and the corresponding resource utilization data of each of plurality of simulation datasets, the model.

Example 6B

The method of example 5B, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 7B

The method of any combination of examples 1B-6B, wherein the different iterations of the configuration objects are biased towards a first operating state of the network device over a second operating state of the network device.

Example 8B

The method of any combination of examples 1B-7B, wherein generating the different iterations of configuration objects comprises: performing a cluster analysis with respect to one or more of the different iterations of the configuration objects to group the one or more of the different iterations of the configuration objects in dense regions of biased distribution of the one or more of the different iterations of the configuration objects; selecting a subset of the configuration objects in each group to represent the group; and selecting each of the different iterations of the configuration objects corresponding to the selected subset of the configuration objects for each of the groups to the different iterations of the configuration objects.

Example 9B

The method of example 8B, wherein performing the cluster analysis comprises performing a k-means cluster analysis with respect to the one or more of the different iterations of the configuration objects to group the one or more of the different iterations of the configuration objects in the dense regions of the biased distribution of the one or more of the different iterations of the configuration objects.

Example 10B

A device configured to automate model creation, the device comprising: a memory configured to store simulation configuration files; and one or more processors configured to: generate, based on the simulation configuration files, different iterations of configuration objects for configuring a network device to participate in a plurality of simulations within a test environment for the network device; iteratively interface, based on the different iterations of the configuration objects, with the network device to configure the network device to participate in the simulations; interface, concurrent to iteratively conducting the plurality of simulations within the test environment, with the network device to collect a plurality of simulation datasets representative of an operating state of the device during each of the plurality of simulations; and generate, based on the simulation datasets, a model representative of the network device that predicts, responsive to configuration parameters for the network device, an operating state of the network device when configured with the configuration parameters for the network device.

Example 11B

The device of example 10B, wherein the simulation configuration files include a parameter file defining values for parameters to be used when generating the different iterations of the configuration objects, a configuration file defining the different iterations of the configuration objects, and a global file defining global parameters that are the same between the different iterations of the configuration objects, and wherein the one or more processors are configured to: process the parameter file to obtain different values for the parameters; process the global file to obtain values for the global parameters; and specify, according to the configuration file and using the different values for the parameters and the values for the global parameters, the configuration objects.

Example 12B

The device of example 11B, wherein the parameter file defines the different values for the parameters using one or more of a maximum value, a minimum value, and a range, and wherein the one or more processors are configured to randomly select the different values limited by the maximum value or the minimum value or within the range.

Example 13B

The device of any combination of examples 10B-12B, wherein the one or more processors are further configured to: generate, based on the different iterations of configuration objects for the network device, corresponding iterations of configuration objects for configuring the test environment to accommodate operation of the network device when configured using each of the different iterations of the configuration objects for the network device; and iteratively interface, based on the corresponding iterations of the configuration objects, with the test environment to automatically configure the test environment to conduct the simulations.

Example 14B

The device of any combination of examples 10B-13B, wherein each of the plurality of simulation datasets include feature usage data indicative of operating states of the network device relative to the test environment, and resource utilization data indicative of resource utilization within the network device, wherein the one or more processors are further configured to identify associations between the feature usage data of each of the plurality of simulation datasets and the corresponding resource utilization data of each of plurality of simulation datasets, and wherein the one or more processors are configured to generate, based on the associations between the feature usage data of each of the plurality of simulation datasets and the corresponding resource utilization data of each of plurality of simulation datasets, the model.

Example 15B

The device of example 14B, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 16B

The device of any combination of examples 10B-15B, wherein the different iterations of the configuration objects are biased towards a first operating state of the network device over a second operating state of the network device.

Example 17B

The device of any combination of examples 10B-16B, wherein the one or more processors are configured to: perform a cluster analysis with respect to one or more of the different iterations of the configuration objects to group the one or more of the different iterations of the configuration objects in dense regions of biased distribution of the one or more of the different iterations of the configuration objects; select a subset of the configuration objects in each group to represent the group; and select each of the different iterations of the configuration objects corresponding to the selected subset of the configuration objects for each of the groups to the different iterations of the configuration objects.

Example 18B

The device of example 17B, wherein the one or more processors are configured to perform a k-means cluster analysis with respect to the one or more of the different iterations of the configuration objects to group the one or more of the different iterations of the configuration objects in the dense regions of the biased distribution of the one or more of the different iterations of the configuration objects.

Example 19B

A non-transitory computer-readable storage medium having stored thereon instructions that, when executed, cause one or more processors to: generate, based on simulation configuration files, different iterations of configuration objects for configuring a network device to participate in a plurality of simulations within a test environment for the network device; iteratively interface, based on the different iterations of the configuration objects, with the network device to configure the network device to participate in the simulations; interface, concurrent to iteratively conducting the plurality of simulations within the test environment, with the network device to collect a plurality of simulation datasets representative of an operating state of the device during each of the plurality of simulations; and generate, based on the simulation datasets, a model representative of the network device that predicts, responsive to configuration parameters for the network device, an operating state of the network device when configured with the configuration parameters for the network device.

Example 20B

The non-transitory computer-readable storage medium of example 19B, wherein the simulation configuration files include a parameter file defining values for parameters to be used when generating the different iterations of the configuration objects, a configuration file defining the different iterations of the configuration objects, and a global file defining global parameters that are the same between the different iterations of the configuration objects, and wherein the instructions, when executed, cause the one or more processors to: process the parameter file to obtain different values for the parameters; process the global file to obtain values for the global parameters; and specify, according to the configuration file and using the different values for the parameters and the values for the global parameters, the configuration objects.

Example 1C

A method of generating a model of a device, comprising: obtaining, by one or more processors, a plurality of simulation configuration files for conducting a plurality of simulations of a network device within a test environment; conducting, by the one or more processors and based on the plurality of simulation configuration files, each of the plurality of simulations with respect to the network device within the test environment to collect a corresponding plurality of simulation datasets indicative of an operating state of the network device relative to each of the plurality of simulations; determining, by the one or more processors, a level of similarity between one or more non-redundant pairs of the plurality of simulation datasets; selecting, by the one or more processors and responsive to a comparison of the level of similarity to a diversity threshold, a subset of the plurality of simulation datasets; and generating, by the one or more processors and based on the selected subset of the plurality of simulation datasets, a model representative of the network device that predicts, responsive to configuration parameters for the network device, an operating state of the network device when configured with the configuration parameters for the network device.

Example 2C

The method of example 1C, wherein each of the simulation configuration files include data for coherently configuring the test environment and the network device such that the device operates consistent with the test environment to support one or more services.

Example 3C

The method of example 2C, wherein the one or more services include a layer three virtual private network service.

Example 4C

The method of any combination of examples 1C-3C, wherein determining the level of similarity between the one or more non-redundant pairs of the plurality of simulation datasets comprises: generating a random sample of a first one of the plurality of simulation datasets; generating a random sample of a second one of the plurality of simulation datasets; generating a logistic regression model to predict, based on the random sample of the second one of the plurality of simulation datasets, the random sample of the first one of the plurality of simulation datasets; and determining, based on a comparison of the predicted random sample of the first one of the plurality of simulation datasets and the random sample of the first one of the plurality of simulation datasets, the level of similarity between the first one of the plurality of simulation datasets and the second one of the plurality of simulation datasets.

Example 5C

The method of any combination of examples 1C-4C, wherein each of the plurality of simulation datasets include feature usage data indicative of operating states of the network device relative to the test environment, and resource utilization data indicative of resource utilization within the network device, wherein the method further comprises identifying associations between the feature usage data of each of the plurality of simulation datasets and the corresponding resource utilization data of each of plurality of simulation datasets, and wherein generating the model comprises generating, based on the associations between the feature usage data of each of the plurality of simulation datasets and the corresponding resource utilization data of each of plurality of simulation datasets, the model.

Example 6C

The method of example 5C, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 7C

The method of any combination of examples 1C-6C, further comprising processing the plurality of simulation configuration files to generate different iterations of configuration objects for configuring the network device to participate in the plurality of simulations within the test environment and corresponding configuration data for configuring the test environment to execute the plurality of simulations.

Example 8C

The method of any combination of examples 1C-7C, wherein interfacing with the network device to collect the plurality of simulation datasets includes interfacing with the network device to automatically issue commands that result in collection of the plurality of simulation datasets, and wherein the method further comprises: interfacing with the network device to collect system logs defining configuration changes committed to the network device using a commit command; and processing the plurality of simulation datasets to serialize the plurality of simulation datasets using a time at which each of the commit commands were specified in the system logs such that the serialized plurality of simulation datasets only include portions of the plurality of simulation datasets occurring at, after, or at and after each of the commit commands were logged to the system logs.

Example 9C

The method of any combination of examples 1C-8C, further comprising: obtaining data processing rules specified in accordance with a syntax and defining rules for processing the plurality of simulation datasets; and processing, based on the data processing rules, the plurality of simulation datasets to generate an adapted plurality of simulation datasets.

Example 10C

A device configured to generate a model of a network device, comprising: a memory configured to store a plurality of simulation configuration files for conducting a plurality of simulations of the network device within a test environment; and one or more processors configured to: conduct, based on the plurality of simulation configuration files, each of the plurality of simulations with respect to the network device within the test environment to collect a corresponding plurality of simulation datasets indicative of an operating state of the network device relative to each of the plurality of simulations; determine a level of similarity between one or more non-redundant pairs of the plurality of simulation datasets; select, responsive to a comparison of the level of similarity to a diversity threshold, a subset of the plurality of simulation datasets; and generate, based on the selected subset of the plurality of simulation datasets, a model representative of the network device that predicts, responsive to configuration parameters for the network device, an operating state of the network device when configured with the configuration parameters for the network device.

Example 11C

The device of example 10C, wherein each of the simulation configuration files include data for coherently configuring the test environment and the network device such that the device operates consistent with the test environment to support one or more services.

Example 12C

The device of example 11C, wherein the one or more services include a layer three virtual private network service.

Example 13C

The device of examples 10C-12C, wherein the one or more processors are configured to: generate a random sample of a first one of the plurality of simulation datasets; generate a random sample of a second one of the plurality of simulation datasets; generate a logistic regression model to predict, based on the random sample of the second one of the plurality of simulation datasets, the random sample of the first one of the plurality of simulation datasets; and determine, based on a comparison of the predicted random sample of the first one of the plurality of simulation datasets and the random sample of the first one of the plurality of simulation datasets, the level of similarity between the first one of the plurality of simulation datasets and the second one of the plurality of simulation datasets.

Example 14C

The device of any combination of examples 10C-13C, wherein each of the plurality of simulation datasets include feature usage data indicative of operating states of the network device relative to the test environment, and resource utilization data indicative of resource utilization within the network device, wherein the one or more processors are further configured to identify associations between the feature usage data of each of the plurality of simulation datasets and the corresponding resource utilization data of each of plurality of simulation datasets, and wherein the one or more processors are configured to generate, based on the associations between the feature usage data of each of the plurality of simulation datasets and the corresponding resource utilization data of each of plurality of simulation datasets, the model.

Example 15C

The device of example 14C, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 16C

The device of any combination of examples 10C-15C, wherein the one or more processors are further configured to process the plurality of simulation configuration files to generate different iterations of configuration objects for configuring the network device to participate in the plurality of simulations within the test environment and corresponding configuration data for configuring the test environment to execute the plurality of simulations.

Example 17C

The method of any combination of examples 10C-16C, wherein the one or more processors are configured to interface with the network device to automatically issue commands that result in collection of the plurality of simulation datasets, and wherein the one or more processors are further configured to: interface with the network device to collect system logs defining configuration changes committed to the network device using a commit command; and process the plurality of simulation datasets to serialize the plurality of simulation datasets using a time at which each of the commit commands were specified in the system logs such that the serialized plurality of simulation datasets only include portions of the plurality of simulation datasets occurring at, after, or at and after each of the commit commands were logged to the system logs.

Example 18C

The device of any combination of examples 10C-17C, further comprising: obtaining data processing rules specified in accordance with a syntax and defining rules for processing the plurality of simulation datasets; and processing, based on the data processing rules, the plurality of simulation datasets to generate an adapted plurality of simulation datasets.

Example 19C

A non-transitory computer-readable storage medium having stored thereon instructions that, when executed, cause one or more processors to: obtain a plurality of simulation configuration files for conducting a plurality of simulations of the network device within a test environment; conduct, based on the plurality of simulation configuration files, each of the plurality of simulations with respect to the network device within the test environment to collect a corresponding plurality of simulation datasets indicative of an operating state of the network device relative to each of the plurality of simulations; determine a level of similarity between one or more non-redundant pairs of the plurality of simulation datasets; select, responsive to a comparison of the level of similarity to a diversity threshold, a subset of the plurality of simulation datasets; and generate, based on the selected subset of the plurality of simulation datasets, a model representative of the network device that predicts, responsive to configuration parameters for the network device, an operating state of the network device when configured with the configuration parameters for the network device.

Example 20C

The non-transitory computer-readable storage medium of example 19C, wherein the instructions, when executed, cause the one or more processors to: generate a random sample of a first one of the plurality of simulation datasets; generate a random sample of a second one of the plurality of simulation datasets; generate a logistic regression model to predict, based on the random sample of the second one of the plurality of simulation datasets, the random sample of the first one of the plurality of simulation datasets; and determine, based on a comparison of the predicted random sample of the first one of the plurality of simulation datasets and the random sample of the first one of the plurality of simulation datasets, the level of similarity between the first one of the plurality of simulation datasets and the second one of the plurality of simulation datasets.

Example 1D

A method of automating model creation in a preconfigured network environment, the method comprising: interfacing, by one or more processors, with a network device within the preconfigured network environment to iteratively adapt one or more pre-defined configuration objects of a network device within the preconfigured network environment; conducting, by the one or more processors and for each iteration of the adaptation of the one or more pre-defined configuration objects of the network device, a simulation to collect a simulation dataset representative of an operating state of the network device within the preconfigured network environment; and generating, by the one or more processors and based on the operational data, a model representative of the network device that predicts, responsive to configuration parameters for the network device, an operating state of the network device when configured with the configuration parameters for the network device.

Example 2D

The method of example 1D, further comprising: interfacing with the preconfigured network environment to obtain configuration data for the preconfigured network environment; and identifying, based on the configuration data for the preconfigured network environment, one or more of the pre-defined configuration objects of the network device capable of being adapted, wherein interfacing with the network device comprises interfacing with the network within the preconfigured network environment to iteratively adapt the identified one or more of the pre-defined configuration objects of the network device within the preconfigured network environment.

Example 3D

The method of any combination of examples 1D and 2D, wherein interfacing with network device comprises interfacing with the network device to iteratively activate or deactivate one or more of the pre-defined configuration objects of the network device.

Example 4D

The method of any combination of claims 1D-3D, further comprising: interfacing with the network device to obtain configuration objects; assigning random values to the configuration objects to obtain updated configuration objects; performing clustering analysis with respect to the updated configuration objects to obtain groups of the updated configuration objects; and determining adapted configuration objects as the mean of each of the groups of the updated configuration objects, wherein conducting the simulation comprises interfacing with the network device to load the adapted configuration objects and initiating the simulation.

Example 5D

The method of example 4D, further comprising applying, prior to each of the iterations, a mask to the adapted configuration objects to activate or deactivate each of the adapted configuration objects.

Example 6D

The method of any combination of examples 1D-5D, wherein generating the model comprises performing machine learning with respect to each of the simulation datasets to generate the model.

Example 7D

The method of any combination of claims 1D-6D, wherein each of the simulation datasets include feature usage data indicative of operating states of the network device relative to the test environment, and resource utilization data indicative of resource utilization within the network device, wherein the method further comprises identifying associations between the feature usage data of each the simulation datasets and the corresponding resource utilization data of each of the simulation datasets, and wherein performing the machine learning comprises performing machine learning with respect to the associations between the feature usage data of each the simulation datasets and the corresponding resource utilization data of each of the simulation datasets.

Example 8D

The method of example 7D, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 9D

A device configured to automate model creation in a preconfigured network environment, the device comprising: one or more processors configured to: interface with a network device within the preconfigured network environment to iteratively adapt one or more pre-defined configuration objects of a network device within the preconfigured network environment; conduct, for each iteration of the adaptation of the one or more pre-defined configuration objects of the network device, a simulation to collect a simulation dataset representative of an operating state of the network device within the preconfigured network environment; and generate, based on the operational data, a model representative of the network device that predicts, responsive to configuration parameters for the network device, an operating state of the network device when configured with the configuration parameters for the network device; and a memory configured to store the model.

Example 10D

The device of example 9D, wherein the one or more processors are further configured to: interface with the preconfigured network environment to obtain configuration data for the preconfigured network environment; and identify, based on the configuration data for the preconfigured network environment, one or more of the pre-defined configuration objects of the network device capable of being adapted, and wherein the one or more processors are configured to interface with the network within the preconfigured network environment to iteratively adapt the identified one or more of the pre-defined configuration objects of the network device within the preconfigured network environment.

Example 11D

The device of any combination of examples 9D and 10D, wherein the one or more processors are configured to interface with the network device to iteratively activate or deactivate one or more of the pre-defined configuration objects of the network device.

Example 12D

The device of any combination of examples 9D-11D, wherein the one or more processors are further configured to: interface with the network device to obtain configuration objects; assign random values to the configuration objects to obtain updated configuration objects; perform clustering analysis with respect to the updated configuration objects to obtain groups of the updated configuration objects; and determine adapted configuration objects as the mean of each of the groups of the updated configuration objects, and wherein the one or more processors are configured to interface with the network device to load the adapted configuration objects and initiating the simulation.

Example 13D

The device of example 12D, wherein the one or more processors are further configured to apply, prior to each of the iterations, a mask to the adapted configuration objects to activate or deactivate each of the adapted configuration objects.

Example 14D

The device of any combination of examples 9D-13D, wherein the one or more processors are configured to perform machine learning with respect to each of the simulation datasets to generate the model.

Example 15D

The device of any combination of examples 9D-14D, wherein each of the simulation datasets include feature usage data indicative of operating states of the network device relative to the test environment, and resource utilization data indicative of resource utilization within the network device, wherein the one or more processors are further configured to identify associations between the feature usage data of each the simulation datasets and the corresponding resource utilization data of each of the simulation datasets, and wherein the one or more processors are configured to perform machine learning with respect to the associations between the feature usage data of each the simulation datasets and the corresponding resource utilization data of each of the simulation datasets.

Example 16D

The device of example 15D, wherein the feature usage data comprises one or more of the number of peers, the number of groups, the number of route instances, the number of customer edge (CE) devices, the number of CE interfaces, the number of routes, and the type for each of the routes, and wherein the resource utilization data comprises one or more of the memory usage per routing daemon executed by the network device during each simulation, and the memory usage in the PFE of the network device during each simulation.

Example 17D

A non-transitory computer-readable storage medium having stored thereon instructions that, when executed, cause one or more processors to: interface with a network device within the preconfigured network environment to iteratively adapt one or more pre-defined configuration objects of a network device within the preconfigured network environment; conduct, for each iteration of the adaptation of the one or more pre-defined configuration objects of the network device, a simulation to collect a simulation dataset representative of an operating state of the network device within the preconfigured network environment; and generate, based on the operational data, a model representative of the network device that predicts, responsive to configuration parameters for the network device, an operating state of the network device when configured with the configuration parameters for the network device.

Example 18D

The non-transitory computer-readable storage medium of example 17D, further storing instructions that, when executed, cause the one or more processors to: interface with the preconfigured network environment to obtain configuration data for the preconfigured network environment; and identify, based on the configuration data for the preconfigured network environment, one or more of the pre-defined configuration objects of the network device capable of being adapted, and wherein the instructions, when executed, cause the one or more processors to interface with the network within the preconfigured network environment to iteratively adapt the identified one or more of the pre-defined configuration objects of the network device within the preconfigured network environment.

Example 19D

The non-transitory computer-readable storage medium of example 18D, further storing instructions that, when executed, cause the one or more processors to apply, prior to each of the iterations, a mask to the adapted configuration objects to activate or deactivate each of the adapted configuration objects.

Example 20D

The non-transitory computer-readable storage medium of any combination of claims 17D-19D, wherein each of the simulation datasets include feature usage data indicative of operating states of the network device relative to the test environment, and resource utilization data indicative of resource utilization within the network device, wherein the non-transitory computer-readable medium further storing instructions that, when executed, cause the one or more processors to identify associations between the feature usage data of each the simulation datasets and the corresponding resource utilization data of each of the simulation datasets, and wherein the instructions, when executed, cause the one or more processors to perform machine learning with respect to the associations between the feature usage data of each the simulation datasets and the corresponding resource utilization data of each of the simulation datasets.

Example 1E

A computer-readable storage medium encoded with instructions for causing one or more programmable processors to perform the method recited by any combination of claims 1A-10A, 1B-9B, 1C-9C, or 1D-8D.

Moreover, any of the specific features set forth in any of the examples described above may be combined into beneficial examples of the described techniques. That is, any of the specific features are generally applicable to all examples of the invention. Various examples of the invention have been described.

In this respect, the techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a non-transitory computer-readable medium or computer-readable storage medium, containing instructions. Instructions embedded or encoded in a computer-readable medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer-readable storage media. The term "computer-readable storage media" refers to physical storage media, and not signals or carrier waves, although the term "computer-readable media" may include transient media such as signals, in addition to physical storage media.

What is claimed is:

1. A method of automating model creation, the method comprising:

generating, by one or more processors and based on simulation configuration files, configuration objects for performing a plurality of simulation iterations with respect to a network device operating within a test environment, each of the simulation iterations configured to randomly assign parameters within the test environment to reflect actual network environments;

conducting, by the one or more processors and based on the configuration objects, each of the plurality of simulation iterations within the test environment to collect a corresponding plurality of simulation datasets representative of operating states of the network device;

performing, by the one or more processors, machine learning with respect to each of the plurality of simulation datasets to generate a model representative of the network device that predicts, responsive to configuration parameters for the network device, an operating state of the network device when configured with the configuration parameters for the network device; and outputting, by the one or more processors and based on the model representative of the network device, a prediction of the operating state of the network device when configured with the configuration parameters for the network device.

2. The method of claim 1, wherein each of the plurality of simulation datasets include feature usage data indicative of operating states of the network device relative to the test environment and resource utilization data indicative of resource utilization within the network device, wherein the method further comprises further comprises identifying associations between the feature usage data of each of the plurality of simulation datasets and the corresponding resource utilization data of each of plurality of simulation datasets, and wherein performing the machine learning comprises performing the machine learning with respect to the associations between the feature usage data of each of the plurality of simulation datasets and the corresponding resource utilization data of each of plurality of simulation datasets.

3. The method of claim 2, wherein the feature usage data comprises one or more of the number of peers, the number of groups, the number of route instances, the number of customer edge (CE) devices, the number of CE interfaces, the number of routes, or the type for each of the routes, and wherein the resource utilization data comprises one or more of the memory usage per routing daemon executed by the network device during each simulation or the memory usage in the PFE of the network device during each simulation.

4. The method of claim 2, wherein performing the machine learning comprises performing the machine learning with respect to each of the associations to generate a memory forecast sub-model representative of the network device that predicts, responsive to the configuration parameters for the network device, the memory usage per routing daemon executed by the network device, and the memory usage in the PFE of the network device.

5. The method of claim 2, wherein the feature usage data includes a number of routes for each of a plurality of routing protocols, wherein the resource utilization data comprises a route learning duration for each of the plurality of routing protocols, wherein identifying the associations comprises identifying associations between the number of routes for each of the plurality of routing protocols and the route learning durations for the corresponding one of the plurality of routing protocols, and wherein performing the machine learning comprises performing the machine learning with respect to each of the associations to generate a route learning sub-model representative of the device that predicts, responsive to the configuration parameters for the network device, a duration taken to converge on a current configuration state.

6. The method of claim 2, wherein the feature usage data includes one or more of a number of peers, a number of groups, a number of route instances, a number of customer edge (CE) devices, a number of CE interfaces, a number of routes, or a type for each of the routes, wherein the resource utilization data comprises one or more of processor utilization per routing daemon executed by the network device or processor utilization in a packet forwarding engine (PFE) of the network device, and wherein performing the machine learning comprises performing the machine learning with respect to each of the associations to generate a processor forecast sub-model representative of the network device that predicts, responsive to the configuration parameters for the network device, the processor usage per routing daemon executed by the network device and the processor usage in the PFE of the network device.

7. The method of claim 1, further comprising:

determining a level of similarity between one or more non-redundant pairs of the simulation configuration files; and selecting, by the one or more processors and responsive to a comparison of the level of similarity to a diversity threshold, a subset of the simulation configuration files, wherein generating, based on the simulation configuration files, the configuration objects comprises generating, based on the subset of the simulation configuration files, the configuration objects for performing the plurality of simulation iterations with respect to the network device operating within the test environment.

8. The method of claim 1, wherein each of the simulation configuration files include data for coherently configuring the test environment and the network device such that the network device operates consistent with the test environment to support one or more services.

9. The method of claim 8, wherein the one or more services include a layer three virtual private network service.

10. The method of claim 1, wherein the machine learning comprises Monte Carlo simulation style experimentation.

11. A device configured to automate model creation, the device comprising:

one or more processors configured to:

generate, based on simulation configuration files, configuration objects for performing a plurality of simulation iterations with respect to a network device operating within a test environment, each of the simulation iterations configured to randomly assign parameters within the test environment to reflect actual network environments;

conduct, based on the configuration objects, each of the plurality of simulation iterations within the test environment to collect a corresponding plurality of simulation datasets representative of operating states of the network device; and perform machine learning with respect to each of the plurality of simulation datasets to generate a model representative of the network device that predicts, responsive to configuration parameters for the network device, an operating state of the network device when configured with the configuration parameters for the network device; and a memory configured to store the model, wherein the one or more processors are further configured to output, based on the model representative of the network device, a prediction of the operating state of the network device when configured with the configuration parameters for the network device.

12. The device of claim 11,
wherein each of the plurality of simulation datasets include feature usage data indicative of operating states of the network device relative to the test environment and resource utilization data indicative of resource utilization within the network device,
wherein the one or more processors are further configured to identify associations between the feature usage data of each of the plurality of simulation datasets and the corresponding resource utilization data of each of plurality of simulation datasets, and
wherein the one or more processors are configured to perform the machine learning with respect to the associations between the feature usage data of each of the plurality of simulation datasets and the corresponding resource utilization data of each of plurality of simulation datasets.

13. The device of claim 12,
wherein the feature usage data comprises one or more of the number of peers, the number of groups, the number of route instances, the number of customer edge (CE) devices, the number of CE interfaces, the number of routes, or the type for each of the routes, and
wherein the resource utilization data comprises one or more of the memory usage per routing daemon executed by the network device during each simulation or the memory usage in the PFE of the network device during each simulation.

14. The device of claim 12, wherein the one or more processors are configured to perform the machine learning with respect to each of the associations to generate a memory forecast sub-model representative of the network device that predicts, responsive to the configuration parameters for the network device, the memory usage per routing daemon executed by the network device, and the memory usage in the PFE of the network device.

15. The device of claim 12,
wherein the feature usage data includes a number of routes for each of a plurality of routing protocols,
wherein the resource utilization data comprises a route learning duration for each of the plurality of routing protocols,
wherein the one or more processors are configured to identify associations between the number of routes for each of the plurality of routing protocols and the route learning durations for the corresponding one of the plurality of routing protocols, and
wherein the one or more processors are configured to perform the machine learning with respect to each of the associations to generate a route learning sub-model representative of the device that predicts, responsive to the configuration parameters for the network device, a duration taken to converge on a current configuration state.

16. The device of claim 12,
wherein the feature usage data includes one or more of a number of peers, a number of groups, a number of route instances, a number of customer edge (CE) devices, a number of CE interfaces, a number of routes, or a type for each of the routes, wherein the resource utilization data comprises one or more of processor utilization per routing daemon executed by the network device or processor utilization in a packet forwarding engine (PFE) of the network device, and
wherein the one or more processors are configured to perform the machine learning with respect to each of the associations to generate a processor forecast sub-model representative of the network device that predicts, responsive to the configuration parameters for the network device, the processor usage per routing daemon executed by the network device, and the processor usage in the PFE of the network device.

17. The device of claim 11,
wherein the one or more processors are further configured to:
  determine a level of similarity between one or more non-redundant pairs of the simulation configuration files; and
  select, by the one or more processors and responsive to a comparison of the level of similarity to a diversity threshold, a subset of the simulation configuration files, and
wherein the one or more processors are configured to generate, based on the subset of the simulation configuration files, the configuration objects for performing the plurality of simulation iterations with respect to the network device operating within the test environment.

18. The device of claim 11, wherein each of the simulation configuration files include data for coherently configuring the test environment and the network device such that the network device operates consistent with the test environment to support one or more services.

19. The device of claim 18, wherein the one or more services include a layer three virtual private network service.

20. The device of claim 11, wherein the machine learning comprises Monte Carlo simulation style experimentation.

21. A non-transitory computer-readable storage medium having stored thereon instructions that, when executed, cause one or more processors to:
generate, based on simulation configuration files, configuration objects for performing a plurality of simulation iterations with respect to a network device operating within a test environment, each of the simulation iterations configured to randomly assign parameters within the test environment to reflect actual network environments;
conduct, based on the configuration objects, each of the plurality of simulation iterations within the test environment to collect a corresponding plurality of simulation datasets representative of operating states of the network device;
perform machine learning with respect to each of the plurality of simulation datasets to generate a model representative of the network device that predicts, responsive to configuration parameters for the network device, an operating state of the network device when configured with the configuration parameters for the network device; and
output, based on the model representative of the network device, a prediction of the operating state of the network device when configured with the configuration parameters for the network device.

* * * * *